(12) United States Patent
Zhao et al.

(10) Patent No.: US 11,640,787 B2
(45) Date of Patent: May 2, 2023

(54) ARRAY SUBSTRATE, AND DISPLAY PANEL AND DISPLAY DEVICE THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Shuang Zhao, Beijing (CN); Chenyu Chen, Beijing (CN); Wenbo Chen, Beijing (CN); Hongting Lu, Beijing (CN); Yanping Ren, Beijing (CN); Jing Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 42 days.

(21) Appl. No.: 17/279,844

(22) PCT Filed: Jun. 30, 2020

(86) PCT No.: PCT/CN2020/099343
§ 371 (c)(1),
(2) Date: Mar. 25, 2021

(87) PCT Pub. No.: WO2022/000284
PCT Pub. Date: Jan. 6, 2022

(65) Prior Publication Data
US 2022/0199007 A1   Jun. 23, 2022

(51) Int. Cl.
*G09G 3/3225* (2016.01)
*H01L 27/32* (2006.01)
*G09G 3/3233* (2016.01)

(52) U.S. Cl.
CPC ......... *G09G 3/3225* (2013.01); *G09G 3/3233* (2013.01); *H01L 27/3276* (2013.01);
(Continued)

(58) Field of Classification Search
CPC ......... G09G 3/3225; G09G 2300/0439; G09G 2310/061; G09G 2320/0233; H01L 27/3276
See application file for complete search history.

(56) References Cited

U.S. PATENT DOCUMENTS

2008/0150846 A1* 6/2008 Chung ................. G09G 3/3233
345/80
2009/0303164 A1* 12/2009 Kajiyama ............ G09G 3/3233
345/76

(Continued)

FOREIGN PATENT DOCUMENTS

CN          204257651 U      4/2015
CN          107230455 A     10/2017
(Continued)

OTHER PUBLICATIONS

International Search Report and Written Opinion dated Mar. 17, 2021 for PCT Application No. PCT/CN2020/099343.

*Primary Examiner* — Adam R. Giesy
(74) *Attorney, Agent, or Firm* — Dave Law Group LLC; Raj S. Dave

(57) ABSTRACT

The present disclosure relates to an array substrate and a display panel and a display device thereof. The array substrate comprises: a substrate; a pixel array disposed on the substrate, comprising a plurality of sub-pixels arranged in a plurality of rows and a plurality of columns; a plurality of pairs of scan signal lines, extending in a row direction and being spaced apart from each other in a column direction; and a reset voltage source signal line and a data signal line, extending in the column direction.

20 Claims, 20 Drawing Sheets

(52) U.S. Cl.
CPC ............ *G09G 2300/0439* (2013.01); *G09G 2310/061* (2013.01); *G09G 2320/0233* (2013.01)

(56) References Cited

U.S. PATENT DOCUMENTS

| | | | |
|---|---|---|---|
| 2018/0130411 A1* | 5/2018 | Zhou | ................... G09G 3/3225 |
| 2019/0096322 A1 | 3/2019 | Gao | |

FOREIGN PATENT DOCUMENTS

| | | | |
|---|---|---|---|
| CN | 107767819 A | | 3/2018 |
| CN | 110956929 A | | 4/2020 |
| JP | 2016-045300 A | | 4/2016 |

\* cited by examiner

ARRAY SUBSTRATE, AND DISPLAY PANEL AND DISPLAY DEVICE THEREOF

CROSS-REFERENCE TO RELATED APPLICATIONS

The present application is the U.S. National Stage Entry of PCT/CN2020/099343, filed on Jun. 30, 2020, the entire disclosure of which is incorporated herein by reference as part of the disclosure of this application.

TECHNICAL FIELD

Embodiments of the present disclosure relate to the field of displaying technology, and particularly, relate to an array substrate and a display panel and a display device thereof.

BACKGROUND

Organic Light-Emitting Diode (OLED) display panels have advantages such as self-luminescence, high efficiency, bright colors, being light and thin, power saving, being rollable, and wide operating temperature range, etc., which have been gradually applied to fields such as large-area displaying, lighting, and vehicle displaying, etc.

SUMMARY

Embodiments of the present disclosure provide an array substrate. The array substrate includes: a substrate; a pixel array disposed on the substrate, comprising a plurality of sub-pixels arranged in a plurality of rows and a plurality of columns; a plurality of pairs of scan signal lines, extending in a row direction and being spaced apart from each other in a column direction; and a reset voltage source signal line and a data signal line, extending in the column direction. Each of the sub-pixels has a pixel circuit, and a data signal input terminal, a scan signal input terminal, a driving reset control signal input terminal, and a reset voltage terminal coupled to the pixel circuit. The pixel circuit includes a data writing circuit, a driving circuit and a driving reset circuit. The driving circuit includes a control terminal, a first terminal and a second terminal. The data writing circuit is coupled to the data signal input terminal, the scan signal input terminal and the first terminal of the driving circuit, and is configured to provide a data signal to the first terminal of the driving circuit under a control of a scan signal. The driving circuit is configured to provide a driving current to a light-emitting device, the driving reset circuit is coupled to the driving reset control signal input terminal, the control terminal of the driving circuit, and the reset voltage terminal, and is configured to reset the control terminal of the driving circuit under a control of the driving reset control signal. Each of the plurality of pairs of scan signal lines includes a first scan signal line and a second scan signal line, and wherein a m-th pair of scan signal lines corresponds to the sub-pixels in a m-th row, where m is greater than or equal to 1. The first scan signal line in the m-th pair of scan signal lines is configured to provide a first scan signal to the scan signal input terminal of the sub-pixel in a (2n−1)-th column from the sub-pixels in the m-th row, where n is an integer greater than or equal to 1. The second scan signal line in the m-th pair of scan signal lines is configured to provide a second scan signal to sub-pixel in a 2n-th column from the sub-pixels in the m-th row. The reset voltage source signal line and the data signal line are alternately arranged with each other in the row direction, and an interval between the data signal line and the reset voltage source signal line adjacent to each other defines a column of sub-pixels. The reset voltage source signal line is configured to provide a reset voltage to a reset voltage terminal of the sub-pixel in a column of sub-pixels adjacent to the reset voltage source signal line. The data signal line is configured to provide a data signal to a data signal input terminal of the sub-pixel in a column of sub-pixels adjacent to the data signal line.

In an embodiment of the present disclosure, the data signal line and the reset voltage source signal line are arranged in a same layer.

In an embodiment of the present disclosure, the array substrate further includes a plurality of pairs of driving reset control signal lines, extending in the row direction and being spaced apart from each other in the column direction. Each of the plurality of pairs of driving reset control signal lines includes a first driving reset control signal line and a second driving reset control signal line. A m-th pair of driving reset control signal lines corresponds to the sub-pixels in the m-th row. The first driving reset control signal line in the m-th pair of driving reset control signal lines is configured to provide a first driving reset control signal to the driving reset control signal input terminal of the sub-pixel in the (2n−1)-th column from the sub-pixels in the m-th row. The second driving reset control signal line in the m-th pair of driving reset control signal lines is configured to provide a second driving reset control signal to the driving reset control signal input terminal of the sub-pixel in a 2n-th column from the sub-pixels in the m-th row of sub-pixels.

In an embodiment of the present disclosure, the first scan signal line in the m-th pair of scan signal lines and the second driving reset control signal line in the m-th pair of driving reset control signal lines are the same signal line.

In an embodiment of the present disclosure, the pixel circuit further includes a compensation circuit, which is coupled to the second terminal of the driving circuit, the control terminal of the driving circuit and the scan signal input terminal, and configured to perform threshold compensation on the driving circuit according to the scan signal.

In an embodiment of the present disclosure, the pixel circuit further includes a storage circuit, coupled to a first voltage terminal and the control terminal of the driving circuit, and configured to store a voltage difference between the first voltage terminal and the control terminal of the driving circuit.

In an embodiment of the present disclosure, the sub-pixel further includes a light-emitting control signal input terminal, and the pixel circuit further includes a light-emitting control circuit. The light-emitting control circuit is coupled to the light-emitting control signal input terminal, the first voltage terminal, the driving circuit and the light-emitting device, and is configured to apply a first voltage of the first voltage terminal to the driving circuit, and to apply a driving current generated by the driving circuit to the light-emitting device.

In an embodiment of the present disclosure, the array substrate further includes a plurality of light-emitting control signal lines, which extend in the column direction and are spaced apart from each other in the row direction. A m-th light-emitting control signal line is configured to be coupled to the light-emitting control signal input terminals of the sub-pixels in the m-th row to provide a light-emitting control signal.

In an embodiment of the present disclosure, the sub-pixel further includes a light-emitting reset control signal input terminal, and the pixel circuit further includes a light-emitting reset circuit, which is coupled to the light-emitting reset control signal input terminal, the reset voltage terminal and the light-emitting device, and configured to reset the light-emitting device under a control of a light-emitting reset control signal.

In an embodiment of the present disclosure, the array substrate further includes a plurality of pairs of light-emitting reset control signal lines, which extend in the row direction and are spaced apart from each other in the column direction. Each of the plurality of pairs of light-emitting reset control signal lines includes a first light-emitting reset control signal line and a second light-emitting reset control signal line, and a m-th pair of light-emitting reset control signal lines corresponds to sub-pixels in the m-th row. The first light-emitting reset control signal line in the m-th pair of light-emitting reset control signal lines is configured to provide a first light-emitting reset control signal to the light-emitting reset control signal input terminal of the sub-pixels in the (2n−1)-th column from the sub-pixels in the m-th row. The second light-emitting reset control signal line in the m-th pair of light-emitting reset control signal lines is configured to provide a second light-emitting reset control signal to the light-emitting reset control signal input terminal of the sub-pixels in the 2n-th column from the sub-pixels in the m-th row.

In an embodiment of the present disclosure, the first light-emitting reset control signal line in the m-th pair of light-emitting reset control signal lines and the first driving reset control signal line in a (m+1)-th pair of driving reset control signal lines are the same signal line. The second light-emitting reset control signal line in the m-th pair of light-emitting reset control signal lines and the second driving reset control signal line in the (m+1)-th pair of driving reset control signal lines are the same signal line.

In an embodiment of the present disclosure, the data writing circuit includes a data writing transistor. The driving circuit includes a driving transistor. The driving reset circuit includes a driving reset transistor. The compensation circuit includes a compensation transistor. The light-emitting control circuit includes a first light-emitting control transistor and a second light-emitting control transistor. The light-emitting reset circuit includes a light-emitting reset transistor. The storage circuit includes a capacitor. A first electrode of the driving transistor is coupled to the first terminal of the driving circuit. A second electrode of the driving transistor is coupled to the second terminal of the driving circuit. A gate of the driving transistor is coupled to the control terminal of the driving circuit. A first electrode of the data writing transistor is coupled to the data signal input terminal. A second electrode of the data writing transistor is coupled to the first electrode of the driving transistor. A gate of the data writing transistor is coupled to the scan signal input terminal. A first electrode of the driving reset transistor is coupled to the gate of the driving transistor. A second electrode of the driving reset transistor is coupled to the reset voltage terminal. A gate of the driving reset transistor is coupled to the driving reset control signal input terminal. A first electrode of the compensation transistor is coupled to the second electrode of the driving transistor. A second electrode of the compensation transistor is coupled to the gate of the driving transistor. A gate of the compensation transistor is coupled to the scan signal input terminal. A first electrode of the first light-emitting control transistor is coupled to the first voltage terminal. A second electrode of the first light-emitting control transistor is coupled to the first electrode of the driving transistor. A gate of the first light-emitting control transistor is coupled to the light-emitting control signal input terminal. A first electrode of the second light-emitting control transistor is coupled to the second electrode of the driving transistor. A second electrode of the second light-emitting control transistor is coupled to a first electrode of the light-emitting device. A gate of the second light-emitting control transistor is coupled to the light-emitting control signal input terminal. A first electrode of the light-emitting reset transistor is coupled to the first electrode of the light-emitting device. A second electrode of the light-emitting reset transistor is coupled to the reset voltage terminal. A gate of the light-emitting reset transistor is coupled to the light-emitting reset control signal input terminal. A first electrode of the capacitor is coupled to the gate of the driving transistor. A second electrode of the capacitor is coupled to the first voltage terminal.

In an embodiment of the present disclosure, the array substrate further includes an active semiconductor layer located on the substrate. The active semiconductor layer includes active regions of transistors in the pixel circuit. For the sub-pixels in the m-th row: the active semiconductor layer of the sub-pixel in the (2n−1)-th column includes a first part, a second part, and a third part that are spaced apart from each other. The first part and the second part are arranged sequentially in the row direction. A combination of the first part with the second part and the third part are arranged sequentially in the column direction. The first part includes the active regions of the driving reset transistor and the compensation transistor in the sub-pixel in the (2n−1)-th column. The second part includes the active region of the data writing transistor in the sub-pixel in the (2n−1)-th column. The third part includes the active regions of the driving transistor, the first light-emitting control transistor, the second light-emitting control transistor, and the light-emitting reset transistor in the sub-pixel in the (2n−1)-th column. The active semiconductor layer of the sub-pixel in the 2n-th column includes a fourth part and a fifth part sequentially arranged in the column direction. The fourth part includes the active regions of the driving reset transistor, the data writing transistor, the compensation transistor, the driving transistor, the first light-emitting control transistor and the second light-emitting control transistor in the sub-pixel in the 2n-th column. The fifth part includes the active region of the light-emitting reset transistor in the sub-pixel in the 2n-th column.

In an embodiment of the present disclosure, the array substrate further includes a first conductive layer located on a side of the active semiconductor layer away from the substrate. The first conductive layer includes the first driving reset control signal line, the first scan signal line, the second scan signal line, the first electrode of the capacitor, the light-emitting control signal line, the first light-emitting reset control signal line, and the second light-emitting reset control signal line sequentially arranged in the column direction. The first scan signal line is used as the second driving reset control signal line. The first electrode of the capacitor and the gate of the driving transistor are an integral structure.

In an embodiment of the present disclosure, a part of the first driving reset control signal line, an orthographic projection of which on the substrate overlaps with an orthographic projection of the first part of the active semiconductor layer on the substrate, is the gate of the driving reset transistor in the sub-pixel in the (2n−1)-th column. Parts of the first scan signal line, orthographic projections of which on the substrate overlap with orthographic projections of the first part, the second part, and the fourth part of the active semiconductor layer on the substrate, are respectively the gates of the compensation transistor and the data writing transistor in the sub-pixel in the (2n−1)-th column as well as the driving reset transistor in the sub-pixel in the 2n-th column. Parts of the second scan signal line, orthographic projections of which on the substrate overlap with an orthographic projection of the fourth part of the active semiconductor layer on the substrate, are respectively the gates of the data writing transistor and the compensation transistor in the sub-pixel in the 2n-th columns. A part of the first electrode of the capacitor in the sub-pixel in the (2n−1)-th column, an orthographic projection of which on the substrate overlaps with an orthographic projection of the third part of the active semiconductor layer on the substrate, is the gate of the driving transistor in the sub-pixel in the (2n−1)-th column. A part of the first electrode of the capacitor in the sub-pixel in the 2n-th column, an orthographic projection of which on the substrate overlaps with an orthographic projection of the fourth part of the active semiconductor layer on the substrate, is the gate of the driving transistor in the sub-pixel in the 2n-th column. Parts of the light-emitting control signal line, orthographic projections of which on the substrate overlap with orthographic projections of the third part and the fourth part of the active semiconductor layer on the substrate, are respectively the gates of the first light-emitting control transistor and the second light-emitting control transistor in the sub-pixel in the (2n−1)-th column, and the first light-emitting control transistor and the second light-emitting control transistor in the sub-pixel in the 2n-th column. A part of the first light-emitting reset control signal line, an orthographic projection of which on the substrate overlaps with an orthographic projection of the third part of the active semiconductor layer on the substrate, is the gate of the light-emitting reset transistor in the sub-pixel in the (2n−1)-th column. A part of the second light-emitting reset control signal line, an orthographic projection of which on the substrate overlaps with an orthographic projection of the fifth part of the active semiconductor layer on the substrate, is the gate of the light-emitting reset transistor in the sub-pixel in the 2n-th column.

In an embodiment of the present disclosure, the array substrate further includes a second conductive layer located on a side of the first conductive layer away from the substrate. The second conductive layer includes a second electrode of the capacitor and a first voltage source signal line as a first voltage source arranged in the column direction. An orthographic projection of the second electrode of the capacitor on the substrate at least partially overlap with an orthographic projection of the first electrode of the capacitor on the substrate. The first voltage source signal line extends in the row direction and is integrally formed with the second electrode of the capacitor.

In an embodiment of the present disclosure, the array substrate further includes a third conductive layer located on a side of the second conductive layer away from the substrate. The third conductive layer includes the data signal line, the reset voltage source signal line, a second voltage source signal line as the first voltage source, a third voltage source signal line as the first voltage source, a first connecting portion, a second connecting portion, a third connecting portion, a fourth connecting portion, a fifth connecting portion and a sixth connecting portion. One end of the first connecting portion is coupled to the first electrode of the compensation transistor in the sub-pixel in the (2n−1)-th column, and the other end is coupled to the second electrode of the driving transistor in the sub-pixel in the (2n−1)-th column. One end of the second connecting portion is coupled to the first electrode of the driving reset transistor in the sub-pixel in the (2n−1)-th column, and the other end is coupled to the gate of the driving transistor in the sub-pixel in the (2n−1)-th column. One end of the third connecting portion is coupled to the second electrode of the data writing transistor in the sub-pixel in the (2n−1)-th column, and the other end is coupled to the first electrode of the driving transistor in the sub-pixel in the (2n−1)-th column. The fourth connecting portion is coupled to the second electrode of the second light-emitting control transistor in the sub-pixel in the (2n−1)-th column. One end of the fifth connecting portion is coupled to the first electrode of the driving reset transistor in the sub-pixel in the 2n-th column, and the other end is coupled to the gate of the driving transistor in the sub-pixel in the 2n-th column. One end of the sixth connecting portion is coupled to the second electrode of the second light-emitting control transistor in the sub-pixel in the 2n-th column, and the other end is coupled to the first electrode of the light-emitting reset transistor in the sub-pixel in the 2n-th column. The data signal line is coupled to the first electrode of the data writing transistor in the sub-pixel in the (2n−1)-th column and the first electrode of the data writing transistor in the sub-pixel in the 2n-th column. The reset voltage source signal line is coupled to the second electrode of the driving reset transistor and the second electrode of the light-emitting reset transistor in the sub-pixel in the 2n-th column, and is coupled to the second electrode of the driving reset transistor and the second electrode of the light-emitting reset transistor in the sub-pixel in the (2n+1)-th column. The second voltage source signal line extends in the column direction and is located in the sub-pixel in the (2n−1)-th column, and is coupled to the second electrode of the capacitor and the first electrode of the first light-emitting control transistor in the sub-pixel in the (2n−1)-th column. The third voltage source signal line extends in the column direction and is located in the sub-pixel in the 2n-th column, and is coupled to the second electrode of the capacitor and the first electrode of the first light-emitting control transistor in the sub-pixel in the 2n-th column.

In an embodiment of the present disclosure, the second conductive layer further includes a first additional reset voltage source signal line and a second additional reset voltage source signal line extending in the row direction. The second electrode of the capacitor and the first voltage source signal line are located between the first additional reset voltage source signal line and the second additional reset voltage source signal line in the column direction.

In an embodiment of the present disclosure, the array substrate further includes a third conductive layer located on a side of the second conductive layer away from the substrate. The third conductive layer includes the data signal line, the reset voltage source signal line, a second voltage source signal line as the first voltage source, a third voltage source signal line as the first voltage source, a first connecting portion, a second connecting portion, a third connecting portion, a fourth connecting portion, a fifth connecting portion, a sixth connecting portion, a seventh connecting portion, an eighth connecting portion, a ninth connecting portion and a tenth connecting portion. One end of the first connecting portion is coupled to the first electrode of the compensation transistor in the sub-pixel in the (2n−1)-th column, and the other end is coupled to the second electrode of the driving transistor in the sub-pixel in the (2n−1)-th column. One end of the second connecting portion is coupled to the first electrode of the driving reset transistor in the sub-pixel in the (2n−1)-th column, and the other end is coupled to the gate of the driving transistor in the sub-pixel in the (2n−1)-th column. One end of the third connecting portion is coupled to the second electrode of the data writing transistor in the sub-pixel in the (2n−1)-th column, and the other end is coupled to the first electrode of the driving transistor in the sub-pixel in the (2n−1)-th column. The fourth connecting portion is coupled to the second electrode of the second light-emitting control transistor in the sub-pixel in the (2n−1)-th column. One end of the fifth connecting portion is coupled to the first electrode of the driving reset transistor in the sub-pixel in the 2n-th column, and the other end is coupled to the gate of the driving transistor in the sub-pixel in the 2n-th column. One end of the sixth connecting portion is coupled to the second electrode of the second light-emitting control transistor in the sub-pixel in the 2n-th column, and the other end is coupled to the first electrode of the light-emitting reset transistor in the sub-pixel in the 2n-th column. One end of the seventh connecting portion is coupled to the first additional reset voltage source signal line, and the other end is coupled to the second electrode of the driving reset transistor in the sub-pixel in the (2n−1)-th column. One end of the eighth connecting portion is coupled to the second additional reset voltage source signal line, and the other end is coupled to the second electrode of the light-emitting reset transistor in the sub-pixel in the (2n−1)-th column. One end of the ninth connecting portion is coupled to the first additional reset voltage source signal line, and the other end is coupled to the second electrode of the driving reset transistor in the sub-pixel in the 2n-th column. One end of the tenth connecting portion is coupled to the second additional reset voltage source signal line, and the other end is coupled to the second electrode of the light-emitting reset transistor in the sub-pixel in the 2n-th column. The data signal line is coupled to the first electrode of the data writing transistor in the sub-pixel in the (2n−1)-th column and the first electrode of the data writing transistor in the sub-pixel in the 2n-th column. The reset voltage source signal line is coupled to the first additional reset voltage source signal line and the second additional reset voltage source signal line. The second voltage source signal line extends in the column direction and is located in the sub-pixel in the (2n−1)-th column, and is coupled to the second electrode of the capacitor and the first electrode of the first light-emitting control transistor in the sub-pixel in the (2n−1)-th column. The third voltage source signal line extends in the column direction and is located in the sub-pixel in the 2n-th column, and is coupled to the second electrode of the capacitor and the first electrode of the first light-emitting control transistor in the sub-pixel in the 2n-th column.

In an embodiment of the present disclosure, the array substrate further includes a fourth conductive layer located on a side of the third conductive layer away from the substrate. The fourth conductive layer includes a fourth voltage source signal line as the first voltage source, an eleventh connecting portion, and a twelfth connecting portion. An orthographic projection of the second voltage source signal line on the substrate at least partially overlaps with an orthographic projection of the fourth voltage source signal line on the substrate. An orthographic projection of the third voltage source signal line on the substrate at least partially overlaps with an orthographic projection of the fourth voltage source signal line on the substrate. The fourth voltage source signal line is coupled to the second voltage source signal line and the third voltage source signal line. The eleventh connecting portion is coupled to the fourth connecting portion. The twelfth connecting portion is coupled to the one end of the sixth connecting portion.

Embodiments of the present disclosure provide a display panel. The display panel includes the array substrate as described above.

Embodiments of the present disclosure provide a display device. The display device includes the display panel as described above.

Further aspects and areas of applicability will become apparent from the description provided herein. It should be understood that various aspects of the present application may be implemented individually or in combination with one or more other aspects. It should also be understood that the description and specific examples herein are intended for purposes of illustration only and are not intended to limit the scope of the present application.

BRIEF DESCRIPTION OF THE DRAWINGS

The drawings described herein are for illustrative purposes only of selected embodiments and not all possible implementations, and are not intended to limit the scope of the present application.

Corresponding reference numerals indicate corresponding parts or features throughout the several diagrams of the drawings.

DETAILED DESCRIPTION

Figure 1:
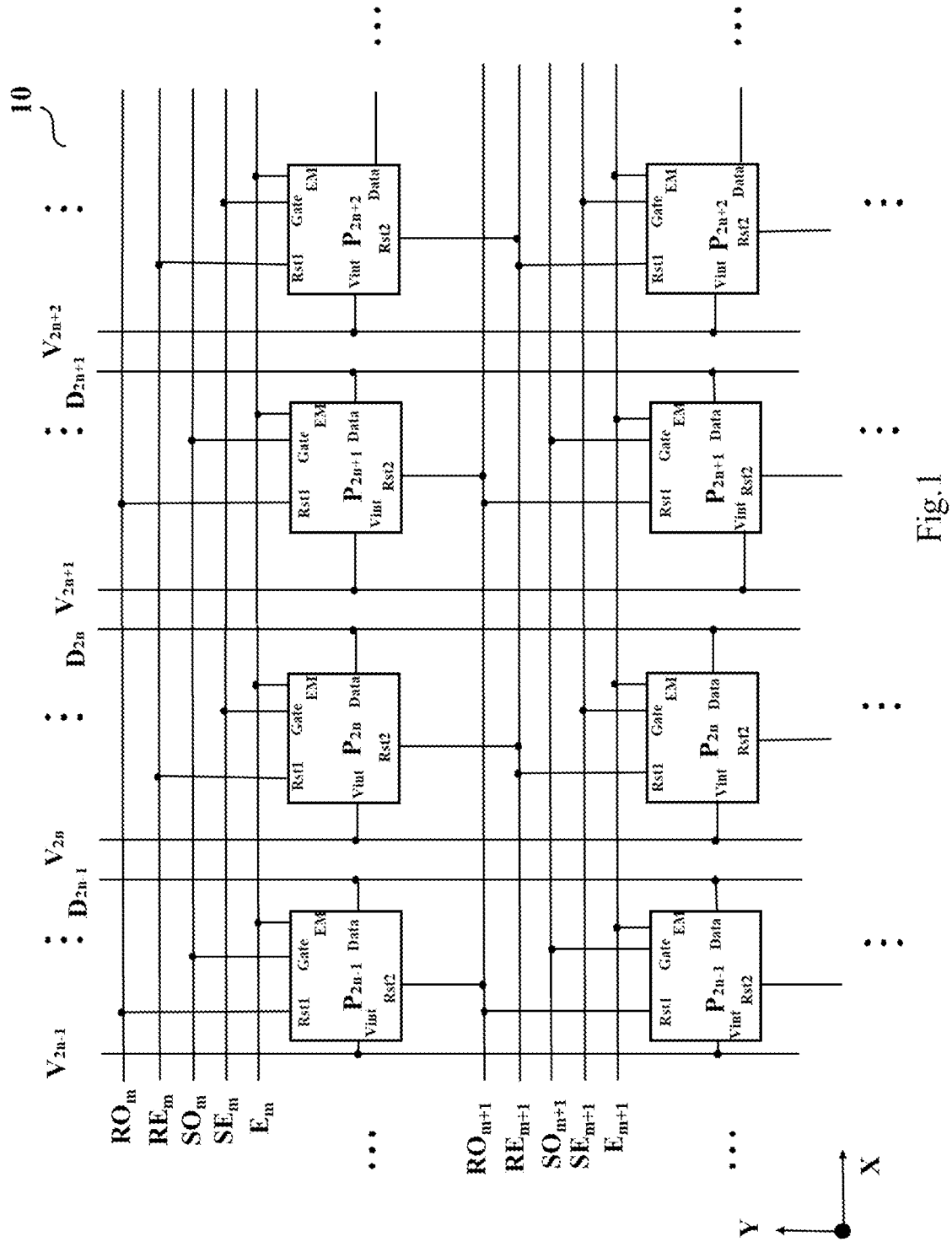
FIG. 1 shows a structural schematic diagram of an array substrate.

Firstly, it should be noted that, as used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. The term "example" used herein, particularly when followed by a listing of terms, is merely exemplary and illustrative and should not be deemed to be exclusive or comprehensive.

Additionally, further to be noted, when the elements and the embodiments thereof of the present application are introduced, the articles "a/an", "one", "the" and "said" are intended to represent the existence of one or more elements. Unless otherwise specified, "a plurality of" means two or more. The expressions "comprise", "include", "contain" and "have" are intended as inclusive and mean that there may be other elements besides those listed. The terms such as "first" and "second" are used herein only for purposes of description and are not intended to indicate or imply relative importance and the order of formation.

In addition, in the drawings, the thickness and area of each layer are exaggerated for clarity. It should be understood that when a layer, a region, or a component is referred to as being "on" another part, it is meant that it is directly on the another part, or there may be other components in between. In contrast, when a certain component is referred to as being "directly" on another component, it is meant that no other component lies in between.

Exemplary embodiments will now be described more fully with reference to the accompanying drawings.

In a general array substrate, since pixel units in a plurality of columns from the pixel units in a same row are coupled to a same scan signal line, the pixel units in the plurality of columns from the pixel units in the same row will be turned on simultaneously under the driving of a scan signal provided by a same scan line, and turn-on times the pixel units in the plurality of columns from the pixel units in the same row are the same; in addition, since the pixel units in the plurality of columns from the pixel units in the same row are coupled to a plurality of different data lines, the pixel units in the plurality of columns from the pixel units in the same row will be sequentially wrote in with data signals provided by the plurality of different data lines. In this case, this may result in that the pixel units in the plurality of columns from the pixel units in the same row have different charging methods, such as first charging and then discharging, and discharging while charging, which in turn causes uneven display brightness of the pixel units in the plurality of columns from the pixel units in the same row, and affects display quality.

FIG. 1 shows a structural schematic diagram of an array substrate, which can solve the above-mentioned problem. As shown in FIG. 1, the array substrate 10 includes a substrate, a plurality of pairs of scan signal lines S, a plurality of pairs of driving reset control signal lines R and a pixel array disposed on the substrate. The pixel array includes a plurality of sub-pixels P arranged in a plurality of rows and a plurality of columns. As shown in FIG. 1, the sub-pixel P has a pixel circuit, a data signal input terminal Data, a scan signal input terminal Gate, and a driving reset control signal input terminal Rst1 coupled to the pixel circuit. In FIG. 1, $P_{2n-1}$ and $P_{2n}$ sub-pixels in a m-th row and $P_{2n-1}$ and $P_{2n}$ sub-pixels from in sub-pixels a (m+1)-th row are shown. In the embodiment of the present disclosure, both m and n are integers greater than or equal to 1.

As shown in FIG. 1, the array substrate 10 includes two pairs of scan signal lines extending in the row direction and spaced apart from each other in the column direction. a first scan signal line $SO_m$ is corresponding to the sub-pixel in a (2n−1)-th column and the sub-pixel in a (2n+1)-th column in the m-th row, and a second scan signal line $SE_m$ is corresponding to the sub-pixel in a 2n-th column and the sub-pixel in a (2n+2)-th column in the m-th row. A first scan signal line $SO_{m+1}$ is corresponding to the sub-pixel in the (2n−1)-th column and the sub-pixel in the (2n+1)-th column in the (m+1)-th row, and a second scan signal line $SE_{m+1}$ is corresponding to the sub-pixel in the 2n-th column and the sub-pixel in the (2n+2)-th column in the (m+1)-th row.

As shown in FIG. 1, the array substrate includes two pairs of driving reset control signal lines extending in the row direction and spaced apart from each other in the column direction. A first driving reset control signal line $RO_m$ is corresponding to the sub-pixels in the (2n−1)-th column and in the (2n+1)-th column in the m-th row, and a second driving reset control signal line $RE_m$ is corresponding to the sub-pixels in the 2n-th column and the (2n+2)-th column in the m-th row. A first driving reset control signal line $RO_{m+1}$ is corresponding to the sub-pixels in the (2n−1)-th column and the (2n+1)-th column in the (m+1)-th row, and a second driving reset control signal line $RE_{m+1}$ is corresponding to the sub-pixels in the 2n-th column and the (2n+2)-th column in the (m+1)-th row.

In the array substrate as shown in FIG. 1, the scan signal input terminal of the sub-pixel in the (2n−1)-th column from the sub-pixels in the m-th row may be coupled to the first scan signal line $SO_m$ to receive a first scan signal, and the scan signal input terminal of the sub-pixel in the 2n-th column from the sub-pixels in the m-th row may be coupled to the second scan signal line $SE_m$ to receive a second scan signal, thereby the sub-pixel in the (2n−1)-th column from the sub-pixels in the m-th row will be turned on firstly under the driving of the first scan signal, the sub-pixel in the 2n-th column will be turned on secondly under the driving of the second scan signal, and it can make the sub-pixel in the (2n−1)-th column and the sub-pixel in the 2n-th column from the sub-pixels in the m-th row have the same turn-on time. In this case, the sub-pixel in the (2n−1)-th column and the sub-pixel in the 2n-th column from the sub-pixels in the m-th row are charged in the same manner to avoid the problem of uneven display brightness of the sub-pixels in a plurality of columns from the pixel units in the same row, thereby improving the display quality.

However, for the array substrate as shown in FIG. 1, for the pixel units in each row, it needs to provide two scan signal generating circuits and two driving reset control signal generating circuits which are usually set at a edge of the array substrate, instead of one scan signal generating circuit and one driving reset control signal generating circuit in the general case, and this will disadvantageously increase the size of a display panel frame.

In addition, as shown in FIG. 1, the array substrate further includes a reset voltage source signal line V and a data signal line D extending in the column direction and spaced apart from each other in the row direction. A (2n−1)-th reset voltage source signal line $V_{2n-1}$ corresponds to the sub-pixel in the (2n−1)-th column from the sub-pixels in each row, . . . , and a (2n+2)-th reset voltage source signal line $V_{2n+2}$ corresponds to the sub-pixel in the (2n+2)-th column from the sub-pixels in each row. Similarly, a (2n−1)-th data signal line D2n−1 corresponds to the sub-pixel in the (2n−1)-th column from the sub-pixels in each row, . . . , and a (2n+2)-th data signal line D2n+2 corresponds to the sub-pixel in the (2n+2)-th column from the sub-pixels in each row. In this case, since each sub-pixel on the array substrate has a separate reset voltage source signal line and a data line that are not shared by other sub-pixels, the number of wirings on the array substrate is great, which results in low pixels per inch (PPI).

At least some embodiments of the present disclosure provide an array substrate. The array substrate includes a plurality of pairs of scan signal lines, which are configured to extend in the row direction and are spaced apart from each other in the column direction. Each of the plurality of pairs of scan signal lines include a first scan signal line and a second scan signal line. The array substrate includes a plurality of pairs of driving reset control signal lines, which are configured to extend in the row direction and are spaced apart from each other in the column direction. Each of the plurality of pairs of driving reset control signal lines include a first driving reset control signal line and a second driving reset control signal line. The array substrate includes a plurality of data lines and a pixel array, which includes a plurality of sub-pixels arranged in a plurality of rows and a plurality of columns. Each of the plurality of sub-pixels includes a data signal input terminal, a scan signal input terminal, and a driving reset control signal input terminal. The sub-pixels in the plurality of rows corresponds to the plurality of pairs of scan signal lines one-to-one, and the sub-pixels in each column corresponds to one data line of the plurality of data lines. The scan signal input terminal of the sub-pixel in the (2n−1)-th column (i.e., odd-numbered column) from the sub-pixels in the m-th row is coupled to the first scan signal line of a m-th pair of scan signal lines to receive the first scan signal, where both m and n are integers greater than or equal to 1. The scan signal input terminal of the sub-pixel in the 2n-th column (i.e., even-numbered column) from the sub-pixels in the m-th row is coupled to the second scan signal line of the m-th pair of scan signal lines to receive the second scan signal. The driving reset control signal input terminal of the sub-pixels in the (2n−1)-th column from the sub-pixels in the m-th row is coupled to the first scan signal line of the m-th pair of scan signal lines to receive the first scan signal as a first driving reset control signal. The driving reset control signal input terminal of the sub-pixel in the 2n-th column from the sub-pixels in the m-th row is coupled to the second scan signal line of the m-th pair of scan signal lines to receive the second scan signal as a second driving reset control signal.

In the array substrate provided by the embodiment of the present disclosure, the scan signal input terminal of the sub-pixel in the (2n−1)-th column from the sub-pixels in the m-th row may be coupled to the first scan signal line of the m-th pair of scan signal lines to receive the first scan signal, and the scan signal input terminal of the sub-pixel in the 2n-th column from the sub-pixels in the m-th row may be connected to the second scan signal line of the m-th pair of scan signal lines to receive the second scan signal, thereby the sub-pixel in the (2n−1)-th column from the sub-pixels in the m-th row will be turned firstly under the driving of the first scan signal provided by the first scan signal line of the m-th pair of scan signal lines, and the sub-pixel in 2n-th column will be secondly turned on under the driving of the second scan signal provided by the second scan signal line of the m-th pair of scan signal lines, and it can make the turn-on times of the sub-pixel in the (2n−1)-th column and the sub-pixel in the 2n-th column form the sub-pixels in the m-th row are the same. In this case, the sub-pixel in the (2n−1)-th column and the sub-pixel in the 2n-th column from the sub-pixels in the m-th row are charged in the same manner to avoid the problem of uneven display brightness of the sub-pixels in a plurality of columns from the sub-pixels in the same row, thereby improving the display quality.

In the array substrate provided by the embodiment of the present disclosure, the first scan signal line of the m-th pair of scan signal lines and the second driving reset control signal line of the m-th pair of driving reset control signal lines are the same signal line. Specifically, the scan signal input terminal of the sub-pixel in the 2n+1 column from the sub-pixels in the m-th row may be coupled to the first scan signal line of the m-th pair of scan signal lines, and the driving reset control signal input terminal of the sub-pixel in the 2n-th column from the sub-pixels in the m-th row may also be coupled to the first scan signal line of the m-th pair of scan signal lines, so that the first scan signal that is provided to the sub-pixel in the (2n−1)-th column from the sub-pixels in the m-th row by the first scan signal line of the m-th pair of scan signal lines may be provided to the sub-pixel in the 2n-th column from the sub-pixels in the m-th row as the first driving reset control signal to reset the sub-pixel in the 2n-th column from the sub-pixels in the m-th row. In this case, the number of gate drivers on array (GOA) integrated on the array substrate may be reduced, which is beneficial for the display device using the array substrate to realize a narrow frame design.

In an embodiment of the present disclosure, the sub-pixel may further include a reset voltage terminal. The array substrate further includes a plurality of reset voltage source signal lines. The plurality of reset voltage source signal lines extend in the column direction and are alternately arranged with the data signal lines in the row direction, and the interval between the data signal lines adjacent to each other and the interval between the reset voltage source signal lines adjacent to each other both are defined as a column of sub-pixels. The reset voltage source signal line is configured to provide a reset voltage to reset voltage terminals of the sub-pixels from the column of sub-pixels adjacent to the reset voltage source signal line. Specifically, a (n+1)-th reset voltage source signal line Vn+1 is adjacent to the sub-pixels in the 2n-th column and the sub-pixels in the (2n+1)-th column, and is configured to provide the reset voltage to the reset voltage terminals of the sub-pixels in the 2n-th column and the sub-pixels in the (2n+1)-th column. The data signal line is configured to provide a data signal to data signal input terminals of sub-pixels in the sub-pixel column adjacent to the data signal line. Specifically, a n-th data signal line Dn is adjacent to the sub-pixels in the (2n−1)-th column and the sub-pixels in the 2n-th column, and is configured to provide the data signal to the data signal input terminals of the sub-pixels in the (2n−1)-th column and the sub-pixels in the 2n-th column. A (n+1)-th data signal line Dn+1 is adjacent to the sub-pixels in the (2n+1)-th column and the sub-pixels in the (2n+2)-th column, and is configured to provide the data signal to the data signal input terminals of the sub-pixels in the (2n+1)-th column and the sub-pixels in the (2n+2)-th column. In this case, the number of data lines integrated on the array substrate may be reduced, thereby increasing PPI.

The array substrate provided by the embodiments of the present disclosure will be described below in a non-limiting manner with reference to the accompanying drawings. As described below, different features in these specific embodiments can be combined with each other without conflicting each other to obtain new embodiments, and these new embodiments also fall within the protection scope of the present disclosure.

Figure 2:
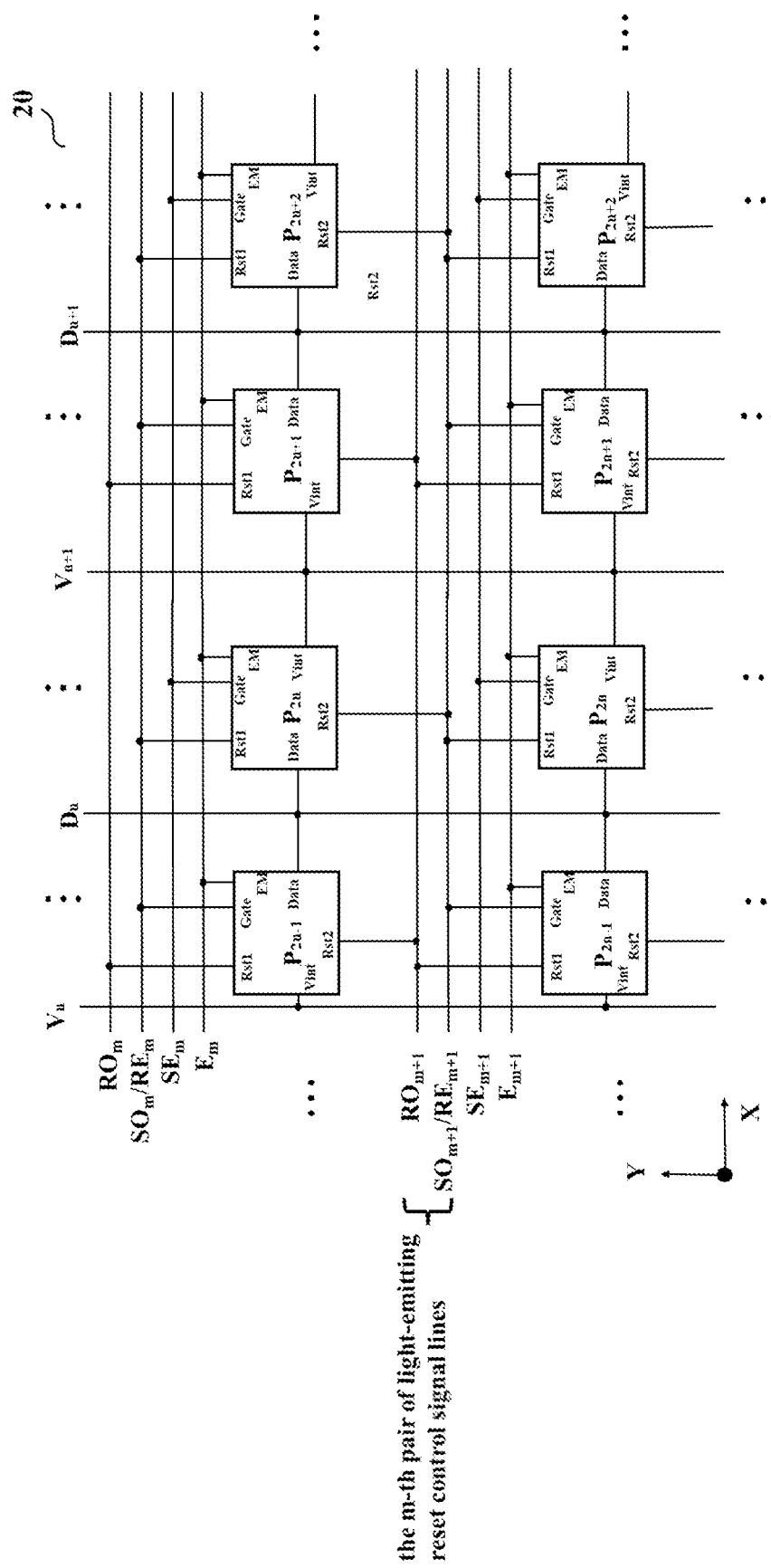
FIG. 2 shows a structural schematic diagram of the array substrate according to an embodiment of the present disclosure.

FIG. 2 is a structural schematic diagram of the array substrate according to some embodiments of the present disclosure.

As shown in FIG. 2, the array substrate 20 includes the substrate and the plurality of pairs of scan signal lines S, the plurality of pairs of driving reset control signal lines R, the plurality of reset voltage source signal lines V, the plurality of data lines D, and a pixel array disposed on the substrate. The substrate may be a glass substrate, a plastic substrate, etc., which is not limited in the embodiments of the present disclosure. The plurality of pairs of scan signal lines S may extend in the row direction and are spaced apart from each other in the column direction on the substrate, and each of the plurality of pairs of scan signal lines S includes a first scan signal line SO and a second scan signal line SE. The plurality of pairs of driving reset control signal lines R may extend in the row direction and be spaced apart from each other in the column direction on the substrate, and the plurality of pairs of driving reset control signal lines R may include a first driving reset control signal line RO and a second driving reset control signal line RE. The plurality of reset voltage source lines V and the plurality of data lines D are alternately arranged on the substrate in the row direction, and the interval between the data signal line and the adjacent reset voltage source signal line is defined as a column of sub-pixels. The pixel array includes the plurality of sub-pixels P arranged in the plurality of rows and the plurality of columns, for instance, the plurality of sub-pixels P are located in pixel regions defined by the intersection of the plurality of pairs of scan signal lines S, the plurality of reset voltage source signal lines V, and the plurality of data lines D, and each sub-pixel P includes the scan signal input terminal Gate, teh data signal input terminal DA, the driving reset control signal input terminal Rst1, and the reset voltage terminal VINT, to respectively receive the scan signal (e.g. the first scan signal or the second scan signal), the data signal, teh driving reset control signal (e.g. the first driving reset control signal or the second driving reset control signal) and the reset voltage for the pixel unit P.

For instance, a first direction may be perpendicular to a second direction, the first direction may be the row direction of the pixel array (e.g. the X direction in FIG. 2), and the second direction may be the column direction of the pixel array (e.g. the Y direction in FIG. 2).

As shown in FIG. 2, the sub-pixels in the plurality of rows may correspond to the plurality of pairs of scan signal lines S one-to-one, and each row of pixel units may be coupled to one pair of scan signal lines S corresponding thereto. For instance, the sub-pixels in the m-th row may correspond to the m-th pair of scan signal lines $S_m$, the sub-pixel in the (2n−1)-th column from the sub-pixels in the m-th row may correspond to the first scan signal line $SO_m$ of the m-th pair of scan signal lines $S_m$, the sub-pixel in the 2n-th column from the sub-pixels in the m-th row may correspond to the second scan signal line $SE_m$ of the m-th pair of scan signal lines $S_m$. The scan signal input terminal Gate of the sub-pixel in the (2n−1)-th column from the sub-pixels in the m-th row may be coupled to the first scan signal line $SO_m$ of the m-th pair of scan signal lines $S_m$ to receive the first scan signal, and the scan signal input terminal Gate of the sub-pixel in the 2n-th column from the sub-pixels in the m-th row may be coupled to the second scan signal line $SE_m$ of the m-th pair of scan signal lines $S_m$ to receive the second scan signal, where both m and n are integers greater than or equal to 1.

As shown in FIG. 2, the plurality of rows of sub-pixels may correspond to a plurality of pairs of driving reset control signal lines R one-to-one. Each row of sub-pixels may be coupled to one pair of driving reset control signal lines R corresponding thereto. For instance, the sub-pixels in the m-th row may correspond to the m-th pair of driving reset control signal lines $R_m$, the sub-pixel in the (2n−1)-th column from the sub-pixels in the m-th row may correspond to the first driving reset control signal line $RO_m$ of the m-th pair of driving reset control signal lines $R_m$, the sub-pixel in the 2n-th column from the sub-pixels in the m-th row may correspond to the second driving reset control signal line $RE_m$ of the m-th pair of driving reset control signal lines $R_m$. The driving reset control signal input terminal Rst1 of the sub-pixel in the (2n−1)-th column from the sub-pixels in the m-th row may be coupled to the first driving reset control signal line $RO_m$ of the m-th pair of driving reset control signals $R_m$ to receive the first driving reset control signal, and the driving reset control signal input terminal Rst1 of the sub-pixel in the 2n-th column from the sub-pixels in the m-th row may be coupled to the second driving reset control signal line $RE_m$ of the m-th pair of driving reset control signals $R_m$ to receive the second scan signal.

As shown in FIG. 2, the first scan signal line $SO_m$ of the m-th pair of scan signal lines $S_m$ and the second driving reset control signal line $RE_m$ of the m-th pair of driving reset control signal lines $R_m$ are the same signal line. Specifically, the driving reset control signal input terminal Rst1 of the sub-pixel in the 2n-th column from the sub-pixels in the m-th row may be coupled to the first scan signal line $SO_m/RE_m$ of the m-th pair of scan signal lines $S_m$ to receive the first scan signal. In this case, the first scan signal provided by the first scan signal line $SO_m$ of the m-th pair of scan signal lines Sm to the sub-pixel in the 2n-th column from the sub-pixels in the m-th row may be applied as the first driving reset control signal to the sub-pixel in the 2n-th column from the sub-pixels in the m-th row to reset the sub-pixel in the 2n-th column from the sub-pixels in the m-th row.

As shown in FIG. 2, the data signal line D is configured to provide the data signal to the data signal input terminals of the sub-pixels from the column of sub-pixels adjacent to the data signal line. Specifically, the sub-pixels in the (2n−1)-th column and the sub-pixels in the 2n-th column may correspond to the same data line Dn, the sub-pixels in the (2n+1)-th column and the sub-pixels in the (2n+2)-th column may correspond to the same data line Dn+1, . . . , and so on. The data signal input terminals Data of the sub-pixels in the (2n−1)-th column and the data signal input terminals Data of the sub-pixels in the 2n-th column may be coupled to the same data line Dn to receive the data signal. The data signal input terminals Data of the sub-pixels in the (2n+1)-th column and the data signal input terminals Data of the sub-pixels in the (2n+2)-th column may be coupled to the same data line $D_{n+1}$ to receive the data signal, . . . , and so on.

As shown in FIG. 2, the reset voltage source signal line V is configured to provide the reset voltage to the reset voltage terminals of the sub-pixels from the column of sub-pixels adjacent to the reset voltage source signal line. Specifically, the sub-pixels in the 2n-th column and the sub-pixels in the (2n+1)-th column may correspond to the same reset voltage source signal line $V_{n+1}$, the sub-pixels in the (2n+2)-th column and the sub-pixels in a (2n+3)-th column (not shown) may correspond to the same reset voltage source signal line Vn+2, . . . , and so on. The reset voltage terminals Vint of the sub-pixels in the 2n-th column and the reset voltage terminals Vint of the sub-pixels in the (2n+1)-th column may be coupled to the same reset voltage source signal line $V_{n+1}$ to receive the reset voltage, the reset voltage terminals Vint of the sub-pixels in the (2n+2)-th column and the reset voltage terminals Vint of the sub-pixels in the (2n+3)-th column may be coupled to the same reset voltage source signal line $V_{n+2}$ to receive the reset voltage, . . . , and so on.

As shown in FIG. 2, the n-th reset voltage source signal line Vn is arranged on the left side of the sub-pixels in the (2n−1)-th column and the n-th data line Dn is arranged on the right side of the sub-pixels in the (2n−1)-th column. One column of sub-pixels is arranged between the n-th reset voltage source signal line Vn and the n-th data line Dn, and two columns of sub-pixels may be arranged between two adjacent data lines D. Two columns of sub-pixels may be arranged between two adjacent reset voltage source signal lines V. However, it's obvious that the embodiments of the present disclosure are not limited to this. For instance, the n-th reset voltage source signal line Vn is arranged on the right side of the sub-pixels in the (2n−1)-th column, and the n-th data line Dn may be arranged on the left side of the sub-pixels in the (2n−1)-th column.

In some embodiments of the present disclosure, the sub-pixel P further includes a light-emitting reset control signal input terminal Rst2. The array substrate 20 further includes a plurality of pairs of light-emitting reset control signal lines (not shown). A plurality of pairs of light-emitting reset signal lines extend in the row direction and are spaced apart from each other in the column direction. Each of the plurality of pairs of light-emitting reset signal lines includes a first light-emitting reset control signal line and a second light-emitting reset control signal line. The m-th pair of light-emitting reset signal lines corresponds to the sub-pixels in the m-th row, and the first light-emitting reset signal line of the m-th pair of light-emitting reset signal lines is configured to provide a first light-emitting reset signal to the light-emitting reset signal input terminal of the sub-pixel in the (2n−1)-th column from the sub-pixels in the m-th row. The second light-emitting reset signal line of the m-th pair of light-emitting reset signal lines is configured to provide a second light-emitting reset signal to the light-emitting reset signal input terminal of the sub-pixel in the 2n-th column from the sub-pixels in the m-th row.

In this embodiment, the first light-emitting reset signal line of the m-th pair of light-emitting reset signal lines and the first driving reset control signal line of the (m+1)-th pair of driving reset control signal lines are the same signal line. The second light-emitting reset signal line of the m-th pair of light-emitting reset signal lines and the second driving reset control signal line of the (m+1)-th pair of driving reset control signal lines are the same signal line. Specifically, the light-emitting reset control signal input terminal of the sub-pixel in the (2n−1)-th column from the sub-pixels in the m-th row is connected to the first scan signal line of the (m+1)-th pair of scan signal lines, to receive the first scan signal provided by the first scan signal line of the (m+1)-th pair of scan signal lines as the first light-emitting reset control signal to reset the sub-pixel in the (2n−1)-th column from the sub-pixels in the m-th row. In this case, the first scan signal provided by the first scan signal line $SO_{m+1}$ of the (m+1)-th pair of scan signal lines $S_{m+1}$ to the sub-pixel in the (2n−1)-th column from the sub-pixels in the m-th row may be applied as the light-emitting reset control signal to the sub-pixel in the (2n−1)-th column from the sub-pixels in the m-th row to reset the sub-pixel in the (2n−1)-th column from the sub-pixels in the m-th row. The light-emitting reset control signal input terminal of the sub-pixel in the 2n-th column from the sub-pixels in the m-th row is coupled to the second scan signal line of the (m+1)-th pair of scan signal lines, to receive the second scan signal provided by the second scan signal line of the (m+1)-th pair of scan signal lines as the second light-emitting reset control signal to reset the sub-pixel in the 2n-th column from the sub-pixels in the m-th row. In this case, the second scan signal provided by the second scan signal line $SE_{m+1}$ of the (m+1)-th pair of scan signal lines $S_{m+1}$ to the sub-pixel in the 2n-th column from the sub-pixels in the m-th row may be applied as the light-emitting reset control signal to the sub-pixel in the 2n-th column from the sub-pixels in the m-th row to reset the sub-pixel in the 2n-th column from the sub-pixels in the m-th row.

As shown in FIG. 2, a reset signal input terminal RST of the sub-pixel in the (2n−1)-th column from the sub-pixels in the m-th row may be coupled to the first scan signal line $SO_{m-1}$ of the (m−1)-th pair of scan signal lines $S_{m-1}$. In this case, the first scan signal provided by the first scan signal line $SO_{m-1}$ of the (m−1)-th pair of scan signal lines $S_{m-1}$ to the sub-pixel in the n-th column from the sub-pixels in the (m−1)-th row may be applied as a second reset signal to the sub-pixel in the n-th column from the sub-pixels in the m-th row to reset the sub-pixel in the n-th column from the sub-pixels in the m-th row.

In addition, as shown in FIG. 2, in the case where the light-emitting reset control signal input terminal Rst2 of the sub-pixel in the (2n−1)-th column from the sub-pixels in the m-th row is coupled to the first scan signal line $SO_{m+1}$ of the (m+1)-th pair of scan signal lines $S_{m+1}$, the light-emitting reset control signal input terminal Rst2 of the sub-pixel in the 2n-th column from the sub-pixels in the m-th row is coupled to the second scan signal line $SE_{m+1}$ of the (m+1)-th pair of scan signal lines $S_{m+1}$. In this case, the resetting manner which the sub-pixel in the (2n−1)-th column and the sub-pixel in the 2n-th column from the sub-pixels in the m-th row are reset in is different from the resetting manner which the sub-pixel in the (2n−1)-th column and the sub-pixel in the 2n-th column from the sub-pixels in the (m+1)-th row. Specifically, as for the respective work periods of the sub-pixels in the m-th row and the sub-pixels in the (m+1)-th row, for the sub-pixels in the m-th row, the sub-pixel in the (2n−1)-th column is reset by using the first scan signal provided to the sub-pixel in the (2n−1)-th column from the sub-pixels in the (m+1)-th row as the light-emitting reset control signal, and for the m-th row of sub-pixels, the sub-pixel in the 2n-th column is reset by using the second scan signal provided to the sub-pixel in the 2n-th column from the sub-pixels in the (m+1)-th row as the light-emitting reset control signal.

In some embodiments of the present disclosure, the sub-pixel P further includes a light-emitting control signal input terminal to receive the light-emitting control signal for the sub-pixel P. Correspondingly, the array substrate 20 provided by this embodiment may further include a plurality of light-emitting control signal lines extending in the column direction and spaced apart from each other in the row direction on the substrate. The plurality of light-emitting control signal lines correspond to the plurality of rows of sub-pixels one-to-one, and the light-emitting control signal input terminal of the sub-pixels in the m-th row is coupled to the m-th light-emitting control signal line to receive the light-emitting control signal.

As shown in FIG. 2, each sub-pixel P further includes a light-emitting control signal input terminal EM. The array substrate 20 further includes the plurality of light-emitting control signal lines E arranged on the substrate. For instance, the plurality of light-emitting control signal lines E may be arranged on the substrate in the first direction. The plurality of light-emitting control signal lines E may correspond to the plurality of rows of sub-pixels one-to-one, and each row of sub-pixels may be coupled to one light-emitting control signal line E corresponding thereto. For instance, the sub-pixels in the m-th row corresponds to the m-th light-emitting control signal line $E_m$, and the light-emitting control signal input terminals EM of the sub-pixels in the m-th row may be coupled to the m-th light-emitting control signal line $E_m$ to receive the light-emitting control signal.

It should be noted that although FIG. 2 shows that the m-th light-emitting control signal line $E_m$ is arranged on the upper side of the sub-pixels in the m-th row, it's obvious that the embodiments of the present disclosure are not limited to this. For instance, the m-th light-emitting control signal line $E_m$ may be arranged on the lower side of the sub-pixels in the m-th row.

In some embodiments of the present disclosure, the sub-pixel P may further include a first voltage terminal VDD. The array substrate may further include a plurality of first voltage signal lines arranged on the substrate. The plurality of first voltage signal lines correspond to a plurality of rows of sub-pixels one-to-one. The first voltage terminal of the sub-pixel in the (2n−1)-th column from the sub-pixels in the m-th row is coupled to the (2n−1)-th first voltage signal line to receive the first voltage, . . . , and the first voltage terminal of the sub-pixel in the (2n+2)-th column from the sub-pixels in the m-th row is coupled to the (2n+2)-th first voltage signal line to receive the first voltage.

Figure 3:
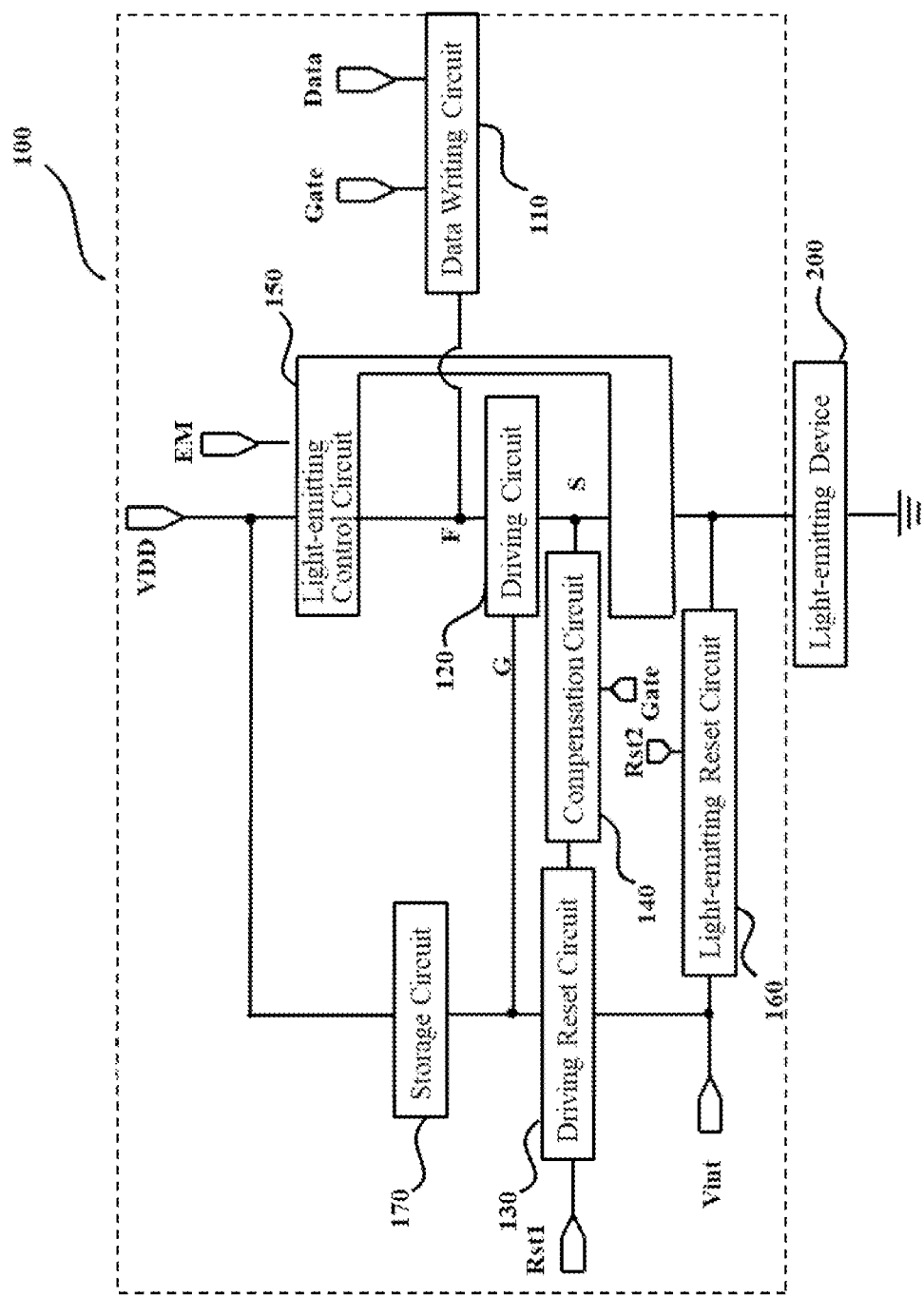
FIG. 3 shows a schematic block diagram of a sub-pixel according to an embodiment of the present disclosure.

FIG. 3 is a schematic block diagram of the sub-pixel according to some embodiments of the present disclosure. As shown in FIG. 3, the sub-pixel P includes a pixel circuit 100 and a light-emitting device 200. The pixel circuit 100 includes a data writing circuit 110, a driving circuit 120, a driving reset circuit 130, a compensation circuit 140, a light-emitting control circuit 150, a light-emitting reset circuit 160, and a storage circuit 170.

As shown in FIG. 3, the data writing circuit 110 is coupled to the data signal input terminal, and a first terminal F of the driving circuit 120 is coupled to the scan signal input terminal Gate. The data writing circuit 110 is configured to write the data signal into the driving circuit 120 under a control of the scan signal. For instance, the scan signal herein may be the first scan signal or the second scan signal described in the previous embodiments, and the scan signal mentioned in the following embodiments has a similar meaning, so the description of which will be omitted.

As shown in FIG. 3, the driving circuit 120 includes a control terminal G, the first terminal F, and a second terminal S, and is configured to provide a driving circuit to the light-emitting device 200 under a control of a control signal from the control terminal G.

As shown in FIG. 3, the driving reset circuit 130 is coupled to the control terminal G of the driving circuit 120, the reset voltage terminal Vint, and the driving reset control signal input terminal Rst1, and is configured to apply the reset voltage received from the reset voltage terminal Vint to the driving circuit 120 under a control of the driving reset control signal to reset the control terminal G of the driving circuit 120. For instance, the driving reset control signal herein may be the first driving reset control signal or the second driving reset control signal described in the previous embodiments, and the driving reset control signal mentioned in the following embodiments has a similar meaning, so the description of which will be omitted.

As shown in FIG. 3, the compensation circuit 140 is coupled to the control terminal G of the driving circuit 120, the second terminal S of the driving circuit 120, and the scan signal input terminal Gate, and is configured to perform threshold compensation on the driving circuit under a control of the first scan signal or the second scan signal from the scan signal input terminal Gate.

As shown in FIG. 3, the light-emitting control circuit 150 is coupled to the first terminal F of the driving circuit 120, the second terminal S of the driving circuit 120, and the light-emitting control signal input terminal EM, and is configured to apply the first voltage received from the first voltage terminal VDD to the driving circuit 120 under a control of the light-emitting control signal, thereby applying the driving current generated by the driving circuit 120 to the light-emitting device 200.

As shown in FIG. 3, the light-emitting reset circuit 160 is coupled to the light-emitting device 200, the reset voltage terminal VINT, and the light-emitting reset control signal input terminal Rst2, and is configured to apply the reset voltage received from the reset voltage terminal VINT to the light-emitting device 200 under a control of the light-emitting reset control signal to reset the light-emitting device 200. For instance, the light-emitting reset control signal herein may be the first light-emitting reset control signal or the second light-emitting reset control signal described in the previous embodiments, and the light-emitting reset control signal mentioned in the following embodiments has a similar meaning, so the description of which will be omitted.

As shown in FIG. 3, the storage circuit 170 is coupled to the first voltage terminal VDD and the control terminal G of the driving circuit 120, and is configured to store a voltage difference between the first voltage from the first voltage terminal VDD and the voltage of the control terminal G of the driving circuit 120.

As shown in FIG. 3, the light-emitting device 200 is coupled to the second voltage source VSS and the second terminal S of the driving circuit 120, and is configured to emit light under the driving of the driving current generated by the driving circuit 120.

For instance, the light-emitting device 200 may be a light-emitting diode or the like. The light-emitting diode may be an organic light-emitting diode (OLED) or a quantum dot light-emitting diode (QLED) or the like.

Figure 4:
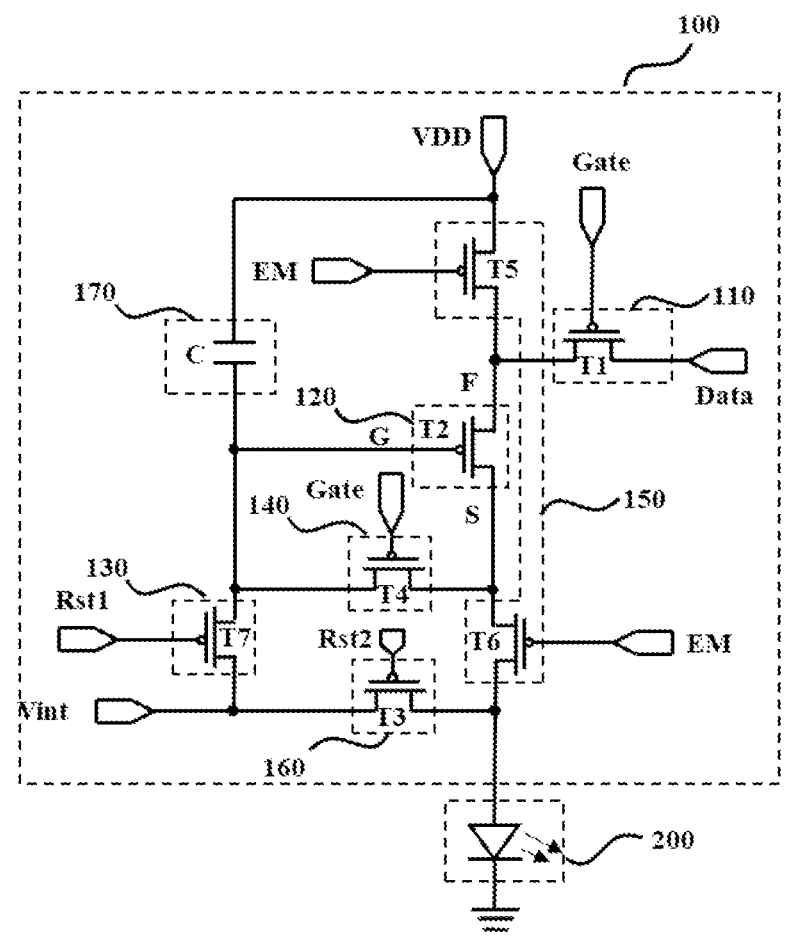
FIG. 4 shows the schematic diagram of the pixel circuit in FIG. 3 according to an embodiment of the present disclosure.

FIG. 4 is a schematic diagram of the pixel circuit in FIG. 3. As shown in FIG. 4, the data writing circuit 110 includes a data writing transistor T1, the driving circuit 120 includes a driving transistor T2, the driving reset circuit 130 includes a driving reset transistor T3, the compensation circuit 140 includes a compensation transistor T4, the light-emitting control circuit 150 includes a first light-emitting control transistor T5 and a second light-emitting control transistor T6, the light-emitting reset circuit 160 includes a light-emitting reset transistor T7, and the storage circuit 170 includes a capacitor C.

As shown in FIG. 4, a first electrode of the driving transistor T2 is coupled to the first terminal F of the driving circuit 120, a second electrode of the driving transistor T2 is coupled to the second terminal S of the driving circuit 120, and a gate of the driving transistor T2 is coupled to the control terminal G of the driving circuit 120.

As shown in FIG. 4, a first electrode of the data writing transistor T1 is coupled to the data signal input terminal Data to receive the data signal from the data signal line D, a second electrode of the data writing transistor T1 is coupled to the first electrode of the driving transistor T2, and a gate of the data writing transistor T1 is coupled to the scan signal input terminal Gate to receive the first scan signal or the second scan signal from the scan signal input terminal Gate, and is configured to provide the data signal from the data signal line D to the first electrode of the driving transistor T2 according to the first scan signal or the second scan signal from the scan signal input terminal Gate.

As shown in FIG. 4, a first electrode of the driving reset transistor T3 is coupled to the gate of the driving transistor T2, a second electrode of the driving reset transistor T3 is coupled to the reset voltage terminal VINT to receive the reset voltage from the reset voltage terminal VINT, and a gate of the driving reset transistor T3 is coupled to the driving reset control signal input terminal Rst1 to receive the first driving reset control signal or the second driving reset control signal from the driving reset control signal input terminal Rst1, and is configured to provide the reset voltage to the gate of the driving transistor T2 according to the first driving reset control signal or the second driving reset control signal from the driving reset control signal input terminal Rst1, to reset the gate of the driving transistor T2.

As shown in FIG. 4, a first electrode of the compensation transistor T4 is coupled to the second electrode of the driving transistor T2, a second electrode of the compensation transistor T4 is coupled to the gate of the driving transistor T2, and a gate of the compensation transistor T4 is coupled to the scan signal input terminal Gate to receive the first scan signal or the second scan signal from the scan signal input terminal Gate, and is configured to compensate the threshold of the driving transistor T2 according to the first scan signal or the second scan signal from the scan signal input terminal Gate.

As shown in FIG. 4, a first electrode of the first light-emitting control transistor T5 is coupled to the first voltage terminal VDD to receive the first voltage from the first voltage terminal VDD, a second electrode of the first light-emitting control transistor T5 is coupled to the first electrode of the driving transistor T2, and a gate of the first light-emitting control transistor T5 is coupled to the light-emitting control signal input terminal EM to receive the light-emitting control signal from the light-emitting control signal input terminal EM, and is configured to control the on/off state between the first voltage terminal VDD and the first electrode of the driving transistor T2 according to the light-emitting control signal from the light-emitting control signal input terminal EM, so as to control whether the first voltage from the first voltage terminal VDD is provided to the first electrode of the driving transistor T2 or not.

A first electrode of the second light-emitting control transistor T6 is coupled to the second electrode of the driving transistor T2, a second electrode of the second light-emitting control transistor T6 is coupled to the first electrode of the light-emitting device 200, and a gate of the second light-emitting control transistor T6 is coupled to the light-emitting control signal input terminal EM to receive the light-emitting control signal from the light-emitting control signal input terminal EM, and is configured to control the on/off state between the second electrode of the driving transistor T2 and the first electrode of the light-emitting device 200 according to the light-emitting control signal from the light-emitting control signal input terminal EM, so as to controlled whether the current generated by the driving transistor is provided to the light-emitting device 200 or not.

Under the control of the light-emitting control signal, the first light-emitting control transistor T5 and the second light-emitting control transistor T6 are jointly configured to apply the first voltage to the driving circuit 120 and apply the driving current generated by the driving circuit 120 to the light-emitting device 200.

As shown in FIG. 4, a first electrode of the capacitor C is coupled to the gate of the driving transistor T2, and a second electrode of the capacitor is coupled to the first voltage terminal VDD, and is configured to store the voltage difference between the first voltage from the first voltage terminal VDD and the voltage of the gate of the driving transistor T2.

It should be noted that the embodiments of the present disclosure are all described with conditions where the reset voltage terminal VINT is provided with a low voltage, the first voltage terminal VDD is provided with a high voltage, and the second voltage terminal VSS is provided with the low voltage, for example, the second electrode of the light-emitting device 200 is grounded. And the high voltage and the low voltage here only indicate the relative magnitude relationship between the input voltages.

It should be noted that the transistors used in the embodiments of the present disclosure may all be thin film transistors, field effect transistors, or other switching devices with the same characteristics. In the embodiments of the present disclosure, a thin film transistor is taken as an example for description. A source and a drain of the transistor used herein can be symmetrical in structure, so the source and the drain can be structurally indistinguishable. In the embodiments of the present disclosure, in order to distinguish the two electrodes of the transistor other than the gate, one electrode is directly described as the first electrode while the other electrode is described as the second electrode.

In addition, it should be noted that the transistors used in the embodiments of the present disclosure may all be P-type transistors or N-type transistors, and it only needs to couple the electrodes of the selected type of transistor with reference to the electrodes of the corresponding transistor in the embodiments of the present disclosure, and make the corresponding voltage terminal provide the corresponding high voltage or low voltage. For instance, for an N-type transistor, the input terminal thereof is the drain, the output terminal is the source, and the control terminal is the gate, and for a P-type transistor, the input terminal is the source, the output terminal is the drain, and the control terminal is the gate. For the transistors in different types, the voltage levels of the control signals at the control terminals are also different. For instance, for an N-type transistor, when the control signal is at a high level, the N-type transistor is in an on state, and when the control signal is at a low level, the N-type transistor is in an off state. For a P-type transistor, when the control signal is at a low state, the P-type transistor is in an on state, and when the control signal is at a high level, the P-type transistor is in an off state. When an N-type transistor is used, the transistor with an active layer in an oxide semiconductor, such as Indium Gallium Zinc Oxide (IGZO), compared with the active layer in Low Temperature Poly Silicon (LTPS) or amorphous silicon (such as hydrogenated amorphous silicon) may effectively reduce the size of the transistor and prevent leakage current. Low Temperature Poly Silicon generally refers to a situation where the crystallization temperature of polysilicon transferred from the crystallization of amorphous silicon is lower than 600 degrees Celsius.

It should be noted, in the embodiments of the present disclosure, in addition to the 7T1C (i.e., seven transistors and one capacitor) structure as shown in FIG. 4, the pixel circuit of the sub-pixel may also be a structure including other numbers of transistors, such as 7T2C structure, 6T1C structure, 6T2C structure, or 9T2C structure, and the embodiment of the present disclosure are not limited to this.

Figure 5:
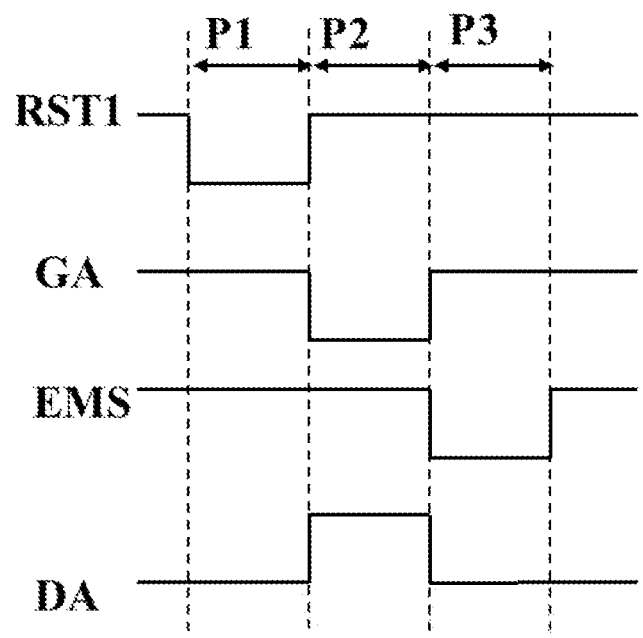
FIG. 5 shows a timing chart of signals for driving the pixel circuit in FIG. 4 according to an embodiment of the present disclosure.

FIG. 5 is a timing chart of signals for driving the pixel circuit in FIG. 4. As shown in FIG. 5, the working process of the pixel circuit 100 includes three phases, namely a reset phase P1, a data writing and compensation phase P2, and a light-emitting phase P3.

Taking the data writing transistor T1, the driving transistor T2, the driving reset transistor T3, the compensation transistor T4, the first light-emitting control transistor T5, the second light-emitting control transistor T6, and the light-emitting reset transistor T7 all employing P-type transistors as an example, the working process of the pixel circuit in FIG. 5 will be described in conjunction with FIG. 4 below.

As shown in FIG. 5, in the reset phase P1, the low-level driving reset control signal RST, the high-level scan signal GA, the high-level light-emitting control signal EMS, and the low-level data signal DA are input.

In the reset phase P1, the gate of the driving reset transistor T3 receives the low-level driving reset control signal RST1, and the driving reset transistor T3 is turned on, thereby applying the reset voltage VINT to the gate of the driving transistor T2 to reset the gate of the driving transistor T2, so as to make the driving transistor T2 in an on state enter the data writing and compensation phase P2.

In the reset phase P1, the gate of the light-emitting reset transistor T7 receives the low-level light-emitting reset control signal RST2, and the light-emitting reset transistor T7 is turned on, thereby applying the reset voltage VINT to an anode electrode of the OLED to reset the anode electrode of the OLED, so as to make the OLED without emitting light until the light-emitting phase P3.

In addition, in the reset phase P1, the gate of the data writing transistor T1 receives the high-level scan signal GA, and the data writing transistor T1 is turned off. The gate of the compensation transistor T4 receives the high-level scan signal GA, and the compensation transistor T4 is turned off. The gate of the first light-emitting control transistor T5 receives the high-level light-emitting control signal EMS, and the first light-emitting control transistor T5 is turned off And the gate of the second light-emitting control transistor T6 receives the high-level light-emitting control signal EM, and the second light-emitting control transistor T6 is turned off.

In the data writing and compensation phase P2, the high-level driving reset control signal RST, the low-level scan signal GA, the high-level light-emitting control signal EM, and the high-level data signal DA are input.

In the data writing and compensation phase P2, the gate of the data writing transistor T1 receives the low-level scan signal GA, and the data writing transistor T1 is turned on, so as to write the data signal into the first electrode of the driving transistor T2 (hereinafter referred to as a first joint). The gate of the compensation transistor T4 receives the low-level scan signal GA, and the compensation transistor T3 is turned on. Since the data writing transistor T1, the driving transistor T2, and the compensation transistor T4 are all turned on, the data signal DA charges the storage capacitor C via the data writing transistor T1, the driving transistor T2, and the compensation transistor T4, that is, charge the gate of the driving transistor T2 (hereinafter referred to as the second joint), so that the voltage of the gate of the driving transistor T2 gradually rises.

It is easy to understand that in the data writing and compensation phase P2, since the data writing transistor T1 is turned on, the voltage of the first joint remains at Vda. At the same time, according to the characteristics of the driving transistor T2, when the voltage of the second joint rises to Vda+Vth, the driving transistor T2 is turned off, and the charging process ends. Herein, Vda represents the voltage of the data signal DA, Vth represents the threshold voltage of the driving transistor T2. Since in this embodiment, the driving transistor T2 is described as a P-type transistor, the threshold voltage Vth herein may be a negative value.

After the data writing and compensation phase P2, the voltage of the gate of the driving transistor T2 is Vdata+Vth, that is, the voltage information of the data signal DA and the threshold voltage Vth is stored in the storage capacitor C for following compensation on the threshold voltage of the driving transistor T2 during the light-emitting phase P3.

In addition, in the data writing and compensation phase P2, the gate of the driving reset transistor T3 receives the high-level driving reset control signal RST1, and the driving reset transistor T3 is turned off. The gate of the light-emitting reset transistor T7 receives the high-level light-emitting reset control signal, and the light-emitting reset transistor T7 is turned off. The gate of the first light-emitting control transistor T5 receives the high-level light-emitting control signal EMS, and the first light-emitting control transistor T5 is turned off. And the gate of the second light-emitting control transistor T6 receives the high-level light-emitting control signal EMS, and the second light-emitting control transistor T6 is turned off.

In the light-emitting phase P3, the high-level driving reset control signal RST1, the high-level scan signal GA, the low-level light-emitting control signal EM, and the low-level data signal DA are input.

In the light-emitting phase P3, the gate of the first light-emitting control transistor T5 receives the low-level light-emitting control signal EM, and the first light-emitting control transistor T5 is turned on, so that the first voltage Vdd is applied to the first joint. The gate of the second light-emitting control transistor T6 receives the low-level light-emitting control signal EM, and the second light-emitting control transistor T6 is turned on, so that the driving current generated by the driving transistor T2 is applied to the OLED.

In addition, in the light-emitting phase P3, the gate of the driving reset transistor T3 receives the high-level driving reset control signal RST1, and the driving reset transistor T3 is turned off. The gate of the light-emitting reset transistor T7 receives the high-level light-emitting reset control signal RST2, and the light-emitting reset transistor T7 is turned off. The gate of the data writing transistor T1 receives the high-level scan signal GA, and the data writing transistor T1 is turned off And the gate of the compensation transistor T4 receives the high-level scan signal GA, and the compensation transistor T4 is turned off.

It is easy to understand that in the light-emitting phase P3, since the first light-emitting control transistor T5 is turned on, the voltage of the first joint is Vdd, and the voltage of the second joint is Vdata+Vth, so the driving transistor T2 is also turned on.

In the light-emitting phase P3, the anode and the cathode of the OLED are respectively provided with the first voltage Vdd (i.e., the high voltage) and the second voltage Vss (i.e., the low voltage), so that the OLED emits light under the driving of the driving current generated by the driving transistor T2.

Based on the saturation current formula of the driving transistor T2, the driving current ID for driving the OLED to emit light may be obtained according to the following equation:

$$ID = K(VGS - Vth)^2$$
$$= K[(Vda + Vth - Vdd) - Vth]^2$$
$$= K(Vda - Vdd)^2$$

In the equation above, Vth represents the threshold voltage of the driving transistor Td, VGS represents the voltage between the gate and the source of the driving transistor Td, and K is a constant. It can be seen from the equation above that the driving current ID flowing through the OLED is no longer related to the threshold voltage Vth of the driving transistor T2, but only related to the voltage Vda of the data signal DA, and thus the threshold voltage Vth of the driving transistor T2 may be compensated, thereby solving the problem of the threshold voltage drift of the driving transistor Td due to the process and long-term operation, and eliminating the influence thereof on the driving current ID, so as to improve the display effect.

For instance, K in the equation above may be expressed as:

$$K = 0.5nCox(W/L),$$

where n is an electron mobility of the driving transistor Td, Cox is a capacitance per unit of the gate of the driving transistor Td, W is a channel width of the driving transistor Td, and L is a channel length of the driving transistor Td.

Figure 6:
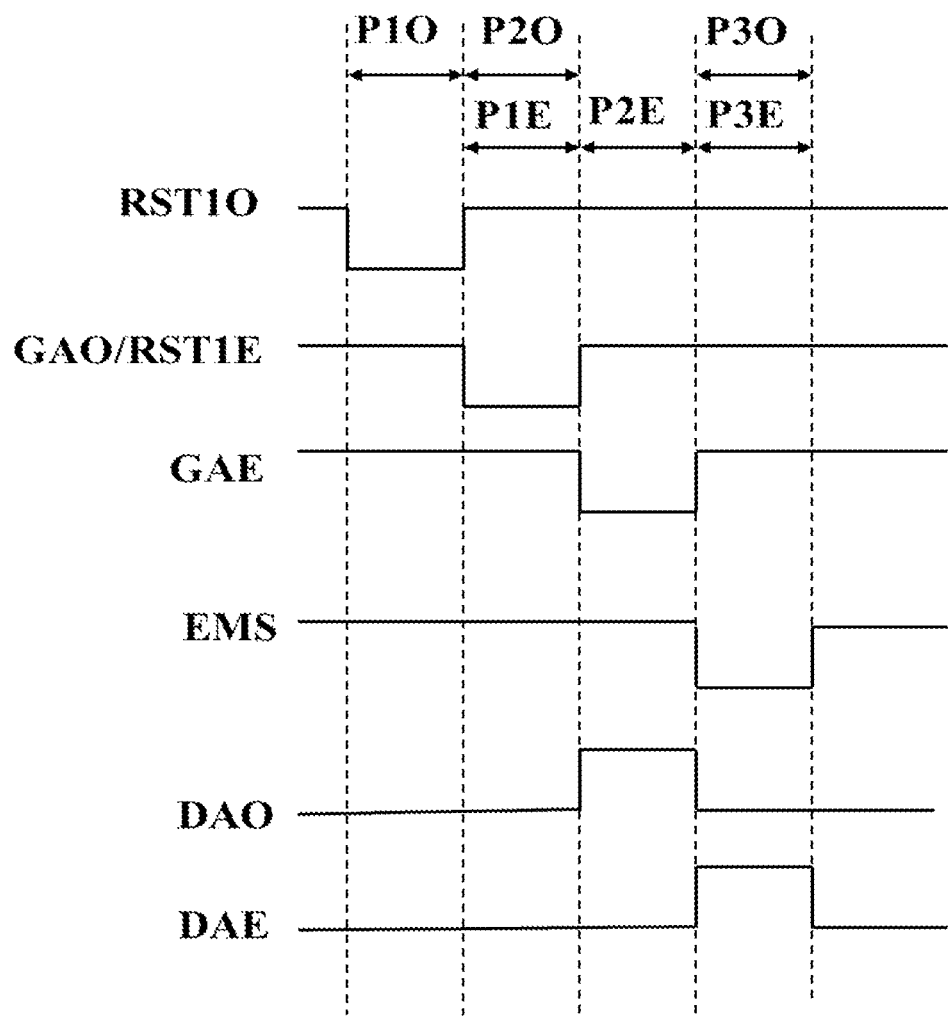
FIG. 6 shows a timing chart of signals for driving the array substrate in FIG. 2 according to an embodiment of the present disclosure.

FIG. 6 is a timing chart of signals for driving the array substrate in FIG. 2.

Referring to FIG. 6, the working process of the sub-pixels in the m-th row on the array substrate provided by the embodiments of the present disclosure will be described below.

As shown in FIG. 6, the working process of the sub-pixel in the (2n−1)-th column from the sub-pixels in the m-th row is divided into three phases, which are the first reset phase P1O, the first data writing and compensation phase P2O, and the first light-emitting phase P3O, and the working process of the sub-pixel in the 2n-th column from the sub-pixels in the m-th row is also divided into three phases, which are the second reset phase P1E, the second data writing and compensation phase P2E, and the third light-emitting phase P3E.

As shown in FIG. 6, in the first reset phase P1O, teh low-level driving reset control signal RST1O is provided to the sub-pixel in the (2n−1)-th column from the sub-pixels in the m-th row to reset the sub-pixel in the (2n−1)-th column from the sub-pixels in the m-th row.

In the embodiments of the present disclosure, the driving reset control signal RST1 may refer to the driving reset control signal served by the first scan signal GAO provided by the first scan signal line $SO_{m-1}$ of the (m−1)-th pair of scan signal lines $S_{m-1}$.

As shown in FIG. 6, in the first data writing and compensation phase P2O, the low-level scan signal GAO and the high-level data signal DAO are provided to the sub-pixel in the (2n−1)-th column from the sub-pixels in the m-th row, to perform data writing and compensation on the sub-pixel in the (2n−1)-th column from the sub-pixels in the m-th row.

For instance, the scan signal GAO refers to the first scan signal provided by the first scan signal line $SO_m$ of the m-th pair of scan signal lines $S_m$.

For instance, the data signal DAO refers to the data signal provided by one data line corresponding to the (2n−1)-th column of sub-pixels. For instance, when two adjacent columns of sub-pixels share one data line, the data signal DAO refers to the data signal provided by the n-th data signal line Dn.

As shown in FIG. 6, in the first light-emitting phase P3O, the low-level light-emitting control signal EMS is provided to the sub-pixel in the (2n−1)-th column from the sub-pixels in the m-th row, to display the sub-pixel in the (2n−1)-th column from the sub-pixels in the m-th row.

For instance, the light-emitting control signal EMS refers to the light-emitting control signal provided by the m-th light-emitting control signal line $E_m$.

As shown in FIG. 6, in the second reset phase P1E, the low-level driving reset control signal RST1E is provided to the sub-pixel in the 2n-th column from the sub-pixels in the m-th row, to reset the sub-pixel in the 2n-th column from the sub-pixels in the m-th row.

For instance, the driving reset control signal RST1E refers to the second scan signal provided by the second scan signal line $SE_m$ of the m-th pair of scan signal lines SE, that is, the scan signal GAE.

As shown in FIG. 6, in the second data writing and compensation phase P2E, the low-level scan signal GAE and the high-level data signal DAE are provided to the sub-pixel in the 2n-th column from the sub-pixels in the m-th row, to perform data writing and compensation on the sub-pixel in the 2n-th column from the sub-pixels in the m-th row.

For instance, the scan signal GAE refers to the second scan signal provided by the second scan signal line $SE_m$ of the m-th pair of scan signal lines $S_m$.

For instance, the data signal DAE refers to the data signal provided by one data line corresponding to the (n+1)-th column of sub-pixels. For instance, when two adjacent columns of sub-pixels share one data line, the data signal DAE refers to the data signal provided by the (n+1)-th data signal line Dn+1.

As shown in FIG. 6, in the second light-emitting phase P3E, the low-level light-emitting control signal EMS is provided to the sub-pixel in the 2n-th column from the sub-pixels in the m-th row, to display the sub-pixel in the 2n-th column from the sub-pixels in the m-th row.

For instance, the light-emitting control signal EMS refers to the light-emitting control signal provided by the m-th light-emitting control signal line $E_m$.

Referring to FIG. 6, for the sub-pixels in the m-th row, the scan signal GAO of the sub-pixel in the (2n−1)-th column may serve as the reset signal RST1E of the sub-pixel in the 2n-th column. In this case, while data writing and compensation is performed on the sub-pixel in the (2n−1)-th column, the sub-pixel in the 2n-th column of sub-pixels may be reset, that is, the first data writing and compensation phase P2O and the second reset phase P1E may be synchronized in time.

Referring to FIG. 6, for the m-th row of sub-pixels, the light-emitting control signal EMS of the sub-pixel in the (2n−1)-th column and the light-emitting control signal EMS of the sub-pixel in the 2n-th column are the same light-emitting control signal, that is, the first light-emitting phase P3O and the second light-emitting phase P3E may be synchronized in time.

In addition, referring to FIG. 6, it can be seen that for the m-th row of sub-pixels, the sub-pixel in the (2n−1)-th column is first reset, and then data writing and compensation is performed on the sub-pixel in the (2n−1)-th column and the sub-pixel in the 2n-th column is reset simultaneously, data writing and compensation is performed on the sub-pixel in the 2n-th column of sub-pixels, and finally the sub-pixel in the (2n−1)-th column and the sub-pixel in the 2n-th column are simultaneously displayed.

In this case, the time sequence of the first reset phase P1O, the first data writing and compensation phase P2O, the first light-emitting phase P3O, the second reset phase P1E, the second data writing and compensation phase P2E, and the third light-emitting phase P3E is: P1O→P2O & P1E→P2E→P3O & P3E. It can be seen that for the sub-pixels in the m-th row, the charging process of the sub-pixel in the (2n−1)-th column and the sub-pixel in the 2n-th column (i.e., the first data writing and compensation phase P2O and the second data writing and compensation phase P2E) are carried out separately and have the same charging time, and the light-emitting processes of the sub-pixel in the (2n−1)-th column and the sub-pixel in the 2n-th column (i.e., the first light-emitting phase P3O and the third light-emitting phase P3E) are synchronized in time and have the same light-emitting duration, which can make the sub-pixel in the (2n−1)-th column and the sub-pixel in the 2n-th column from the sub-pixels in the m-th row have even light-emitting brightness and improve the display quality.

It should be noted, although it is shown in FIG. 6 that the sub-pixel in the (2n−1)-th column and the sub-pixel in the 2n-th column from the sub-pixels in the m-th row receive different data signals (where the sub-pixel in the (2n−1)-th column receive the data signal DAO, and the sub-pixel in the 2n-th column receive the data signal DAE), the charging processes of the sub-pixel in the (2n−2)-th column and the sub-pixel in the 2n-th column from the sub-pixels in the m-th row (i.e., the first data writing and compensation phase P2O and the second data writing and compensation phase P2E) are performed separately, a technical solution that the sub-pixel in the (2n−1)-th column and the sub-pixel in the 2n-th column share the same data line can be realized. Specifically, this data signal remains the high-level during both the first data writing and compensation phase P2O and the second data writing and compensation phase P2E. Since in the first data writing and compensation phase P2O, the sub-pixel in the (2n−1)-th column is in a working state while the sub-pixel in the 2n-th column is in a non-working state (where the scan signal GAO is at the low level and the scan signal GAE is at the high level), and in the second data writing and compensation phase P2E, the sub-pixel in the (2n−1)-th column is in the non-working state while the sub-pixel in the 2n-th column is in the working state (where the scan signal GAO is at the high level while the scan signal GAE is at the low level), via the same data line, the high-level data signal may be provided to the sub-pixel in the (2n−1)-th column in the first data writing and compensation phase P2O, and the high-level data signal may be provided to the sub-pixel in the 2n-th column in the second data writing and compensation phase P2E. It should be noted, although the working process of the sub-pixels in the m-th row on the array substrate provided by the embodiments of the present disclosure is described only with reference to FIG. 6, the working process of the sub-pixels in the another rows (e.g. the sub-pixels in the (m−1)-th row) on the array substrate provided by the embodiments of the present disclosure is similar to the working process of the sub-pixels in the m-th row, so it may refer to the description of the working process of the sub-pixels in the m-th row in conjunction with FIG. 6, which will be omitted.

FIGS. 7-13 show plan schematic diagrams of respective layers in the array substrate according to embodiments of the present disclosure. The examples shown in FIGS. 7-13 take a pixel circuit including four sub-pixels as an example. In the embodiment of the present disclosure, the sub-pixel in the (2n−1)-th column and the sub-pixel in the 2n-th column from the sub-pixels in the m-th row may be regarded as a smallest repeating unit. In FIGS. 7-13, the positions of respective transistors of the pixel circuits from the sub-pixel in the (2n−1)-th column and the sub-pixel in the 2n-th column from the sub-pixels in the m-th row are illustrated. It should be understood that the positions of the transistors of the pixel circuits from other sub-pixels are substantially the same as those of the sub-pixel in the (2n−1)-th column and the sub-pixel in the 2n-th column from the sub-pixels in the m-th row.

The positional relationship of respective circuits in the pixel circuit on the substrate will be described below with reference to FIGS. 7-13.

It should be noted that the following content is described with respect to the sub-pixels in the m-th row, and further described with respect to the sub-pixel in the (2n−1)-th column and the sub-pixel in the 2n-th column from the sub-pixels in the m-th row which is regarded as the smallest repeating unit. It should be noted that in the following plan layout diagrams, plan layouts of respective layers are enlarged to show respective parts of respective layers more clearly. Those skilled in the art will understand that the scale in FIGS. 7-13 is a drawing scale, so as to more clearly show positions of respective parts, which cannot be regarded as the true scale of the components. Those skilled in the art can select sizes of respective components based on actual requirements, which is not specifically limited in the present disclosure.

In an embodiment of the present disclosure, the array substrate includes an active semiconductor layer on the substrate.

Figure 7:
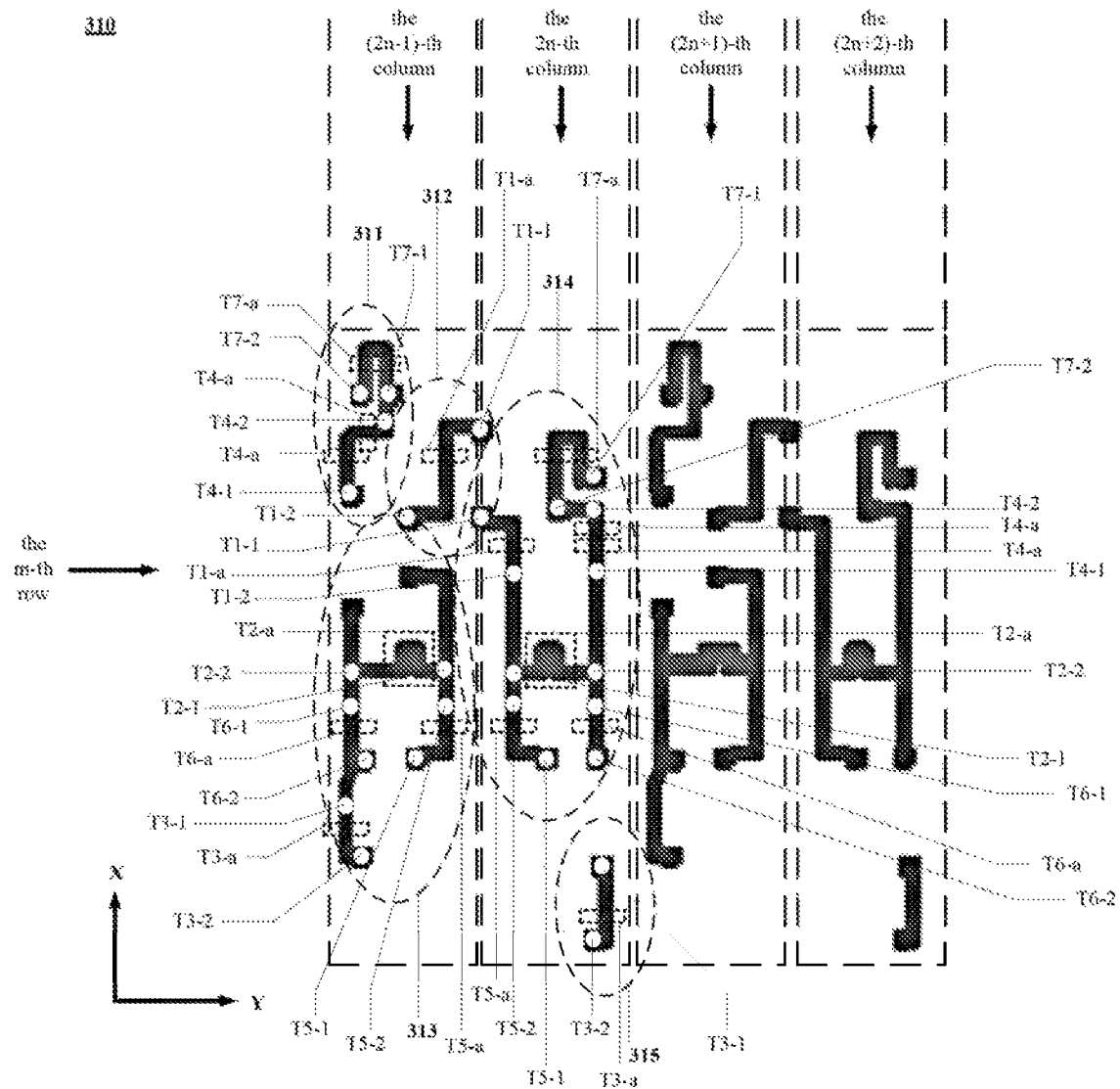
FIGS. 7-13 show plan schematic diagrams of respective layers in the array substrate according to embodiments of the present disclosure.

FIG. 7 shows a plan schematic diagram of an active semiconductor layer 310 in the array substrate according to an embodiment of the present disclosure. The active semiconductor layer includes active regions of the transistors in the pixel circuit. In an exemplary embodiment of the present disclosure, the active semiconductor layer 310 may be used to fabricate the active regions of the driving transistor, the data writing transistor, the compensation transistor, the first light-emitting control transistor, the second light-emitting control transistor, the driving reset transistor and the light-emitting reset transistor. In an exemplary embodiment of the present disclosure, the active semiconductor layer 310 includes an active layer pattern and a doped region pattern of each transistor (i.e., a first source/drain region and a second source/drain region of the transistor). In the embodiment of the present disclosure, the active layer pattern and the doped region pattern of each transistor are an integral structure.

It should be noted that, in FIG. 7, white circles are shown to more clearly indicate the regions of the active semiconductor layer 310 which are used as the source/drain regions of respective transistors.

As shown in FIG. 7, the active semiconductor layer 310 of the sub-pixel in the (2n−1)-th column includes a first part 311, a second part 312, and a third part 313 that are spaced apart from each other. The first part 311 and the second part 312 are arranged sequentially in the row direction Y. A combination of the first part 311 with the second part 312 and the third part 313 are arranged sequentially in the column direction X. The first part 311 includes the active region T7-*a* of the driving reset transistor T7 and the active region T4-*a* of the compensation transistor T4 in the sub-pixel in the (2n–1)-th column. The second part 312 includes the active region T1-*a* of the data writing transistor T1 in the sub-pixel in the (2n–1)-th column. The third part 313 includes the active region T2-*a* of the driving transistor T2, the active region T5-*a* of the first light-emitting control transistor T5, the active region T6-*a* of the second light-emitting control transistor T5, and the active region T3-*a* of the light-emitting reset transistor T3 in the sub-pixel in the (2n–1)-th column.

As shown in FIG. 7, the active semiconductor layer of the sub-pixel in the 2n-th column includes a fourth part 314 and a fifth part 315 that are sequentially arranged in the column direction X. The fourth part 314 includes the active region T7-*a* of the driving reset transistor T7, the active region T1-*a* of the data writing transistor T1, the active region T4-*a* of the compensation transistor T4, the active region T2-*a* of the driving transistor T2, the active region T5-*a* of the first light-emitting control transistor T5, and the active region T6-*a* of the second light-emitting control transistor T6 in the sub-pixel in the 2n-th column. The fifth part 315 includes the active region T3-*a* of the light-emitting reset transistor T3 in the sub-pixel in the 2n-th column.

In an exemplary embodiment of the present disclosure, the active semiconductor layer for respective transistors may include an integrally formed low-temperature polysilicon layer. The source region and the drain region of each transistor can become conductive by doping or the like to realize electrical connection of each structure. In other words, the active semiconductor layer of respective transistors of each sub-pixel is an overall pattern formed by p-silicon, and each of the transistors in the same pixel circuit includes a doped region pattern (i.e., a source region and a drain region) and an active layer pattern. The active layers of different transistors are separated by doped structures.

As an example, the active semiconductor layer 310 may be formed of amorphous silicon, polysilicon, an oxide semiconductor material, or the like. As another example, the aforementioned source region and drain region may be regions doped with n-type impurities or p-type impurities.

In an embodiment of the present disclosure, the array substrate further includes a first conductive layer located on a side of the active semiconductor layer away from the substrate.

Figure 8:
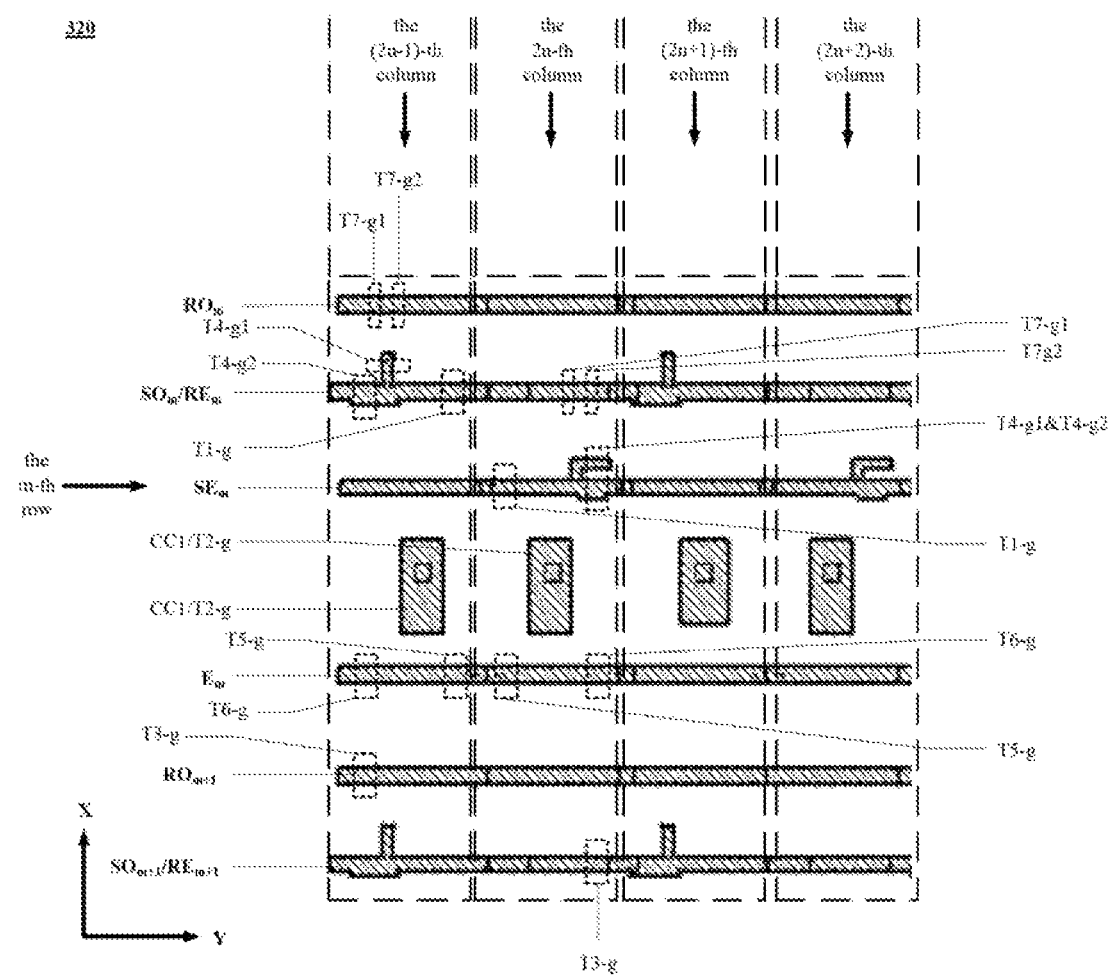

FIG. 8 shows a plan schematic diagram of a first conductive layer 320 in the array substrate according to an embodiment of the present disclosure. As shown in FIG. 8, the first conductive layer 320 includes the first driving reset control signal line $RO_m$, the first scan signal line $SO_m$, the second scan signal line $SE_m$, the first electrode CC1 of the capacitor C, the light-emitting control signal line $E_m$, the first light-emitting reset control signal line $RO_{m+1}$, and the second light-emitting reset control signal line $SO_{m+1}/RE_{m+1}$. In an exemplary embodiment of the present disclosure, the first scan signal line $SO_m$ is used as the second driving reset control signal line $RE_m$. The first electrode CC1 of the capacitor C and the gate T2-*g* of the driving transistor are an integral structure.

In the embodiments of the present disclosure, referring to FIGS. 7 and 8, parts of the first driving reset control signal line $RO_m$, orthographic projections of which on the substrate overlap with an orthographic projection of the first part 311 of the active semiconductor layer 310 on the substrate, are the gates T7-*g*1, T7-*g*2 of the driving reset transistor T7 in the sub-pixel in the (2n–1)-th column. Parts of the first scan signal line $SO_m$, orthographic projections of which on the substrate overlap with the orthographic projections of the first part 311, the second part 312, and the fourth part 314 of the active semiconductor layer 310 on the substrate, are respectively the gates T4-*g*1, T4-*g*2 of the compensation transistor T4 and the gate T1-*g* of the data writing transistor T1 in the sub-pixel in the (2n–1)-th column as well as the gates T7-*g*1, T7-*g*2 of the driving reset transistor T7 in the sub-pixel in the 2n-th column. Parts of the second scan signal line $SE_m$, orthographic projections of which on the substrate overlap with an orthographic projection of the fourth part 314 of the active semiconductor layer 310 on the substrate, are respectively the gate T1-*g* of the data writing transistor T1 and the gates T4-*g*1, T4-*g*2 of the compensation transistor T4 in the sub-pixel in the 2n-th column. A part of the first electrode CC1 of the capacitor C in the sub-pixel in the (2n–1)-th column, an orthographic projection of which on the substrate overlaps with an orthographic projection of the third part 313 of the active semiconductor layer 310 on the substrate, is the gate T2-*g* of the driving transistor T2 in the sub-pixel in the (2n–1)-th column. A part of the first electrode CC1 of the capacitor C in the sub-pixel in the 2n-th column, an orthographic projection of which on the substrate overlaps with an orthographic projection of the fourth part 314 of the active semiconductor layer 310 on the substrate, is the gate T2-*g* of the driving transistors T2 in the sub-pixel in the 2n-th column. Parts of the light-emitting control signal line $E_m$, orthographic projections of which on the substrate overlap with orthographic projections of the third part 313 and the fourth part 314 of the active semiconductor layer 310 on the substrate, are respectively the gate T5-*g* of the first light-emitting control transistor T5 and the gate T6-*g* of the second light-emitting control transistor T6 in the sub-pixel in the (2n–1)-th column, as well as the gate T5-*g* of the first light-emitting control transistor T5 and the gate T6-*g* of the second light-emitting control transistor T6 in the sub-pixel in the 2n-th column. A part of the first light-emitting reset control signal line $RO_{m+1}$, an orthographic projection of which on the substrate overlaps with an orthographic projection of the third part 313 of the active semiconductor layer 310 on the substrate, is the gate T3-*g* of the light-emitting reset transistor T3 in the sub-pixel in the (2n–1)-th column. A part of the second light-emitting reset control signal line $SO_{m+1}/RE_{m+1}$, an orthographic projection of which on the substrate overlaps with an orthographic projection of the fifth part 315 of the active semiconductor layer 310 on the substrate, is the gate T3-*g* of the light-emitting reset transistor T3 in the sub-pixel in the 2n-th column.

In the embodiment of the present disclosure, as shown in FIG. 8, in the row direction Y, with respect to the sub-pixel in the (2n–1)-th column and the sub-pixel in the 2n-th column from the sub-pixels in the m-th row, the gates T7-*g*1, T7-*g*2 of the driving reset transistor T7, the gates T4-*g*1, T4-*g*2 of the compensation transistor T4, and the gate T1-*g* of the data writing transistor T1 are located on a first side of the gate T2-*g* of the driving transistor T2. The gate T5-*g* of the first light-emitting control transistor T5, the gate T6-*g* of the second light-emitting control transistor T6, and the gate T3-*g* of the light-emitting reset transistor T3 are located on a second side of the gate T2-*g* of the driving transistor T2.

It should be noted that the first side and the second side of the gate T2-*g* of the driving transistor T2 are opposite sides of the gate T2-g of the driving transistor T2 in the row direction Y. For instance, as shown in FIG. 8, in the XY plane, the first side of the gate T2-g of the driving transistor T2 may be the upper side of the gate T2-g of the driving transistor T2. The second side of the gate T2-g of the driving transistor T2 may be the lower side of the gate T2-g of the driving transistor T2. In the description of the present disclosure, the lower side is, for instance, the side of the array substrate for bonding ICs. For instance, the lower side of the gate T2-g of the driving transistor T2 is the side of the gate T2-g of the driving transistor T2 close to the IC (which is not shown in the drawing). The upper side is the opposite side of the lower side, for instance, the side of the gate T2-g of the driving transistor T2 away from the IC.

More specifically, the gates T7-g1, T7-g2 of the driving reset transistor T7 are located on the upper side of the gates T4-g1, T4-g2 of the compensation transistor T4 and the gate T1-g of the data writing transistor T1. The gate T3-g of the light-emitting reset transistor T3 is located on the lower side of the gate T5-g of the first light-emitting control transistor T5 and the gate T6-g of the second light-emitting control transistor T6.

In the embodiment of the present disclosure, in the column direction X, with respect to the sub-pixel in the (2n−1)-th column from the sub-pixels in the m-th row, as shown in FIG. 8, the gates T7-g1, T7-g2 of the driving reset transistor T7, the gates T4-g1, T4-g2 of the compensation transistor T4, the gate T6-g of the second light-emitting control transistor T6 and the gate T3-g of the light-emitting reset transistor T3 are located on a third side of the gate T2-g of the driving transistor T2. The gate T1-g of the data writing transistor T1 and the gate T5-g of the first light-emitting control transistor T5 are located on a fourth side of the gate T2-g of the driving transistor T2.

It should be noted that the third side and the fourth side of the gate T2-g of the driving transistor T2 are opposite sides of the gate T2-g of the driving transistor T2 in the column direction X. For instance, as shown in FIG. 8, in the XY plane, the third side of the gate T2-g of the driving transistor T2 may be the left side of the gate T2-g of the driving transistor T2. The fourth side of the gate T2-g of the driving transistor T2 may be the right side of the gate T2-g of the driving transistor T2.

More specifically, the gates T4-g1, T4-g2 of the compensation transistor T4 are located on the left side of the gate T1-g of the data writing transistor T1. The gate T5-g of the first light-emitting control transistor T5 is located on the right side of the gate T6-g of the second light-emitting control transistor T6.

In the embodiment of the present disclosure, in the column direction X, with respect to the sub-pixel in the 2n-th column from the sub-pixels in the m-th row, as shown in FIG. 8, the gate T1-g of the data writing transistor T1 and the gate T5-g of the first light-emitting control transistor T5 are located on a third side of the gate T2-g of the driving transistor T2. The gates T7-g1, T7-g2 of the driving reset transistor T7, the gates T4-g1, T4-g2 of the compensation transistor T4, the gate T6-g of the second light-emitting control transistor T6 and the gate T3-g of the light-emitting reset transistor T3 are located on a fourth side of the gate T2-g of the driving transistor T2.

Similarly, the third side and the fourth side of the gate T2-g of the driving transistor T2 are opposite sides of the gate T2-g of the driving transistor T2 in the column direction X. For instance, as shown in FIG. 8, in the XY plane, the third side of the gate T2-g of the driving transistor T2 may be the left side of the gate T2-g of the driving transistor T2, and the fourth side of the gate T2-g of the driving transistor T2 may be the right side of the gate T2-g of the driving transistor T2.

More specifically, the gates T4-g1, T4-g2 of the compensation transistor T4 are located on the right side of the gate T1-g of the data writing transistor T1. The gate T5-g of the first light-emitting control transistor T5 is located on the left side of the gate T6-g of the second light-emitting control transistor T6.

It should be noted that in the drawing, the gates of the driving reset transistor T7 and the compensation transistor T4 in the sub-pixel in the (2n−1)-th column are of a double-gate structure; and the gates of the driving reset transistor T7 and the compensation transistor T4 in the sub-pixel in the 2n-th column are double-gate electrodes. Although what is shown in the drawing is a double-gate electrode structure, the present disclosure is not limited thereto. The transistors of the present disclosure may also adopt a single-gate structure, and those skilled in the art may make a selection according to actual needs.

It should be noted that the active region of each of the transistors as shown in FIG. 8 corresponds to the region of the first conductive layer 320 which overlaps with the active semiconductor layer 310.

In an embodiment of the present disclosure, the array substrate further includes a second conductive layer located on a side of the first conductive layer away from the substrate.

Figure 9:
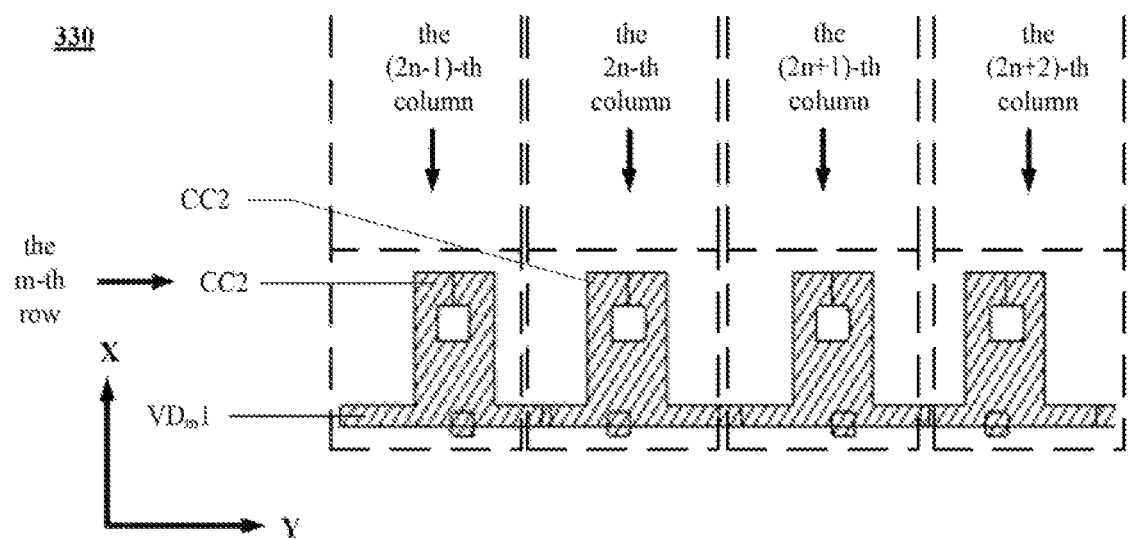

FIG. 9 shows a plan schematic diagram of a second conductive layer 330 in the array substrate according to an embodiment of the present disclosure. As shown in FIG. 9, the second conductive layer 330 includes the second electrode CC2 of the capacitor and the first voltage source signal line $VD_m1$ as a first voltage source arranged in the column direction X.

In the embodiments of the present disclosure, referring to FIGS. 8 and 9, an orthographic projection of the second electrode CC2 of the capacitor C on the substrate at least partially overlap with an orthographic projection of the first electrode CC1 of the capacitor C on the substrate.

In an exemplary embodiment of the present disclosure, as shown in FIG. 9, the first voltage source signal line $VD_m1$ extends in the row direction Y and is integrally formed with the second electrode CC2 of the capacitor C.

In an embodiment of the present disclosure, the array substrate further includes a third conductive layer located on a side of the second conductive layer away from the substrate.

Figure 10:
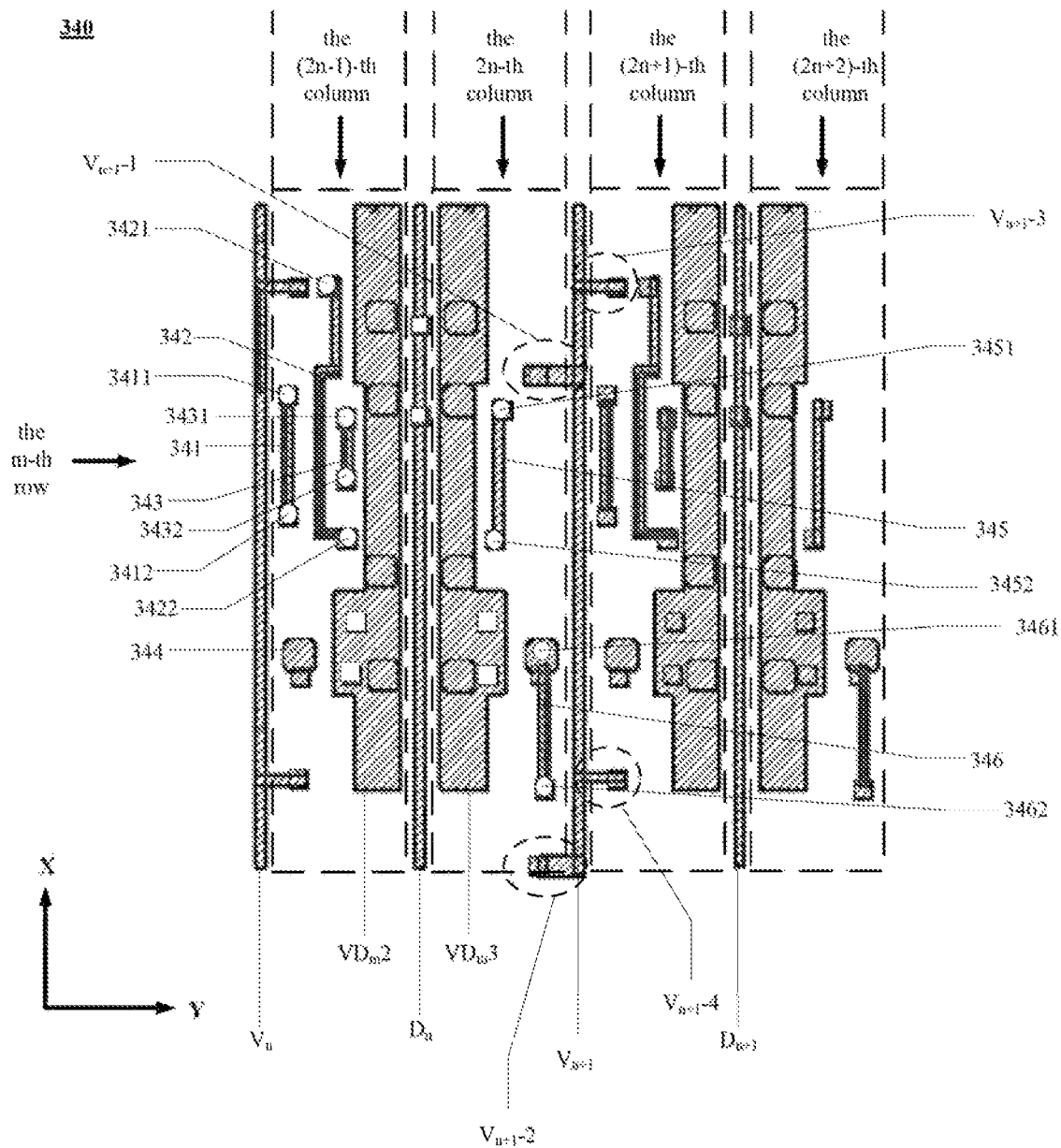

FIG. 10 shows a plan schematic diagram of a third conductive layer 340 in the array substrate according to an embodiment of the present disclosure. As shown in FIG. 10, the third conductive layer 340 includes the data signal lines $D_n$ and $D_{n+1}$, the reset voltage source signal lines $V_n$, $V_{n+1}$, the second voltage source signal line $VD_m2$ as the first voltage source, the third voltage source signal line $VD_m3$ as the first voltage source, a first connecting portion 341, a second connecting portion 342, a third connecting portion 343, a fourth connecting portion 344, a fifth connecting portion 345, and a sixth connecting portion 346.

In the embodiment of the present disclosure, the first connecting portion 341, the second connecting portion 342, and the third connecting portion 343 are sequentially arranged in the row direction Y. The fourth connecting portion 344 is arranged on the lower side of the first connecting portion 341, the second connecting portion 342, and the third connecting portion 343 in the column direction X. In the embodiment of the present disclosure, the fifth connecting portion 345 and the sixth connecting portion 346 are sequentially arranged in the column direction X. The sixth connecting portion 346 is located on the lower side of the fifth connecting portion 345.

It should be noted that, in FIG. 10, white circles are shown so as to more clearly indicate the regions at both ends of respective connecting portions in the third conductive layer.

It should be noted that in the embodiment of the present disclosure, an insulating layer or a dielectric layer may be disposed between the active semiconductor layer 310 and the first conductive layer 320, between the first conductive layer 320 and the second conductive layer 330, and between the second conductive layer 330 and the third conductive layer 340 (which will be described in detail later with respect to the cross-sectional diagram).

It should be noted that the vias (not shown) described below are those that simultaneously penetrate through the respective insulating layers or dielectric layers located between the active semiconductor layer 310 and the first conductive layer 320, between the first conductive layer 320 and the second conductive layer 330, and between the second conductive layer 330 and the third conductive layer 340.

Referring to FIG. 7 and FIG. 10, one end 3411 of the first connecting portion 341 is coupled to the first electrode T4-1 of the compensation transistor T4 in the sub-pixel in the (2n−1)-th column through the via (for instance, the first electrode corresponds to the first source/drain region of the transistor, and the same for the following description). The other end 3412 of the first connecting portion 341 is coupled to the second electrode T4-2 of the driving transistor T2 in the sub-pixel in the (2n−1)-th column through the via (for instance, the second electrode corresponds to the second source/drain region of the transistor, and the same for the following description).

One end 3421 of the second connecting portion 342 is coupled to the first electrode T7-1 of the driving reset transistor T7 and the second electrode T4-2 of the compensation transistor T4 in the sub-pixel in the (2n−1)-th column through the vias. The other end 3422 of the second connecting portion 342 is coupled to the gate T2-g of the driving transistor T2 and the first electrode CC1 of the capacitor C in the sub-pixel in the (2n−1)-th column through the via.

One end 3431 of the third connecting portion 343 is coupled to the second electrode T1-2 of the data writing transistor T1 in the sub-pixel in the (2n−1)-th column through the via. The other end 3432 of the third connecting portion 343 is coupled to the first electrode T2-1 of the driving transistor T2 in the sub-pixel in the (2n−1)-th column through the via.

The fourth connecting portion 344 is coupled to the second electrode T6-2 of the second light-emitting control transistor T6 and the first electrode T3-1 of the light-emitting reset transistor T3 in the sub-pixel in the (2n−1)-th column through the vias.

One end 3451 of the fifth connecting portion 345 is coupled to the first electrode T7-1 of the driving reset transistor T7 and the second electrode T4-2 of the compensation transistor T4 in the sub-pixel in the 2n-th column through the vias. The other end 3452 of the fifth connecting portion 345 is coupled to the gate T2-g of the driving transistor T2 and the first electrode CC1 of the capacitor C in the sub-pixel in the 2n-th column through the vias.

One end 3461 of the sixth connecting portion 346 is coupled to the second electrode T6-2 of the second light-emitting control transistor T6 in the sub-pixel in the 2n-th column through the via. The other end 3462 of the sixth connecting portion 346 is coupled to the first electrode T3-1 of the light-emitting reset transistor T3 in the sub-pixel in the 2n-th column through the via.

In the embodiment of the present disclosure, as shown in FIG. 10, the data signal line $D_n$ is coupled to the first electrode T1-1 of the data writing transistor T1 in the sub-pixel in the (2n−1)-th column and the first electrode T1-1 of the data writing transistor T1 in the sub-pixel in the 2n-th column through the vias. It should be noted that, in FIG. 10, the white square block marked on the data signal line Dn indicates the regions corresponding to the vias.

In the embodiment of the present disclosure, as shown in FIG. 10, the reset voltage source signal line $V_{n+1}$ has a first protrusion $V_{n+1}$-1, a second protrusion $V_{n+1}$-2, a third protrusion $V_{n+1}$-3 and a fourth protrusion $V_{n+1}$-4. The first protrusion $V_{n+1}$-1 and the second protrusion $V_{n+1}$-2 extend from the reset voltage source signal line $V_{n+1}$ toward the sub-pixel in the 2n-th column. The third protrusion $V_{n+1}$-3 and the fourth protrusion $V_{n+1}$-4 extend from the reset voltage source signal line $V_{n+1}$ toward the sub-pixel in the (2n+1)-th column. The first protrusion $V_{n+1}$-1 is located on the upper side of the fifth connecting portion 345. The second protrusion $V_{n+1}$-2 is located on the lower side of the sixth connecting portion 346. The third protrusion $V_{n+1}$-3 is located on the upper side of the first connecting portion 341 and on the left side of one end 3421 of the second connecting portion 342. The fourth protrusion $V_{n+1}$-4 is located on the lower side of the fourth connecting portion. It should be noted that the description with respect to the sub-pixel in the (2n+1)-th column may also be applied to the description with respect to the sub-pixel in the (2n−1)-th column.

In the embodiment of the present disclosure, referring to FIG. 7 and FIG. 10, the first protrusion $V_{n+1}$-1 is coupled to the first electrode T7-1 of the driving reset transistor T7 in the sub-pixel in the 2n-th column through the via. The second protrusion $V_{n+1}$-2 is coupled to the second electrode T3-2 of the light-emitting reset transistor T3 in the sub-pixel in the 2n-th column through the via. The third protrusion $V_{n+1}$-3 is coupled to the second electrode T7-2 of the driving reset transistor T7 in the sub-pixel in the (2n+1)-th column through the via. The fourth protrusion $V_{n+1}$-4 is coupled to the second electrode T3-2 of the light-emitting reset transistor T3 in the sub-pixel in the (2n+1)-th column through the via.

In the embodiment of the present disclosure, as shown in FIG. 10, the second voltage source signal line $VD_m2$ extends in the column direction X and is located in the sub-pixel in the (2n−1)-th column. The second voltage source signal line $VD_m2$ is located between the data line $D_n$ and the first connecting portion 341, the second connecting portion 342, the third connecting portion 343, and the fourth connecting portion 344.

Referring to FIG. 7, FIG. 9 and FIG. 10, the second voltage source signal line $VD_m2$ is coupled to the second electrode CC2 of the capacitor C and the first electrode T5-1 of the first light-emitting control transistor T5 in the sub-pixel in the (2n−1)-th column through the vias. In FIG. 10, the white square block marked on the second voltage source signal line $VD_m2$ indicates the regions corresponding to the vias.

In the embodiment of the present disclosure, as shown in FIG. 10, the third voltage source signal line $VD_m3$ extends in the column direction X and is located in the sub-pixel in the 2n-th column. The third voltage source signal line $VD_m3$ is located between the reset voltage source signal line $V_{n+1}$ and the fifth connecting portions 345 and the sixth connecting portion 346.

Referring to FIG. 7, FIG. 9 and FIG. 10, the third voltage source signal line $VD_m3$ is coupled to the second electrode CC2 of the capacitor C and the first electrode T5-1 of the first light-emitting control transistor T5 in the sub-pixel in the 2n-th column through the vias. In FIG. 10, the white square block marked on the third voltage source signal line $VD_m3$ indicates the regions corresponding to the vias.

Figure 11:
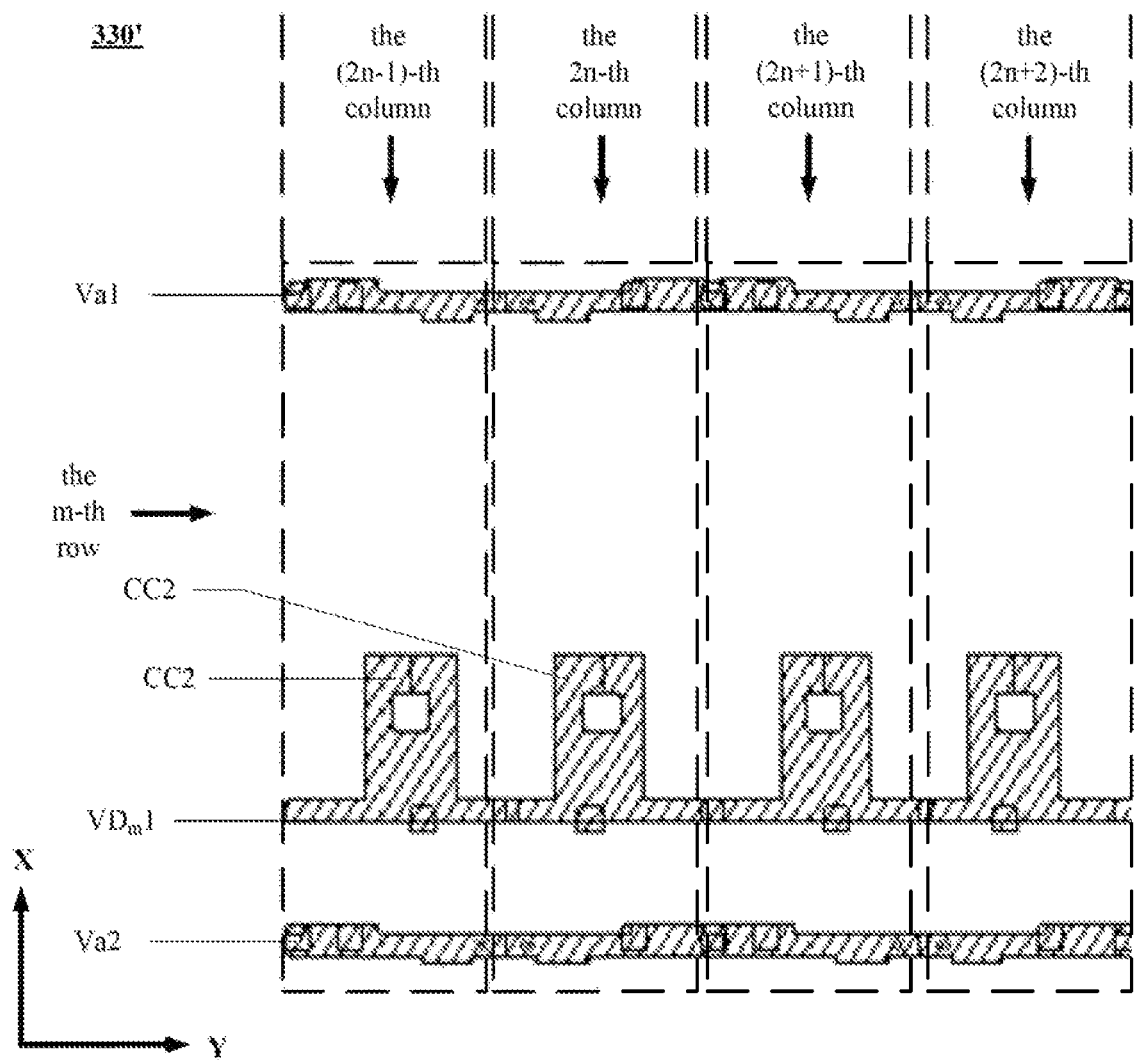

In an alternative embodiment of the present disclosure, based on the structure of FIG. 9, as shown in FIG. 11, the second conductive layer 330' further includes the first additional reset voltage source signal line Va1 and the second additional reset voltage source signal line Va2 extending in the row direction Y.

In the embodiment of the present disclosure, as shown in FIG. 11, the second electrode CC2 of the capacitor C and the first voltage source signal line $VD_m1$ are located between the first additional reset voltage source signal line Va1 and the second additional reset voltage source signal line Va2 in the column direction X. The first additional reset voltage source signal line Va1 is located on the upper side of the second electrode CC2 of the capacitor C. The second additional reset voltage source signal line Va2 is located on the lower side of the second electrode CC2 of the capacitor C.

It should be noted that the description about the second electrode CC2 of the capacitor C and the first voltage source signal line $VD_m1$ is similar to the above description about FIG. 9, which will not be repeated here.

Based on the above-mentioned embodiment shown in FIG. 11, the array substrate further includes a third conductive layer located on a side of the second conductive layer away from the substrate.

Figure 12:
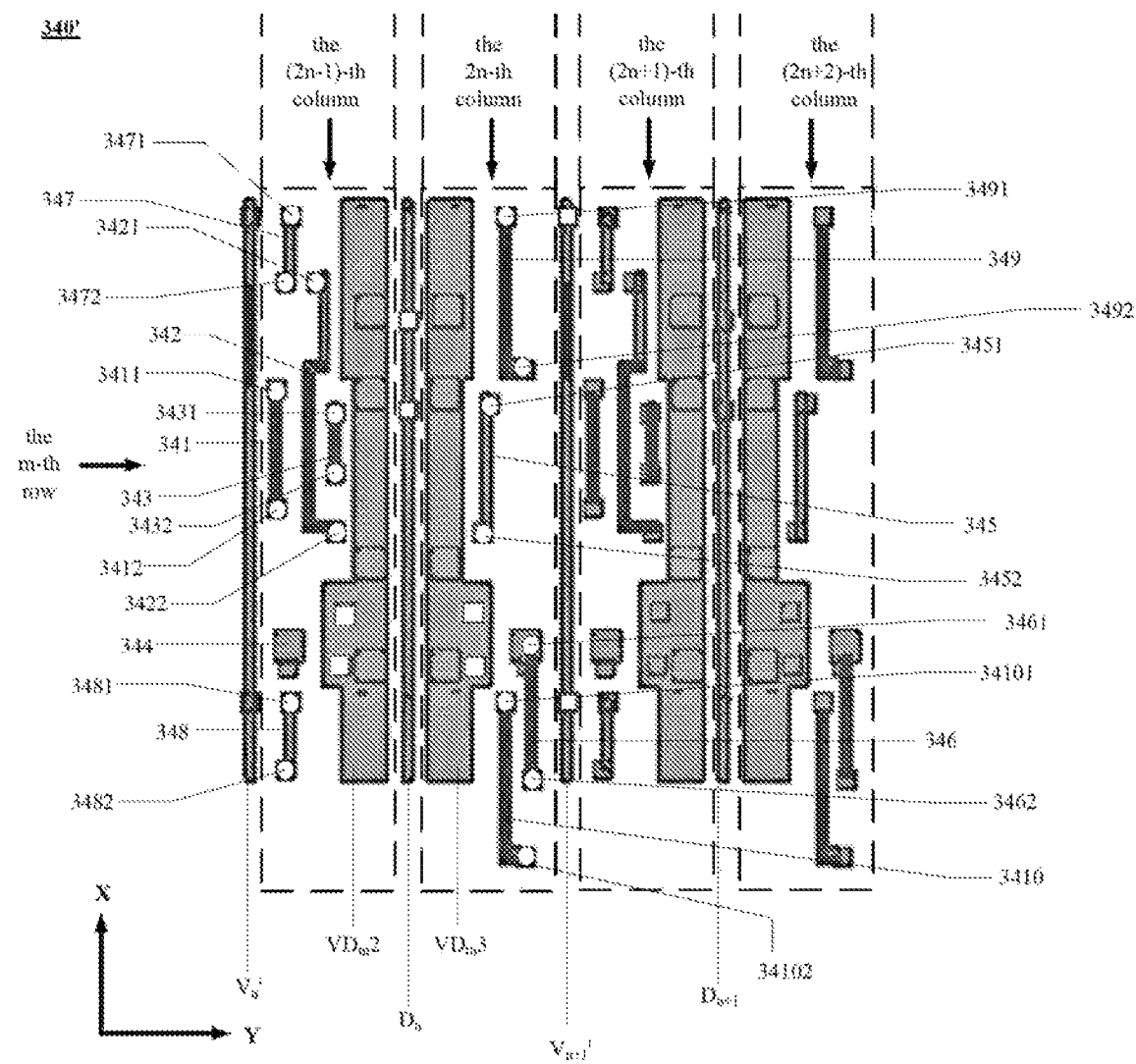

FIG. 12 shows a plan schematic diagram of a third conductive layer 340' in the array substrate according to an embodiment of the present disclosure. As shown in FIG. 12, the third conductive layer 340' includes the data signal lines $D_n$, $D_{n+1}$, the reset voltage source signal lines $V_n'$, $V_{n+1}'$, the second voltage source signal line $VD_m2$ as the first voltage source, the third voltage source signal line $VD_m3$ as the first voltage source, the first connecting portion 341, the second connecting portion 342, the third connecting portion 343, the fourth connecting portion 344, the fifth connecting portion 345, the sixth connecting portion 346, a seventh connecting portion 347, an eighth connecting portion 348, a ninth connecting portion 349, and a tenth connecting portion 3410.

It should be noted that the description about the data signal lines $D_n$, $D_{n+1}$, the second voltage source signal line $VD_m2$, the third voltage source signal line $VD_m3$, the first connecting portion 341, the second connecting portion 342, the third connecting portion 343, the fourth connecting portion 344, the fifth connecting portion 345, and the sixth connecting portion 346 are similar to the above description of FIG. 10, which will not be repeated here.

In the embodiment of the present disclosure, the seventh connecting portion 347 is located on the upper side of the first connecting portion 341, the second connecting portion 342 and the third connecting portion 343. The eighth connecting portion 348 is located on the lower side of the fourth connecting portion 344. The ninth connecting portion 349 is located on the upper side of the fifth connecting portion 345. The tenth connecting portion 3410 is located on the left side of the sixth connecting portion 346.

It should be noted that, in FIG. 12, white circles are shown to more clearly indicate the regions at both ends of respective connecting portions in the third conductive layer.

It should be noted that in the embodiments of the present disclosure, an insulating layer or a dielectric layer may be arranged between the active semiconductor layer 310 and the first conductive layer 320, between the first conductive layer 320 and the second conductive layer 330', and between the second conductive layer 330' and the third conductive layer 340' (which will be described in detail later with respect to the cross-sectional diagram).

It should be noted that the vias (not shown) described below are those that simultaneously penetrate through the respective insulating layers or dielectric layers located between the active semiconductor layer 310 and the first conductive layer 320, between the first conductive layer 320 and the second conductive layer 330', and between the second conductive layer 330' and the third conductive layer 340'.

Referring to FIGS. 7 and 12, one end 3471 of the seventh connecting portion 347 is coupled to the first additional reset voltage source signal line Va1 through the via. The other end 3472 of the seventh connecting portion 347 is coupled to the second electrode T7-2 of the driving reset transistor T7 in the sub-pixel in the (2n−1)-th column through the via.

One end 3481 of the eighth connecting portion 348 is coupled to the second additional reset voltage source signal line Va2 through the via. The other end 3481 of the eighth connecting portion 348 is coupled to the second electrode T3-2 of the light-emitting reset transistor T3 in the sub-pixel in the (2n−1)-th column through the via.

One end 3491 of the ninth connecting portion 349 is coupled to the first additional reset voltage source signal line Va1 through the via. The other end 3492 of the ninth connecting portion 349 is coupled to the second electrode T7-2 of the driving reset transistor T7 in the sub-pixel in the 2n-th column through the via.

One end 34101 of the tenth connecting portion 3410 is coupled to the second additional reset voltage source signal line Va2 through the via. The other end 34102 of the tenth connecting portion 3410 is coupled to the second electrode T3-2 of the light-emitting reset transistor T3 in the sub-pixel in the 2n-th column through the via.

In an embodiment of the present disclosure, referring to FIG. 11 and FIG. 12, the reset voltage source signal line $V_{n+1}'$ is coupled to the first additional reset voltage source signal line Va1 and the second additional reset voltage source signal line Va2 through the vias. In FIG. 12, the white square block marked on the reset voltage source signal line Vn+1' indicates the region corresponding to the vias.

On the basis of FIG. 10 or FIG. 12, in the embodiment of the present disclosure, the array substrate further includes a fourth conductive layer located on a side of the third conductive layer away from the substrate.

Figure 13:
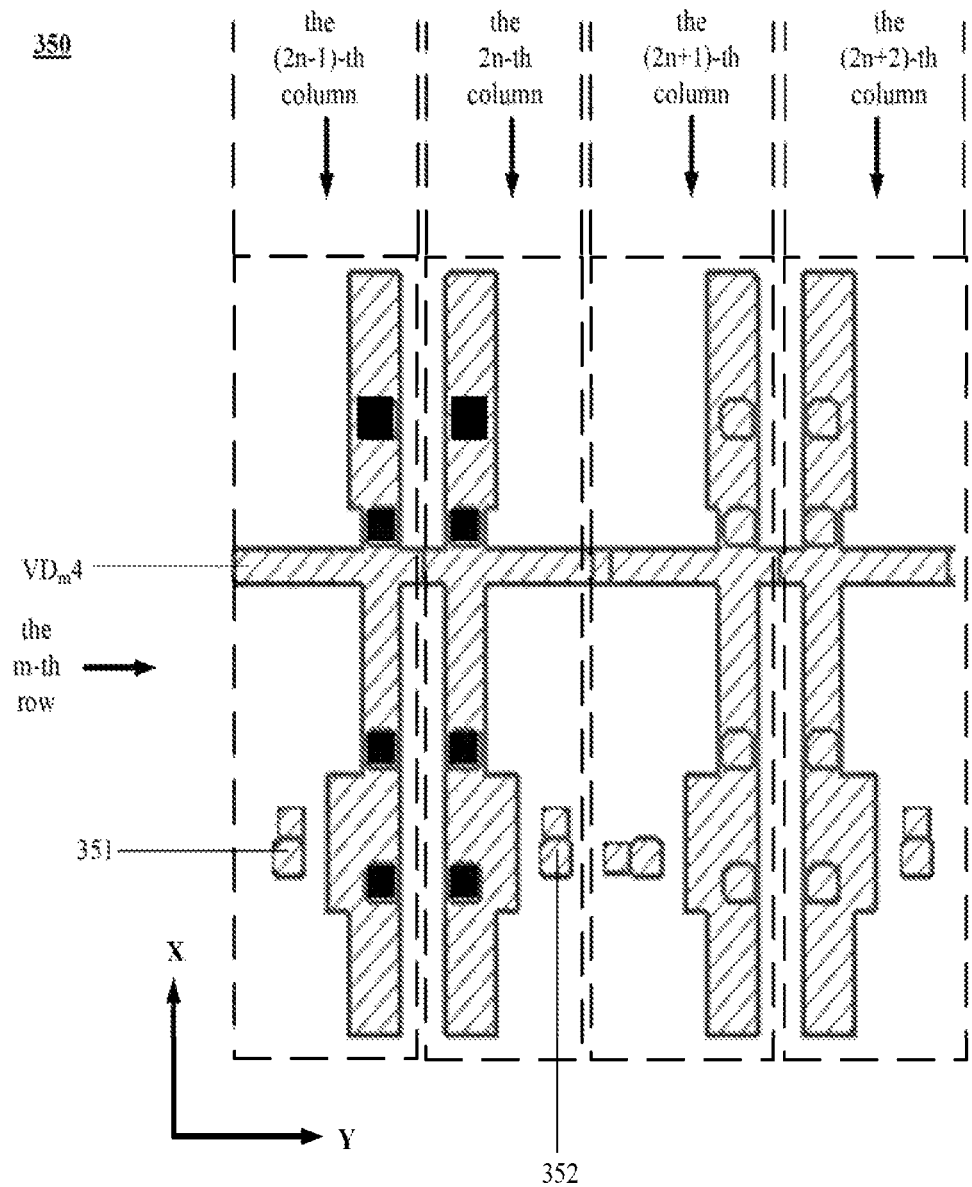

FIG. 13 shows a plan schematic diagram of a fourth conductive layer 350 in the array substrate according to an embodiment of the present disclosure. As shown in FIG. 13, the fourth conductive layer 350 includes the fourth voltage source signal line $VD_m4$ as the first voltage source, an eleventh connecting portion 351, and a twelfth connecting portion 352. In an exemplary embodiment of the present disclosure, the fourth voltage source signal line $VD_m4$ is distributed across the column direction X and the row direction Y.

Referring to FIG. 10 or FIG. 12 and FIG. 13, an orthographic projection of the second voltage source signal line $VD_m2$ on the substrate at least partially overlaps with an orthographic projection of the fourth voltage source signal line $VD_m4$ on the substrate. An orthographic projection of the third voltage source signal line $VD_m3$ on the substrate at least partially overlaps with an orthographic projection of the fourth voltage source signal line $VD_m4$ on the substrate.

It should be noted that in the embodiment of the present disclosure, an insulating layer or dielectric layer may be arranged between the third conductive layer 340/340' and the fourth conductive layer 350 (which will be described in detail later with respect to the cross-sectional diagram).

It should be noted that the vias (not shown) described below are those within the insulating layer or dielectric layer located between the third conductive layer 340/340' and the fourth conductive layer 350.

In the embodiment of the present disclosure, the fourth voltage source signal line $VD_m4$ is coupled to the second voltage source signal line $VD_m2$ and the third voltage source signal line $VD_m3$ through the vias. In FIG. 13, the black square block marked on the fourth voltage source signal line $VD_m4$ indicates the regions corresponding to the vias.

In the embodiment of the present disclosure, referring to FIG. 10 or FIG. 12 and FIG. 13, the eleventh connecting portion 351 is coupled to the fourth connecting portion 344 and the first electrode of the light-emitting device (not shown) in the sub-pixel in the (2n–1)-th column through the vias, such that the first electrode of the light-emitting device is coupled to the second electrode T6-2 of the second light-emitting control transistor T6 and the first electrode T3-1 of the light-emitting reset transistor T3 in the sub-pixel in the (2n–1)-th column.

In the embodiment of the present disclosure, referring to FIG. 10 or FIG. 12 and FIG. 13, the twelfth connecting portion 352 is coupled to one end 3461 of the sixth connecting portion 346 and the first electrode of the light-emitting device (not shown) of the sub-pixel in the 2n-th column through the vias, such that the first electrode of the light-emitting device is coupled to the second electrode T6-2 of the second light-emitting control transistor T6 and the first electrode T3-1 of the light-emitting reset transistor T3 in the sub-pixel in the 2n-th column.

In an exemplary embodiment of the present disclosure, the material of the fourth conductive layer 350 may be the same as the material of the second voltage source signal line $VD_m2$ and the third voltage source signal line $VD_m3$ in the third conductive layer 340/340'.

Figure 14:
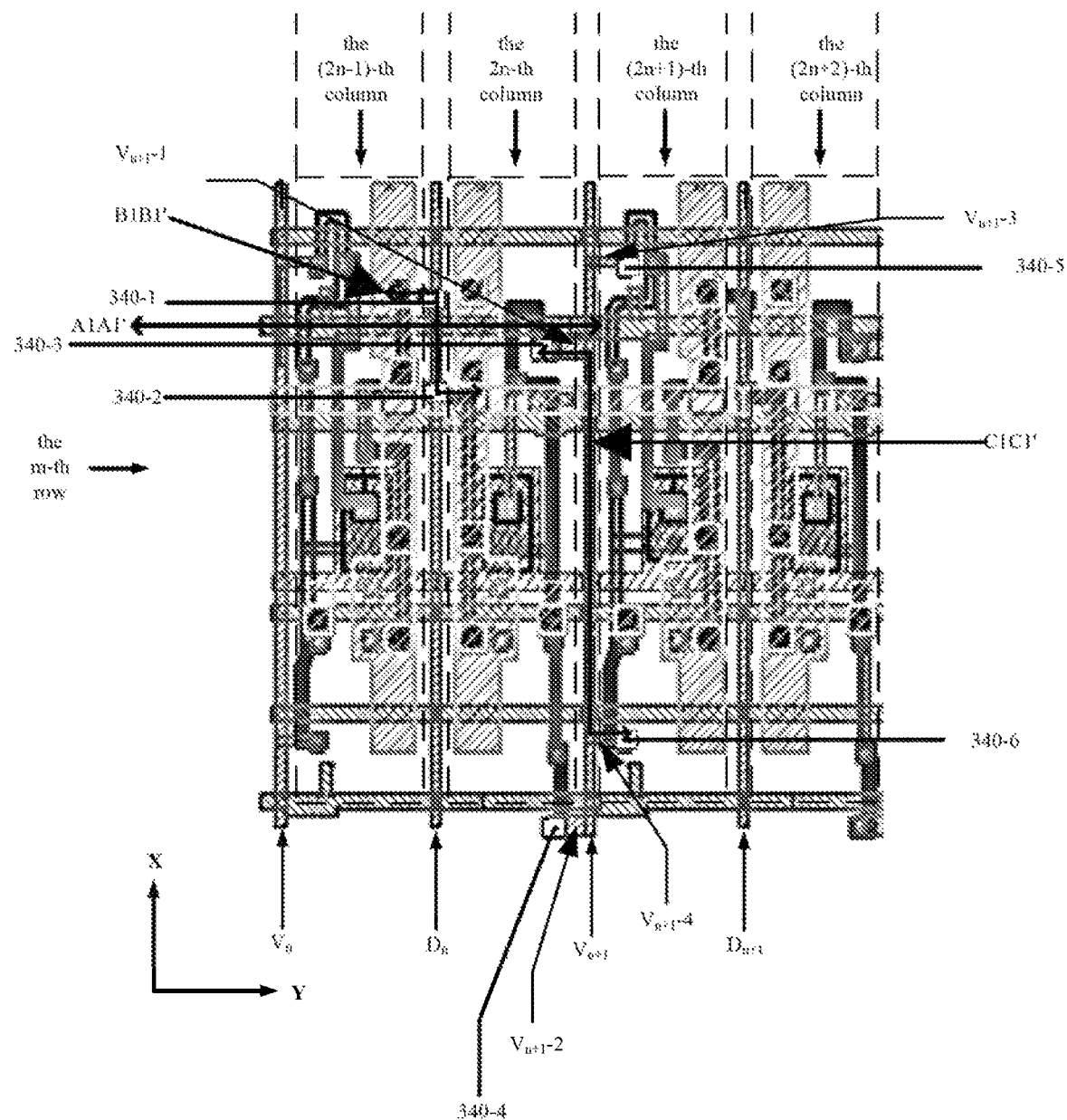
FIGS. 14-15 show plan layout schematic diagrams of an active semiconductor layer, a first conductive layer, a second conductive layer, a third conductive layer and a fourth conductive layer which are stacked together.
Figure 15:
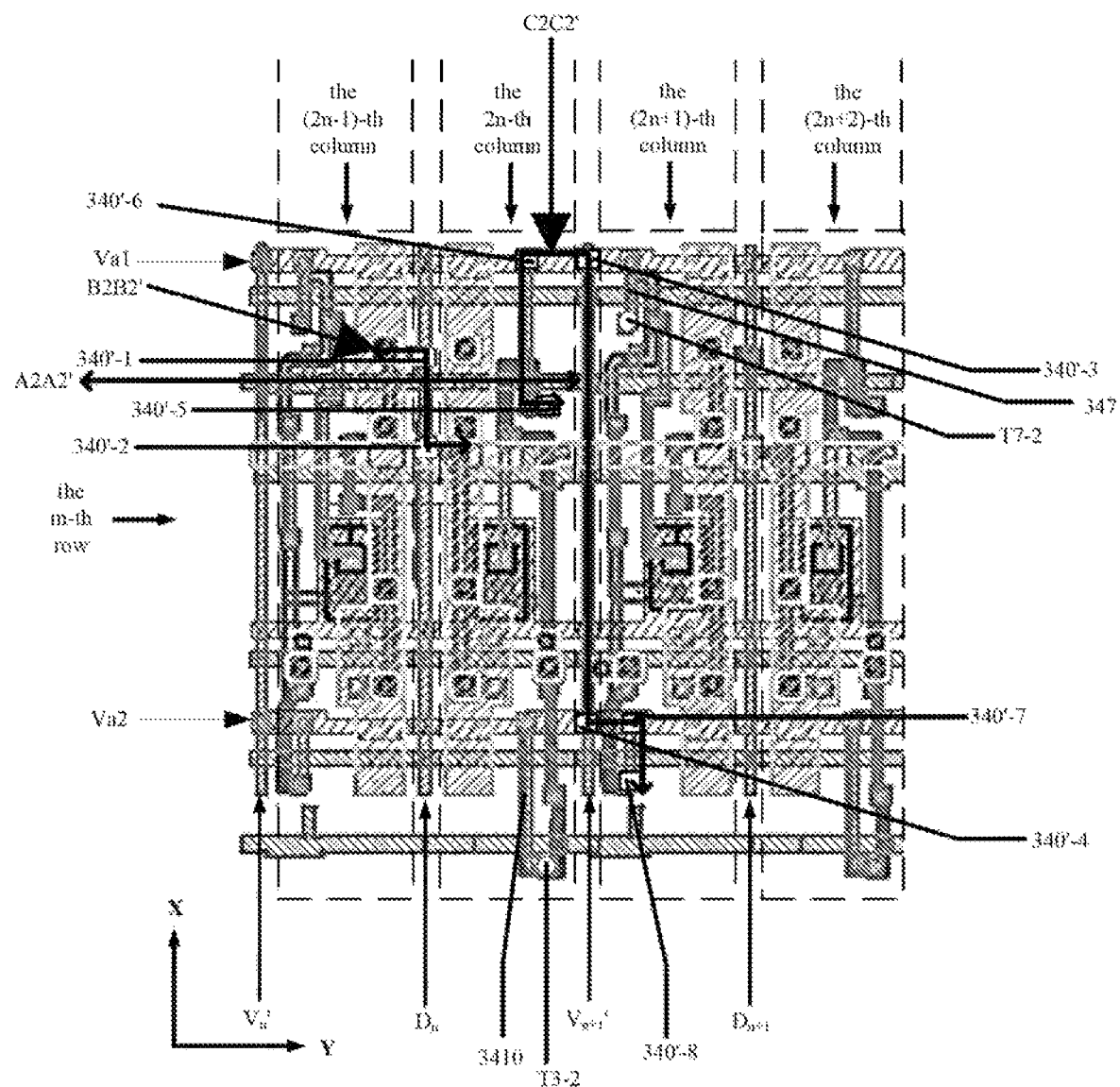

FIG. 14 and FIG. 15 show plan layout schematic diagrams of the active semiconductor layer, the first conductive layer, the second conductive layer, the third conductive layer and the fourth conductive layer stacked together.

The diagram shown in FIG. 14 is based on the structure of FIGS. 9 and 10. As shown in FIG. 14, the data signal line $D_n$ is coupled to the first electrode T1-1 of the data writing transistor T1 in the sub-pixel in the (2n–1)-th column through the via 340-1, and is coupled to the first electrode T1-1 of the data writing transistor T1 in the sub-pixel in the 2n-th column through the via 340-2.

With continued reference to FIG. 14, the first protrusion $V_{n+1}$-1 of the reset voltage source signal line $V_{n+1}$ is coupled to the second electrode T4-2 of the driving reset transistor T7 in the sub-pixel in the 2n-th column through the via 340-3. The second protrusion $V_{n+1}$-2 of the reset voltage source signal line $V_{n+1}$ is coupled to the second electrode T3-2 of the light-emitting reset transistor T3 in the sub-pixel in the 2n-th column through the via 340-4. The third protrusion $V_{n+1}$-3 of the reset voltage source signal line $V_{n+1}$ is coupled to the second electrode T7-2 of the driving reset transistor T7 in the sub-pixel in the (2n+1)-th column through the via 340-5. The fourth protrusion $V_{n+1}$-4 of the reset voltage source signal line $V_{n+1}$ is coupled to the second electrode T3-2 of the light-emitting reset transistor T3 in the sub-pixel in the (2n+1)-th column through the via 340-6.

It should be noted that the vias 340-1, 340-2, 340-3, 340-4, 340-5, and 340-6 as shown in FIG. 14 are all provided within the insulating layers or dielectric layers (described later in the cross-sectional diagram).

In the embodiment of the present disclosure, one data line is provided between the sub-pixels in the odd-column (e.g. the sub-pixel in the (2n–1)-th column) and the sub-pixels in the even-column (e.g. the sub-pixel in the 2n-th column) adjacent to each other, and then the data signals are written into the sub-pixels in the odd-column and the sub-pixels in the even-column in different time sequence, thereby the data lines can be shared. As a result, the number of the data lines in the pixel circuit can be reduced, the difficulty of wiring layout can be reduced, and the PPI can be improved.

In addition, in the embodiment of the present disclosure, four protrusions are arranged on the reset voltage source signal line which is coupled to the corresponding transistors through protrusions. Thereby, one reset voltage source signal line is shared between the sub-pixels in the even-column (e.g. the sub-pixel in the 2n-th column) and the odd-column (e.g. the sub-pixel in the (2n–1)-th column) adjacent to each other, such that the number of wiring in the pixel circuit is further reduced, and the PPI is further improved.

The diagram as shown in FIG. 15 is based on the structures of FIGS. 11 and 12. The data signal line $D_n$ is coupled to the first electrode T1-1 of the data writing transistor T1 in the sub-pixel in the (2n–1)-th column through the via 340'-1, and is coupled to the first electrode T1-1 of the data writing transistor T1 in the sub-pixel in the 2n-th column through the via 340'-2.

The reset voltage source signal line $V_{n+1}'$ is coupled to the first additional reset voltage source signal line Va1 through the via 340'-3, and further coupled to the second electrode T7-2 of the driving reset transistor T7 in the sub-pixel in the (2n+1)-th column (which also applies to the sub-pixel in the (2n–1)-th column) via the first additional reset voltage source signal line Va1 and the seventh connecting portion 347.

The reset voltage source signal line $V_{n+1}'$ is coupled to the second additional reset voltage source signal line Va2 through the via 340'-4, and further coupled to the second electrode T3-2 of the light-emitting reset transistor T3 in the sub-pixel in the 2n-th column via the second additional reset voltage source signal line Va2 and the tenth connecting portion 3410.

It should be noted that the vias 340'-1, 340'-2, 340'-3, and 340'-4 shown in FIG. 15 are all provided within the insulating layers or dielectric layers (described later on the cross-sectional diagram).

In the embodiment of the present disclosure, one data line is provided between the sub-pixels in the odd-column (e.g. the sub-pixel in the (2n–1)-th column) and the sub-pixels in the even-column (e.g. the sub-pixel in the 2n-th column) adjacent to each other, and then the data signals are written into the sub-pixels in the odd-column and the sub-pixels in the even-column in different time sequence, thereby the data lines can be shared. As a result, the number of the data lines in the pixel circuit can be reduced, the difficulty of wiring layout can be reduced, and the PPI can be improved.

In addition, in the embodiment of the present disclosure, two additional reset voltage source signal lines are arranged at both ends of the reset voltage source signal line which is coupled to the corresponding transistors through the two additional reset voltage source signal lines and the corresponding protrusions. Thereby, one reset voltage source signal line is shared between the sub-pixels in the even-column (e.g. the sub-pixel in the 2n-th column) and the odd-column (e.g. the sub-pixel in the (2n−1)-th column) adjacent to each other, such that the number of wiring in the pixel circuit is further reduced, and the PPI is further improved.

It should be noted that the first electrode (i.e., the first source/drain region) and the second electrode (i.e., the second source/drain region) of the transistor used in the embodiments of the present disclosure may be the same in structure.

Figure 16:
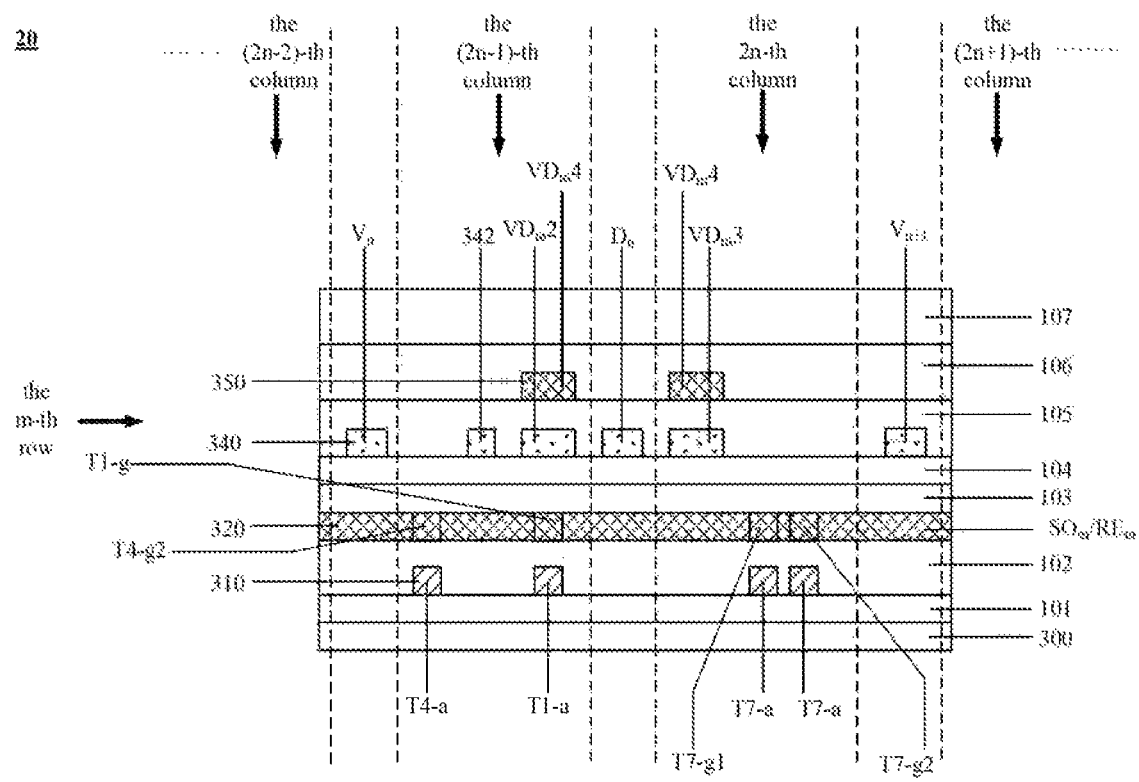
FIG. 16 shows a cross-sectional structural schematic diagram of the array substrate taken along the line A1A1' in FIG. 14 according to an embodiment of the present disclosure.

FIG. 16 shows a cross-sectional structural schematic diagram of the array substrate taken along the line A1A1' in FIG. 14 according to an embodiment of the present disclosure.

As shown in FIG. 16 and with reference to FIGS. 7 to 10 and FIG. 13, the array substrate 20 includes: a substrate 300; a buffer layer 101 located on the substrate 300; and the active semiconductor layer 310 located on the buffer layer 101. This cross-sectional diagram shows the active region T4-*a* of the compensation transistor T4 and the active region T1-*a* of the data writing transistor T1 in the sub-pixel in the (2n−1)-th column and the active region T7-*a* of the driving reset transistor T7 in the sub-pixel in the 2n-th column which are included in the active semiconductor layer 310.

In the embodiment of the present disclosure, as shown in FIG. 16, the array substrate 20 further includes: a first gate insulating layer 102 covering the buffer layer 101 and the active semiconductor layer 310; and the first conductive layer 320 located on a side of the first gate insulating layer 102 away from the substrate 300. This cross section diagram shows the first scan signal line $SO_m$ which is included in the first conductive layer 320. As described above, the first scan signal line $SO_m$ is the scan signal line used for the sub-pixel in the (2n−1)-th column. At the same time, the first scan signal line $SO_m$ is also the second driving reset control signal line $RE_m$ used for the sub-pixel in the 2n-th column. Hereinafter, the name of the first scan signal line $SO_m$ is selected for description. As shown in FIG. 16, parts of the first scan signal line $SO_m$, orthographic projections of which on the substrate 300 overlap with orthographic projections of the active region T4-*a* of the compensation transistor T4 and active region T1-*a* of the data writing transistor T1 in the sub-pixel in the (2n−1)-th column and the active region T7-*a* of the driving reset transistor T7 in the sub-pixel in the 2n-th column which are included in the active semiconductor layer 310 on the substrate 300, respectively serve as the gate T4-*g*2 of the compensation transistor T4 and the gate T1-*g* of the data writing transistor T1 in the sub-pixel in the (2n−1)-th column and the gates T7-*g*1, T7-*g*2 of the driving reset transistor T7 in the sub-pixel in the 2n-th column.

In the embodiment of the present disclosure, as shown in FIG. 16, the array substrate 20 further includes: a second gate insulating layer 103 located on a side of the first conductive layer 320 away from the substrate 300; an interlayer insulating layer 104 located on a side of the second gate insulating layer 103 away from the substrate 300; and the third conductive layer 340 located on a side of the interlayer insulating layer 104 away from the substrate 300. This cross-sectional diagram shows the reset voltage source signal lines $V_n$, $V_{n+1}$, the second connecting portion 342, the second voltage source signal line $VD_m2$, the data signal line $D_n$, and the third voltage source signal line $VD_m3$ which are included in the third conductive layer 340. As shown in FIG. 16, the data signal line $D_n$ is located between the sub-pixel in the (2n−1)-th column and the sub-pixel in the 2n-th column. The reset voltage source signal line $V_n$ may be located between the sub-pixel in the (2n−1)-th column and the sub-pixel in the (2n−2)-th column. The reset voltage source signal line $V_{n+1}$ may be located between the sub-pixel in the 2n-th column and the sub-pixel in the (2n+1)-th column.

In the embodiment of the present disclosure, as shown in FIG. 16, the array substrate 20 further includes: a dielectric layer 105 covering the interlayer insulating layer 104 and the third conductive layer 340; and the fourth conductive layer 350 located on a side of the dielectric layer 105 away from the substrate 300. In an exemplary embodiment of the present disclosure, the dielectric layer 105 may include a passivation layer and a first planarization layer (not shown in the drawing) located on the passivation layer. This cross-sectional diagram shows the fourth voltage source signal line $VD_m4$ which is included in the fourth conductive layer 350. As shown in FIG. 16, orthographic projections of the second voltage source line $VD_m2$ and the third power source line $VD_m3$, which are included in the third conductive layer 340, on the substrate 300 overlap with an orthographic projection of the fourth voltage source signal line $VD_m4$, which is included in the fourth conductive layer 350, on the substrate 300.

In the embodiment of the present disclosure, as shown in FIG. 16, the array substrate 20 further includes: a second planarization layer 105 covering the dielectric layer 105 and the fourth conductive layer 350; and a pixel definition layer 107 located on a side of the second planarization layer 105 away from the substrate 300.

Figure 17:
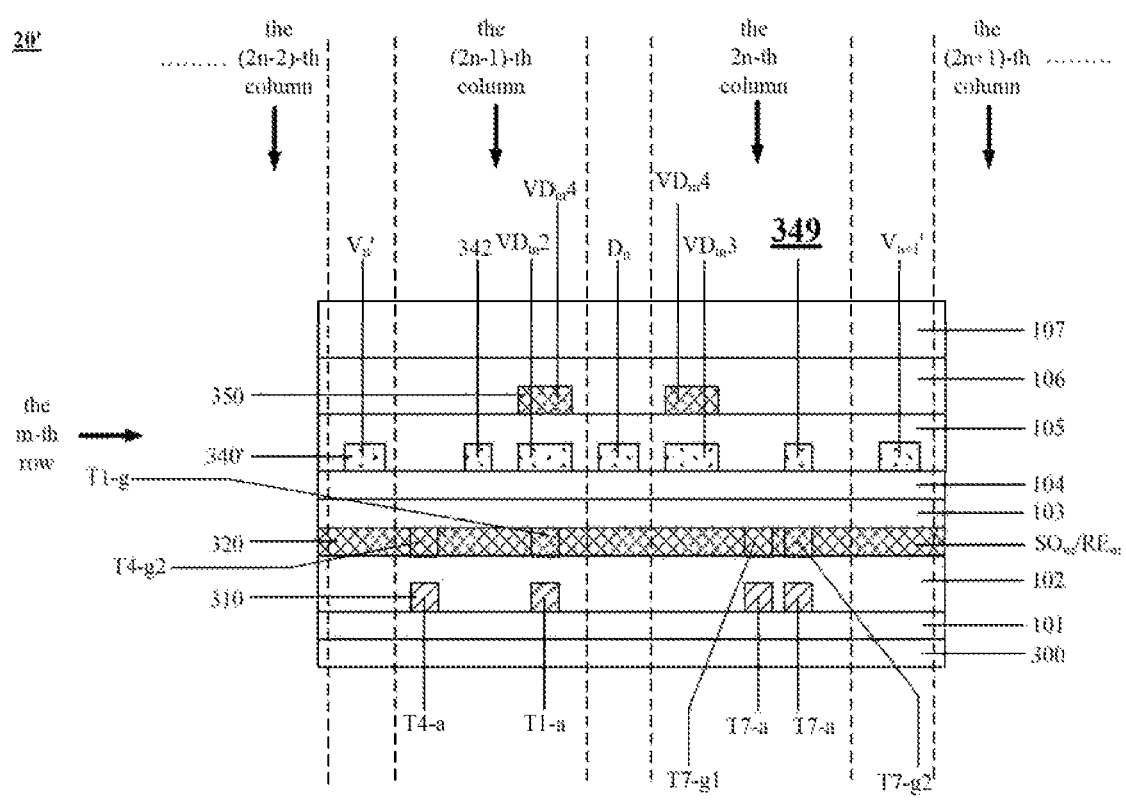
FIG. 17 shows a cross-sectional structural schematic diagram of the array substrate taken along the line A2A2' in FIG. 15 according to an embodiment of the present disclosure.

FIG. 17 shows a cross-sectional structural schematic diagram of the array substrate taken along the line A2A2' in FIG. 15 according to an embodiment of the present disclosure.

The cross-sectional structure shown in FIG. 17 is similar to that of FIG. 16, except for the fourth conductive layer 340'. As shown in FIG. 17, the fourth conductive layer 340' further includes the ninth connecting portion 349 in addition to the reset voltage source signal lines $V_n'$, $V_{n+1}'$, the second connecting portion 342, the second voltage source signal line $VD_m2$, the data signal line $D_n$, and the third voltage source signal line $VD_m3$. For the description of the ninth connecting portion 349, reference may be made to the above description of FIG. 12, which will not be repeated here.

In addition, for the description of other components in the array substrate 20' of FIG. 17, reference may be made to the above description of the array substrate 20 of FIG. 16, which will not be repeated here.

Figure 18:
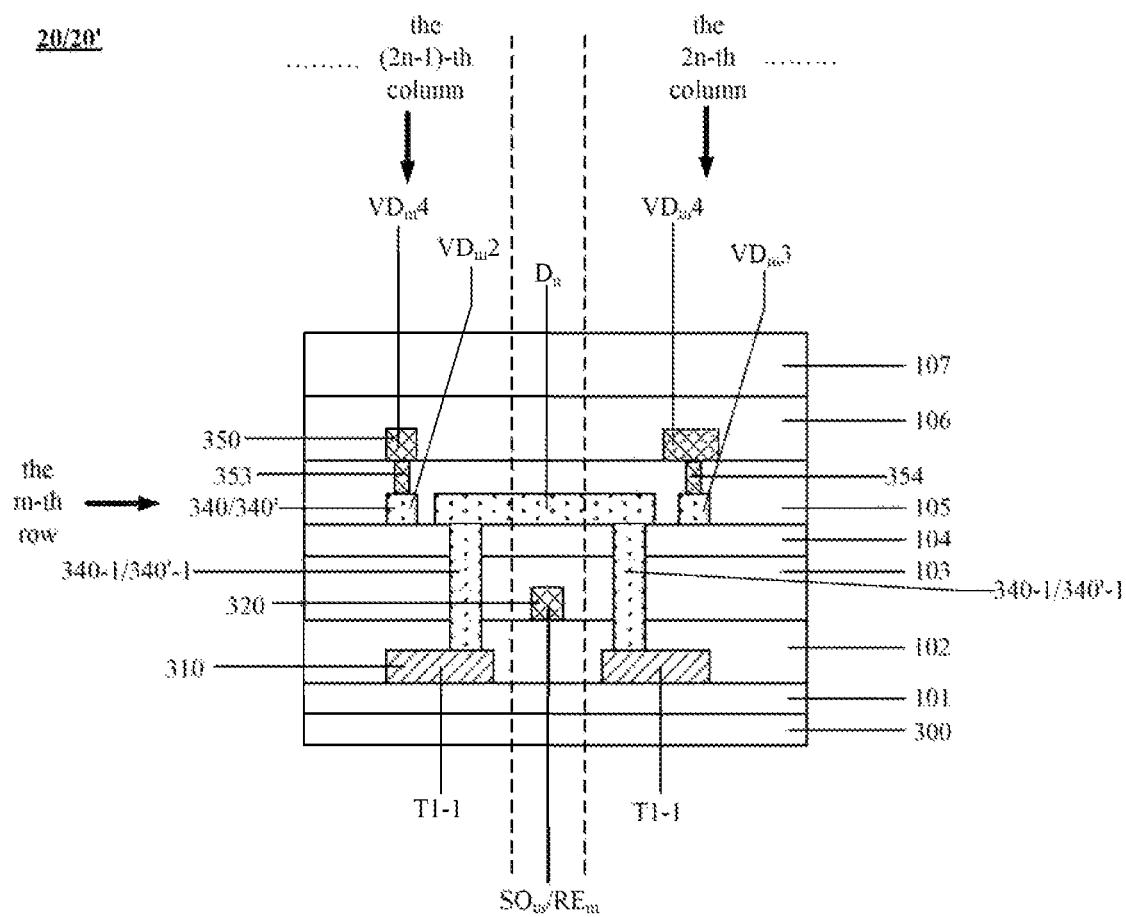
FIG. 18 shows a cross-sectional structural schematic diagram of the array substrate taken along the line B1B1' in FIG. 14 according to an embodiment of the present disclosure.

FIG. 18 shows a cross-sectional structural schematic diagram of the array substrate taken along the line B1B1' in FIG. 14 according to an embodiment of the present disclosure. This diagram may also be used as a cross-sectional structural schematic diagram of the array substrate taken along the line B2B2' in FIG. 15. It should be noted that the cross-sectional diagram is also applicable to the sub-pixel in the (2n−2)-th column and the sub-pixel in the (2n−1)-th column from the sub-pixels in the m-th row.

As shown in FIG. 18 and with reference to FIGS. 7 to 13, the array substrate 20/20' includes: a substrate 300; a buffer layer 101 located on the substrate 300; and the active semiconductor layer 310 located on the buffer layer 101. This cross-sectional diagram shows the first electrode T1-1 of the data writing transistor T1 in the sub-pixel in the (2n−1)-th column and the first electrode T1-1 of the data writing transistor T1 in the sub-pixel in the 2n-th column which are included in the active semiconductor layer 310.

In the embodiment of the present disclosure, as shown in FIG. 18, the array substrate 20/20' further includes: a first gate insulating layer 102 covering the buffer layer 101 and the active semiconductor layer 310; and the first conductive layer 320 located on a side of the first gate insulating layer 102 away from the substrate 300. This cross section shows the first scan signal line $SO_m$ which is included in the first conductive layer 320. As described above, the first scan signal line $SO_m$ is the scan signal line used for the sub-pixel in the (2n−1)-th column. At the same time, the first scan signal line $SO_m$ is also the second driving reset control signal line $RE_m$ used for the sub-pixel in the 2n-th column.

In the embodiment of the present disclosure, as shown in FIG. 18, the array substrate 20/20' further includes: a second gate insulating layer 103 covering the first gate insulating layer 102 and the first scan signal line $SO_m$; an interlayer insulating layer 104 located on a side of the second gate insulating layer 103 away from the substrate 300; and the third conductive layer 340/340' located on a side of the interlayer insulating layer 104 away from the substrate 300. This cross-sectional diagram shows the second voltage source signal line $VD_m2$, the data signal line $D_n$, and the third voltage source signal line $VD_m3$ which are included in the third conductive layer 340/340'. As shown in FIG. 18, the data signal line $D_n$ is located between the sub-pixel in the (2n−1)-th column and the sub-pixel in the 2n-th column. The data signal line $D_n$ is connected to the first electrode T1-1 of the data writing transistor T1 in the sub-pixel in the (2n−1)-th column and the first electrode T1-1 of the data writing transistor T1 in the sub-pixel in the 2n-th column, respectively, through the via 340-1/340'-1 and the via 340-2/340'-2 penetrating through the first gate insulating layer 102, the second gate insulating layer 103 and the interlayer insulating layer 104, such that one data signal line $D_n$ is shared between the sub-pixel in the (2n−1)-th column and the sub-pixel in the 2n-th column.

In the embodiment of the present disclosure, as shown in FIG. 18, the array substrate 20/20' further includes: a dielectric layer 105 covering the interlayer insulating layer 104 and the third conductive layer 340/340'; and the fourth conductive layer 350 located on a side of the dielectric layer 105 away from the substrate 300. In an exemplary embodiment of the present disclosure, the dielectric layer 105 may include a passivation layer and a first planarization layer (not shown in the drawing) located on the passivation layer. This cross-sectional diagram shows the fourth voltage source signal line $VD_m4$ which is included in the fourth conductive layer 350. As shown in FIG. 18, orthographic projections of the second voltage source line $VD_m2$ and the third voltage source line $VD_m3$, which are included in the third conductive layer 340/340', on the substrate 300 overlap with an orthographic projection of the fourth voltage source signal line $VD_m4$, which is included in the fourth conductive layer 350, on the substrate 300. The fourth voltage source signal line $VD_m4$ is connected to the second voltage source line $VD_m2$ and the third voltage source line $VD_m3$ which are included in the third conductive layer 340/340' through the via 353 and the via 354 located within the dielectric layer 105, respectively.

In the embodiment of the present disclosure, as shown in FIG. 18, the array substrate 20/20' further includes: a second planarization layer 105 covering the dielectric layer 105 and the fourth conductive layer 350; and a pixel definition layer 107 located on a side of the second planarization layer 105 away from the substrate 300.

Figure 19:
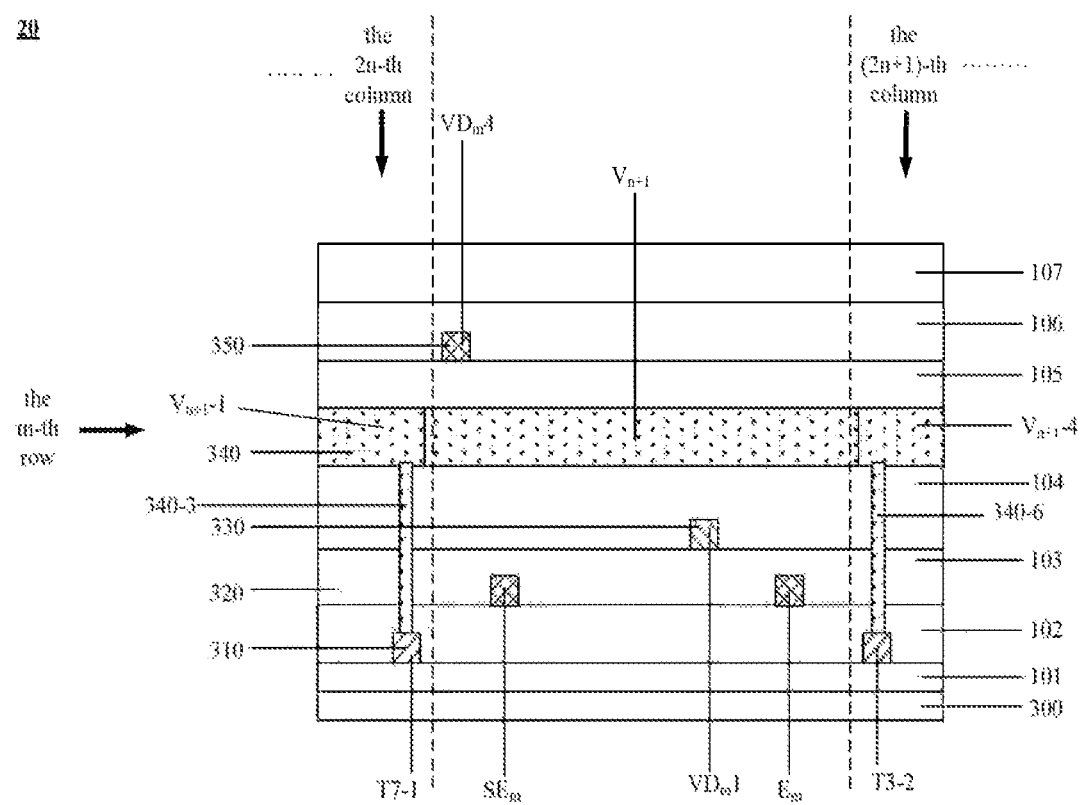
FIG. 19 shows a cross-sectional structural schematic diagram of the array substrate taken along the line C1C1' in FIG. 14 according to an embodiment of the present disclosure.

FIG. 19 shows a cross-sectional structural schematic diagram of the array substrate taken along the line C1C1' in FIG. 14 according to an embodiment of the present disclosure. It should be noted that the cross-sectional diagram is shown with respect to the sub-pixel in the 2n-th column and the sub-pixel in the (2n+1)-th column from the sub-pixels in the m-th row of the array substrate. It should be noted that the cross-sectional diagram is also applicable to the sub-pixel in the (2n−2)-th column and the sub-pixel in the (2n−1)-th column from the sub-pixels in the m-th row.

As shown in FIG. 19 and with reference to FIGS. 7 to 10 and FIG. 13, the array substrate 20 includes: a substrate 300; a buffer layer 101 located on the substrate 300; and the active semiconductor layer 310 located on the buffer layer 101. The cross-sectional diagram shows the first electrode T7-1 of the driving reset transistor T7 in the sub-pixel in the 2n-th column and the second electrode T3-2 of the light-emitting reset transistor T3 in the sub-pixel in the (2n+1)-th column, which are included in the active semiconductor layer 310.

In the embodiment of the present disclosure, as shown in FIG. 19, the array substrate 20 further includes: a first gate insulating layer 102 covering the buffer layer 101 and the active semiconductor layer 310; and the first conductive layer 320 located on a side of the first gate insulating layer 102 away from the substrate 300. This cross section shows the second scan signal line $SE_m$ and the light-emitting control signal line $E_m$ which are included in the first conductive layer 320.

In the embodiment of the present disclosure, as shown in FIG. 19, the array substrate 20 further includes: a second gate insulating layer 103 covering the first gate insulating layer 102 and the first conductive layer 320; and the second conductive layer 330 located on a side of the second gate insulating layer 103 away from the substrate 300. This cross section shows the first voltage source signal line $VD_m1$ which is included in the second conductive layer 330.

In the embodiment of the present disclosure, as shown in FIG. 19, the array substrate 20 further includes: an interlayer insulating layer 104 covering the second gate insulating layer 103 and the second conductive layer 330; and the third conductive layer 340 located on a side of the interlayer insulating layer 104 away from the substrate 300. This cross-sectional diagram shows the reset voltage source signal line $V_{n+1}$ which is included in the third conductive layer 340. The first protrusion $V_{n+1}$-1 of the reset voltage source signal line $V_{n+1}$ is connected to the first electrode T7-1 of the driving reset transistor T7 in the sub-pixel in the 2n-th column through the via 340-3 penetrating through the first gate insulating layer 102, the second gate insulating layer 103, and the interlayer insulating layer 104. The fourth protrusion $V_{n+1}$-4 of the reset voltage source signal line $V_{n+1}$ is connected to the second electrode T3-2 of the light-emitting reset transistor T3 in the sub-pixel in the (2n+1)-th column through the via 340-6 penetrating through the first gate insulating layer 102, the second gate insulating layer 103, and the interlayer insulating layer 104. Thus, it is possible to provide the reset voltage to the sub-pixel in the 2n-th column (or the sub-pixel in the (2n−2)-th column) and the sub-pixel in the (2n+1)-th column (or the sub-pixel in the (2n−1)-th column) through only one reset voltage source signal line $V_{n+1}$.

In the embodiment of the present disclosure, as shown in FIG. 19, the array substrate 20 further includes: a dielectric layer 105 located on a side of the third conductive layer 340 away from the substrate 300; and the fourth conductive layer 350 located on a side of the dielectric layer 105 away from the substrate 300. In an exemplary embodiment of the present disclosure, the dielectric layer 105 may include a passivation layer and a first planarization layer (not shown in the drawing) located on the passivation layer. This cross-sectional diagram shows the fourth voltage source signal line $VD_m4$ which is included in the fourth conductive layer 350.

In the embodiment of the present disclosure, as shown in FIG. 19, the array substrate 20 further includes: a second planarization layer 105 covering the dielectric layer 105 and the fourth conductive layer 350; and a pixel definition layer 107 located on a side of the second planarization layer 105 away from the substrate 300.

Figure 20:
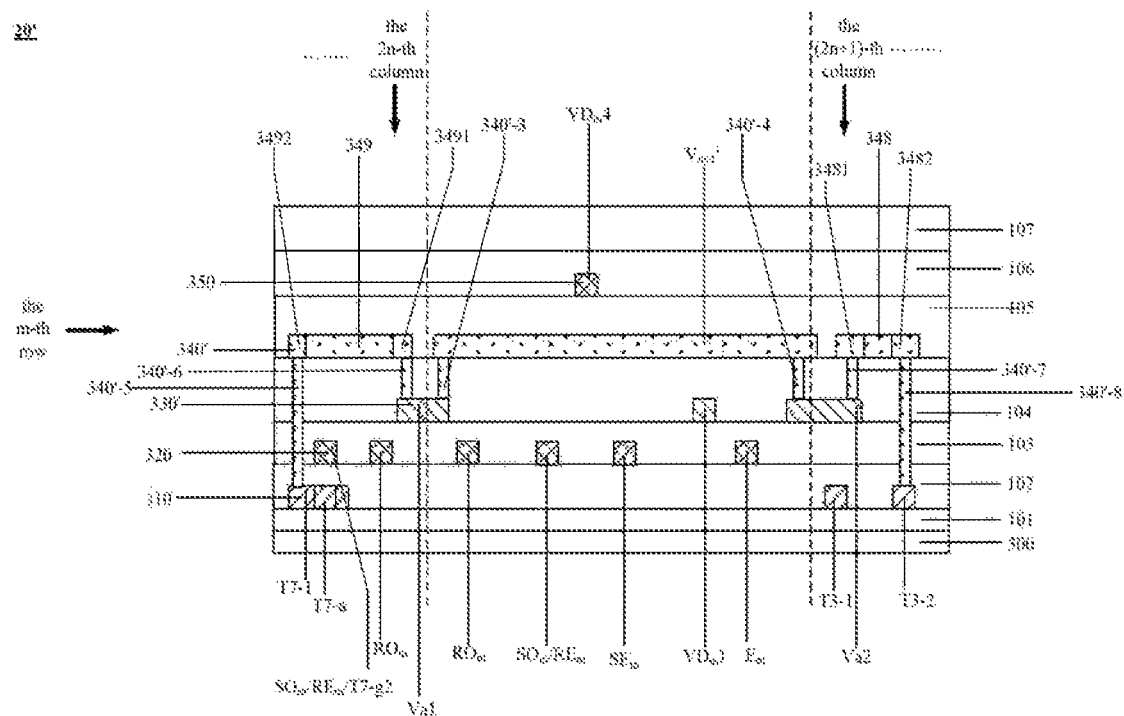
FIG. 20 shows a cross-sectional structural schematic diagram of the array substrate taken along the line C2C2' in FIG. 15 according to an embodiment of the present disclosure.

FIG. 20 shows a cross-sectional structural schematic diagram of the array substrate taken along the line C2C2' in FIG. 15 according to an embodiment of the present disclosure. It should be noted that the cross-sectional diagram is shown with respect to the sub-pixel in the 2n-th column and the sub-pixel in the (2n+1)-th column from the sub-pixels in the m-th row of the array substrate. It should be noted that the cross-sectional diagram is also applicable to the sub-pixel in the (2n−2)-th column and the sub-pixel in the (2n−1)-th column from the sub-pixels in the m-th row.

As shown in FIG. 20 and with reference to FIGS. 7 to 8 and FIGS. 11 to 13, the array substrate 20' includes: a substrate 300; a buffer layer 101 located on the substrate 300; and the active semiconductor layer 310 located on the buffer layer 101. The cross-sectional diagram shows the first electrode T7-1 and the active region T7-a of the driving reset transistor T7 in the sub-pixel in the 2n-th column and the first electrode T3-1 and the second electrode T3-2 of the light-emitting reset transistor T3 in the sub-pixel in the (2n+1)-th column, which are included in the active semiconductor layer 310.

In the embodiment of the present disclosure, as shown in FIG. 20, the array substrate 20' further includes: a first gate insulating layer 102 covering the buffer layer 101 and the active semiconductor layer 310; and the first conductive layer 320 located on a side of the first gate insulating layer 102 away from the substrate 300. The cross section shows the first scan signal line $SO_m$, the first driving reset control signal line $RO_m$, the second scan signal line $SE_m$, and the light-emitting control signal line $E_m$ which are included in the first conductive layer 320. The first scan signal line $SO_m$ located in the sub-pixel in the 2n-th column may serve as the gate T7-g2 of the driving reset transistor T7 in the sub-pixel in the 2n-th column. At the same time, the first scan signal line $SO_m$ is also the second driving reset control signal line $RE_m$ used for the sub-pixel in the 2n-th column.

In the embodiment of the present disclosure, as shown in FIG. 20, the array substrate 20' further includes: a second gate insulating layer 103 covering the first gate insulating layer 102 and the first conductive layer 320; and the second conductive layer 330' located on a side of the second gate insulating layer 103 away from the substrate 300. This cross section shows the first voltage source signal line $VD_m1$, the first additional reset voltage source signal line Va1, and the second additional reset voltage source signal line Va2 which are included in the second conductive layer 330'.

In the embodiment of the present disclosure, as shown in FIG. 20, the array substrate 20' further includes: an interlayer insulating layer 104 covering the second gate insulating layer 103 and the second conductive layer 330'; and the third conductive layer 340' located on a side of the interlayer insulating layer 104 away from the substrate 300. This cross-sectional diagram shows the reset voltage source signal line $V_{n+1}'$, the eighth connecting portion 348, and the ninth connecting portion 349 which are included in the third conductive layer 340'. One end 3481 of the eighth connecting portion 348 is coupled to the second additional reset voltage source signal line Va2 which is included in the second conductive layer 330 through the via 340'-7 in the interlayer insulating layer 104. The other end 3482 of the eighth connecting portion 348 is coupled to the second electrode T3-2 of the light-emitting reset transistor T3 in the sub-pixel in the (2n+1)-th column (or the sub-pixel in the (2n−1)-th column) through the via 340'-8 penetrating through the first gate insulating layer 102, the second gate insulating layer 103 and the interlayer insulating layer 104. One end 3491 of the ninth connecting portion 349 is coupled to the first additional reset voltage source signal line Va1 which is included in the second conductive layer 330 through the via 340'-6 in the interlayer insulating layer 104. The other end 3492 of the ninth connecting portion 349 is coupled to the first electrode T7-1 of the driving reset transistor T7 in the sub-pixel in the 2n-th column (or the sub-pixel in the (2n−2)-th column) through the via 340'-5 penetrating through the first gate insulating layer 102, the second gate insulating layer 103, and the interlayer insulating layer 104. The reset voltage source signal line $V_{n+1}'$ is coupled to the first additional reset voltage source signal line Va1 which is included in the second conductive layer 330 through the via 340'-3 in the interlayer insulating layer 104, and thus coupled to the first electrode T7-1 of the driving reset transistor T7 in the sub-pixel in the 2n-th column (or the sub-pixel in the (2n−2)-th column) via the ninth connecting portion 349. The reset voltage source signal line $V_{n+1}'$ is further coupled to the second additional reset voltage source signal line Va2 which is included in the second conductive layer 330 through the via 340'-4 in the interlayer insulating layer 104, and thus coupled to the second electrode T3-2 of the light-emitting reset transistor T3 in the sub-pixel in the (2n+1)-th column (or the sub-pixel in the (2n−1)-th column) via the eighth connecting portion 348. As a result, it is possible to provide the reset voltage to the sub-pixel in the 2n-th column (or the sub-pixel in the (2n−2)-th column) and the sub-pixel in the (2n+1)-th column (or the sub-pixel in the (2n−1)-th column) through only one reset voltage source signal line $V_{n+1}'$.

In the embodiment of the present disclosure, as shown in FIG. 20, the array substrate 20' further includes: a dielectric layer 105 located on a side of the third conductive layer 340' away from the substrate 300; and the fourth conductive layer 350 located on a side of the dielectric layer 105 away from the substrate 300. In an exemplary embodiment of the present disclosure, the dielectric layer 105 may include a passivation layer and a first planarization layer (not shown in the drawing) located on the passivation layer. This cross-sectional diagram shows the fourth voltage source signal line $VD_m4$ which is included in the fourth conductive layer 350.

In the embodiment of the present disclosure, as shown in FIG. 20, the array substrate 20' further includes: a second planarization layer 105 covering the dielectric layer 105 and the fourth conductive layer 350; and a pixel definition layer 107 located on a side of the second planarization layer 105 away from the substrate 300.

In an exemplary embodiment of the present disclosure, the substrate 300 may include a flexible substrate. As an example, the substrate 300 may include a first polyimide layer, a first silicon oxide layer, a second polyimide layer, and a second silicon dioxide layer that are sequentially stacked.

An embodiment of the present disclosure further provides a display panel, which includes the array substrate according to any embodiment of the present disclosure.

Figure 21:
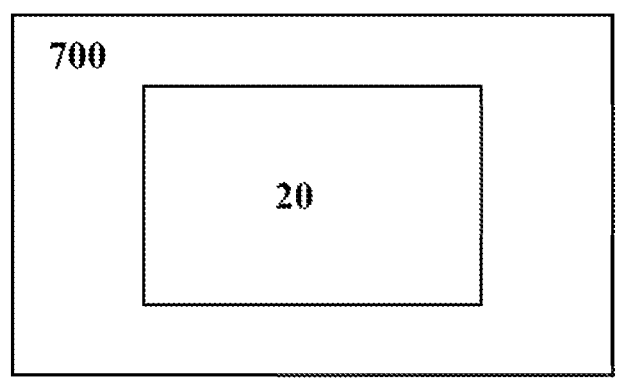
FIG. 21 shows a structural schematic diagram of a display panel according to an embodiment of the present disclosure.

FIG. 21 shows a structural schematic diagram of a display panel according to an embodiment of the present disclosure.

As shown in FIG. 21, the display panel 700 may include the array substrate 20/20' according to any embodiment of the present disclosure.

For instance, the display panel 700 may further include other components, such as a time sequence controller, a signal decoding circuit, a voltage conversion circuit, etc. These components may be, for instance, existing conventional components, which will not be described in detail here.

For instance, the display panel 700 may be a rectangular panel, a circular panel, an oval panel, a polygonal panel, etc. In addition, the display panel 700 may not only be a flat panel, but also a curved panel or even a spherical panel. For instance, the display panel 700 may also have a touch function, which means, the display panel 700 may be a touch display panel.

An embodiment of the present disclosure also provides a display device, which includes the display panel according to any embodiment of the present disclosure.

Figure 22:
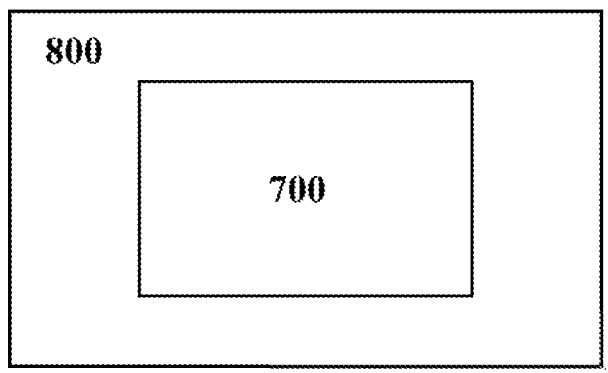
FIG. 22 shows a structural schematic diagram of a display device according to an embodiment of the present disclosure.

FIG. 22 shows a structural schematic diagram of a display device according to an embodiment of the present disclosure. As shown in FIG. 22, the display device 800 may include the display panel 700 according to any embodiment of the present disclosure.

The display device 800 may be a mobile phone, a tablet computer, a television, a monitor, a notebook computer, a digital photo frame, a navigator, and any other product or component with a display function.

The display panel and the display device provided by embodiments of the present disclosure have the same or similar beneficial effects as the array substrate provided by the previous embodiments of the present disclosure. Since the array substrate has been described in detail in the foregoing embodiments, it will be omitted here.

The foregoing description of the embodiment has been provided for purpose of illustration and description. It is not intended to be exhaustive or to limit the application. Even if not specifically shown or described, individual elements or features of a particular embodiment are generally not limited to that particular embodiment, are interchangeable when under a suitable condition, can be used in a selected embodiment and may also be varied in many ways. Such variations are not to be regarded as a departure from the application, and all such modifications are included within the scope of the application.

What is claimed is:

1. An array substrate, comprising:
a substrate;
a pixel array disposed on the substrate, comprising a plurality of sub-pixels arranged in a plurality of rows and a plurality of columns, wherein each of the sub-pixels has a pixel circuit, and a data signal input terminal, a scan signal input terminal, a driving reset control signal input terminal, and a reset voltage terminal coupled to the pixel circuit, wherein the pixel circuit comprises a data writing circuit, a driving circuit and a driving reset circuit, the driving circuit comprises a control terminal, a first terminal and a second terminal, the data writing circuit is coupled to the data signal input terminal, the scan signal input terminal and the first terminal of the driving circuit, and is configured to provide a data signal to the first terminal of the driving circuit under a control of a scan signal, the driving circuit is configured to provide a driving current to a light-emitting device, the driving reset circuit is coupled to the driving reset control signal input terminal, the control terminal of the driving circuit, and the reset voltage terminal, and is configured to reset the control terminal of the driving circuit under a control of the driving reset control signal;
a plurality of pairs of scan signal lines, extending in a row direction and being spaced apart from each other in a column direction, wherein each of the plurality of pairs of scan signal lines comprises a first scan signal line and a second scan signal line, and wherein a m-th pair of scan signal lines corresponds to the sub-pixels in a m-th row, where m is greater than or equal to 1, and wherein the first scan signal line in the m-th pair of scan signal lines is configured to provide a first scan signal to the scan signal input terminal of the sub-pixel in a (2n−1)-th column from the sub-pixels in the m-th row, where n is an integer greater than or equal to 1, and wherein the second scan signal line in the m-th pair of scan signal lines is configured to provide a second scan signal to sub-pixel in a 2n-th column from the sub-pixels in the m-th row; and
a reset voltage source signal line and a data signal line, extending in the column direction, wherein the reset voltage source signal line and the data signal line are alternately arranged with each other in the row direction, and an interval between the data signal line and the reset voltage source signal line adjacent to each other defines a column of sub-pixels, and wherein the reset voltage source signal line is configured to provide a reset voltage to a reset voltage terminal of the sub-pixel in a column of sub-pixels adjacent to the reset voltage source signal line, and the data signal line is configured to provide a data signal to a data signal input terminal of the sub-pixel in a column of sub-pixels adjacent to the data signal line,
wherein a (n+1)-th reset voltage source signal line is adjacent to the sub-pixels in the 2n-th column and the sub-pixels in a (2n+1)-th column, and is configured to provide the reset voltage to the reset voltage terminals of the sub-pixels in the 2n-th column and the sub-pixels in the (2n+1)-th column, and
wherein a n-th data signal line is adjacent to the sub-pixels in the (2n−1)-th column and the sub-pixels in the 2n-th column, and is configured to provide the data signal to the data signal input terminals of the sub-pixels in the (2n−1)-th column and the sub-pixels in the 2n-th column.

2. The array substrate according to claim 1, wherein the data signal line and the reset voltage source signal line are arranged in a same layer.

3. The array substrate according to claim 2, further comprising a plurality of pairs of driving reset control signal lines, extending in the row direction and being spaced apart from each other in the column direction, wherein each of the plurality of pairs of driving reset control signal lines comprises a first driving reset control signal line and a second driving reset control signal line, and a m-th pair of driving reset control signal lines corresponds to the sub-pixels in the m-th row,
wherein the first driving reset control signal line in the m-th pair of driving reset control signal lines is configured to provide a first driving reset control signal to the driving reset control signal input terminal of the sub-pixel in the (2n−1)-th column from the sub-pixels in the m-th row, and the second driving reset control signal line in the m-th pair of driving reset control signal lines is configured to provide a second driving reset control signal to the driving reset control signal input terminal of the sub-pixel in a 2n-th column from the sub-pixels in the m-th row of sub-pixels.

4. The array substrate according to claim 3, wherein the first scan signal line in the m-th pair of scan signal lines and the second driving reset control signal line in the m-th pair of driving reset control signal lines are the same signal line.

5. The array substrate according to claim 4, wherein the pixel circuit further comprises a compensation circuit, which is coupled to the second terminal of the driving circuit, the control terminal of the driving circuit and the scan signal input terminal, and configured to perform threshold compensation on the driving circuit according to the scan signal.

6. The array substrate according to claim 5, wherein the pixel circuit further comprises a storage circuit, coupled to a first voltage terminal and the control terminal of the driving circuit, and configured to store a voltage difference between the first voltage terminal and the control terminal of the driving circuit.

7. The array substrate according to claim 6, wherein the sub-pixel further comprises a light-emitting control signal input terminal, and the pixel circuit further comprises a light-emitting control circuit,
 wherein the light-emitting control circuit is coupled to the light-emitting control signal input terminal, the first voltage terminal, the driving circuit and the light-emitting device, and is configured to apply a first voltage of the first voltage terminal to the driving circuit, and to apply a driving current generated by the driving circuit to the light-emitting device.

8. The array substrate according to claim 7, further comprising a plurality of light-emitting control signal lines, which extend in the column direction and are spaced apart from each other in the row direction,
 wherein a m-th light-emitting control signal line is configured to be coupled to the light-emitting control signal input terminals of the sub-pixels in the m-th row to provide a light-emitting control signal.

9. The array substrate according to claim 8, wherein the sub-pixel further comprises a light-emitting reset control signal input terminal, and the pixel circuit further comprises a light-emitting reset circuit, which is coupled to the light-emitting reset control signal input terminal, the reset voltage terminal and the light-emitting device, and configured to reset the light-emitting device under a control of a light-emitting reset control signal,
 wherein the array substrate further comprises a plurality of pairs of light-emitting reset control signal lines, which extend in the row direction and are spaced apart from each other in the column direction, wherein each of the plurality of pairs of light-emitting reset control signal lines comprises a first light-emitting reset control signal line and a second light-emitting reset control signal line, and a m-th pair of light-emitting reset control signal lines corresponds to sub-pixels in the m-th row,
 wherein the first light-emitting reset control signal line in the m-th pair of light-emitting reset control signal lines is configured to provide a first light-emitting reset control signal to the light-emitting reset control signal input terminal of the sub-pixels in the (2n−1)-th column from the sub-pixels in the m-th row, and the second light-emitting reset control signal line in the m-th pair of light-emitting reset control signal lines is configured to provide a second light-emitting reset control signal to the light-emitting reset control signal input terminal of the sub-pixels in the 2n-th column from the sub-pixels in the m-th row.

10. The array substrate according to claim 9, wherein the first light-emitting reset control signal line in the m-th pair of light-emitting reset control signal lines and the first driving reset control signal line in a (m+1)-th pair of driving reset control signal lines are the same signal line, and the second light-emitting reset control signal line in the m-th pair of light-emitting reset control signal lines and the second driving reset control signal line in the (m+1)-th pair of driving reset control signal lines are the same signal line.

11. The array substrate according to claim 10, wherein the data writing circuit comprises a data writing transistor, the driving circuit comprises a driving transistor, the driving reset circuit comprises a driving reset transistor, the compensation circuit comprises a compensation transistor, the light-emitting control circuit comprises a first light-emitting control transistor and a second light-emitting control transistor, the light-emitting reset circuit comprises a light-emitting reset transistor, and the storage circuit comprises a capacitor,
 wherein a first electrode of the driving transistor is coupled to the first terminal of the driving circuit, and a second electrode of the driving transistor is coupled to the second terminal of the driving circuit, and a gate of the driving transistor is coupled to the control terminal of the driving circuit,
 wherein a first electrode of the data writing transistor is coupled to the data signal input terminal, a second electrode of the data writing transistor is coupled to the first electrode of the driving transistor, and a gate of the data writing transistor is coupled to the scan signal input terminal,
 wherein a first electrode of the driving reset transistor is coupled to the gate of the driving transistor, a second electrode of the driving reset transistor is coupled to the reset voltage terminal, and a gate of the driving reset transistor is coupled to the driving reset control signal input terminal,
 wherein a first electrode of the compensation transistor is coupled to the second electrode of the driving transistor, a second electrode of the compensation transistor is coupled to the gate of the driving transistor, and a gate of the compensation transistor is coupled to the scan signal input terminal,
 wherein a first electrode of the first light-emitting control transistor is coupled to the first voltage terminal, a second electrode of the first light-emitting control transistor is coupled to the first electrode of the driving transistor, and a gate of the first light-emitting control transistor is coupled to the light-emitting control signal input terminal,
 wherein a first electrode of the second light-emitting control transistor is coupled to the second electrode of the driving transistor, a second electrode of the second light-emitting control transistor is coupled to a first electrode of the light-emitting device, and a gate of the second light-emitting control transistor is coupled to the light-emitting control signal input terminal,
 wherein a first electrode of the light-emitting reset transistor is coupled to the first electrode of the light-emitting device, a second electrode of the light-emitting reset transistor is coupled to the reset voltage terminal, and a gate of the light-emitting reset transistor is coupled to the light-emitting reset control signal input terminal, and
 wherein a first electrode of the capacitor is coupled to the gate of the driving transistor, and a second electrode of the capacitor is coupled to the first voltage terminal.

12. The array substrate according to claim 11, further comprising an active semiconductor layer located on the substrate, which comprises active regions of transistors in the pixel circuit, wherein for the sub-pixels in the m-th row:

the active semiconductor layer of the sub-pixel in the (2n−1)-th column comprises a first part, a second part, and a third part that are spaced apart from each other, wherein the first part and the second part are arranged sequentially in the row direction, and a combination of the first part with the second part and the third part are arranged sequentially in the column direction, wherein the first part comprises the active regions of the driving reset transistor and the compensation transistor in the sub-pixel in the (2n−1)-th column, wherein the second part comprises the active region of the data writing transistor in the sub-pixel in the (2n−1)-th column, and wherein the third part comprises the active regions of the driving transistor, the first light-emitting control transistor, the second light-emitting control transistor, and the light-emitting reset transistor in the sub-pixel in the (2n−1)-th column, wherein the active semiconductor layer of the sub-pixel in the 2n-th column comprises a fourth part and a fifth part sequentially arranged in the column direction, wherein the fourth part comprises the active regions of the driving reset transistor, the data writing transistor, the compensation transistor, the driving transistor, the first light-emitting control transistor and the second light-emitting control transistor in the sub-pixel in the 2n-th column, and wherein the fifth part comprises the active region of the light-emitting reset transistor in the sub-pixel in the 2n-th column.

13. The array substrate according to claim 12, further comprising a first conductive layer located on a side of the active semiconductor layer away from the substrate, wherein the first conductive layer comprises the first driving reset control signal line, the first scan signal line, the second scan signal line, the first electrode of the capacitor, the light-emitting control signal line, the first light-emitting reset control signal line, and the second light-emitting reset control signal line sequentially arranged in the column direction, wherein the first scan signal line is used as the second driving reset control signal line, and the first electrode of the capacitor and the gate of the driving transistor are an integral structure.

14. The array substrate according to claim 13, wherein a part of the first driving reset control signal line, an orthographic projection of which on the substrate overlaps with an orthographic projection of the first part of the active semiconductor layer on the substrate, is the gate of the driving reset transistor in the sub-pixel in the (2n−1)-th column, parts of the first scan signal line, orthographic projections of which on the substrate overlap with orthographic projections of the first part, the second part, and the fourth part of the active semiconductor layer on the substrate, are respectively the gates of the compensation transistor and the data writing transistor in the sub-pixel in the (2n−1)-th column as well as the driving reset transistor in the sub-pixel in the 2n-th column, parts of the second scan signal line, orthographic projections of which on the substrate overlap with an orthographic projection of the fourth part of the active semiconductor layer on the substrate, are respectively the gates of the data writing transistor and the compensation transistor in the sub-pixel in the 2n-th columns, a part of the first electrode of the capacitor in the sub-pixel in the (2n−1)-th column, an orthographic projection of which on the substrate overlaps with an orthographic projection of the third part of the active semiconductor layer on the substrate, is the gate of the driving transistor in the sub-pixel in the (2n−1)-th column, a part of the first electrode of the capacitor in the sub-pixel in the 2n-th column, an orthographic projection of which on the substrate overlaps with an orthographic projection of the fourth part of the active semiconductor layer on the substrate, is the gate of the driving transistor in the sub-pixel in the 2n-th column, parts of the light-emitting control signal line, orthographic projections of which on the substrate overlap with orthographic projections of the third part and the fourth part of the active semiconductor layer on the substrate, are respectively the gates of the first light-emitting control transistor and the second light-emitting control transistor in the sub-pixel in the (2n−1)-th column, and the first light-emitting control transistor and the second light-emitting control transistor in the sub-pixel in the 2n-th column, a part of the first light-emitting reset control signal line, an orthographic projection of which on the substrate overlaps with an orthographic projection of the third part of the active semiconductor layer on the substrate, is the gate of the light-emitting reset transistor in the sub-pixel in the (2n−1)-th column, and a part of the second light-emitting reset control signal line, an orthographic projection of which on the substrate overlaps with an orthographic projection of the fifth part of the active semiconductor layer on the substrate, is the gate of the light-emitting reset transistor in the sub-pixel in the 2n-th column.

15. The array substrate according to claim 14, further comprising a second conductive layer located on a side of the first conductive layer away from the substrate, the second conductive layer comprising a second electrode of the capacitor and a first voltage source signal line as a first voltage source arranged in the column direction, wherein an orthographic projection of the second electrode of the capacitor on the substrate at least partially overlap with an orthographic projection of the first electrode of the capacitor on the substrate, and the first voltage source signal line extends in the row direction and is integrally formed with the second electrode of the capacitor.

16. The array substrate according to claim 15, further comprising a third conductive layer located on a side of the second conductive layer away from the substrate, wherein the third conductive layer comprises the data signal line, the reset voltage source signal line, a second voltage source signal line as the first voltage source, a third voltage source signal line as the first voltage source, a first connecting portion, a second connecting portion, a third connecting portion, a fourth connecting portion, a fifth connecting portion and a sixth connecting portion, wherein one end of the first connecting portion is coupled to the first electrode of the compensation transistor in the sub-pixel in the (2n−1)-th column, and the other end is coupled to the second electrode of the driving transistor in the sub-pixel in the (2n−1)-th column, wherein one end of the second connecting portion is coupled to the first electrode of the driving reset transistor in the sub-pixel in the (2n−1)-th column, and the other end is coupled to the gate of the driving transistor in the sub-pixel in the (2n−1)-th column, wherein one end of the third connecting portion is coupled to the second electrode of the data writing transistor in the sub-pixel in the (2n−1)-th column, and the other end is coupled to the first electrode of the driving transistor in the sub-pixel in the (2n−1)-th column, wherein the fourth connecting portion is coupled to the second electrode of the second light-emitting control transistor in the sub-pixel in the (2n−1)-th column, wherein one end of the fifth connecting portion is coupled to the first electrode of the driving reset transistor in the sub-pixel in the 2n-th column, and the other end is coupled to the gate of the driving transistor in the sub-pixel in the 2n-th column, wherein one end of the sixth connecting portion is coupled to the second electrode of the second light-emitting control transistor in the sub-pixel in the 2n-th column, and the other end is coupled to the first electrode of the light-emitting reset transistor in the sub-pixel in the 2n-th column, wherein the data signal line is coupled to the first electrode of the data writing transistor in the sub-pixel in the (2n−1)-th column and the first electrode of the data writing transistor in the sub-pixel in the 2n-th column, wherein the reset voltage source signal line is coupled to the second electrode of the driving reset transistor and the second electrode of the light-emitting reset transistor in the sub-pixel in the 2n-th column, and is coupled to the second electrode of the driving reset transistor and the second electrode of the light-emitting reset transistor in the sub-pixel in the (2n+1)-th column, wherein the second voltage source signal line extends in the column direction and is located in the sub-pixel in the (2n−1)-th column, and is coupled to the second electrode of the capacitor and the first electrode of the first light-emitting control transistor in the sub-pixel in the (2n−1)-th column, and wherein the third voltage source signal line extends in the column direction and is located in the sub-pixel in the 2n-th column, and is coupled to the second electrode of the capacitor and the first electrode of the first light-emitting control transistor in the sub-pixel in the 2n-th column.

17. The array substrate according to claim 15, wherein the second conductive layer further comprises a first additional reset voltage source signal line and a second additional reset voltage source signal line extending in the row direction, wherein the second electrode of the capacitor and the first voltage source signal line are located between the first additional reset voltage source signal line and the second additional reset voltage source signal line in the column direction.

18. The array substrate according to claim 17, further comprising a third conductive layer located on a side of the second conductive layer away from the substrate, wherein the third conductive layer comprises the data signal line, the reset voltage source signal line, a second voltage source signal line as the first voltage source, a third voltage source signal line as the first voltage source, a first connecting portion, a second connecting portion, a third connecting portion, a fourth connecting portion, a fifth connecting portion, a sixth connecting portion, a seventh connecting portion, an eighth connecting portion, a ninth connecting portion and a tenth connecting portion, wherein one end of the first connecting portion is coupled to the first electrode of the compensation transistor in the sub-pixel in the (2n−1)-th column, and the other end is coupled to the second electrode of the driving transistor in the sub-pixel in the (2n−1)-th column, wherein one end of the second connecting portion is coupled to the first electrode of the driving reset transistor in the sub-pixel in the (2n−1)-th column, and the other end is coupled to the gate of the driving transistor in the sub-pixel in the (2n−1)-th column, wherein one end of the third connecting portion is coupled to the second electrode of the data writing transistor in the sub-pixel in the (2n−1)-th column, and the other end is coupled to the first electrode of the driving transistor in the sub-pixel in the (2n−1)-th column, wherein the fourth connecting portion is coupled to the second electrode of the second light-emitting control transistor in the sub-pixel in the (2n−1)-th column, wherein one end of the fifth connecting portion is coupled to the first electrode of the driving reset transistor in the sub-pixel in the 2n-th column, and the other end is coupled to the gate of the driving transistor in the sub-pixel in the 2n-th column, wherein one end of the sixth connecting portion is coupled to the second electrode of the second light-emitting control transistor in the sub-pixel in the 2n-th column, and the other end is coupled to the first electrode of the light-emitting reset transistor in the sub-pixel in the 2n-th column, wherein one end of the seventh connecting portion is coupled to the first additional reset voltage source signal line, and the other end is coupled to the second electrode of the driving reset transistor in the sub-pixel in the (2n−1)-th column, wherein one end of the eighth connecting portion is coupled to the second additional reset voltage source signal line, and the other end is coupled to the second electrode of the light-emitting reset transistor in the sub-pixel in the (2n−1)-th column, wherein one end of the ninth connecting portion is coupled to the first additional reset voltage source signal line, and the other end is coupled to the second electrode of the driving reset transistor in the sub-pixel in the 2n-th column, wherein one end of the tenth connecting portion is coupled to the second additional reset voltage source signal line, and the other end is coupled to the second electrode of the light-emitting reset transistor in the sub-pixel in the 2n-th column, wherein the data signal line is coupled to the first electrode of the data writing transistor in the sub-pixel in the (2n−1)-th column and the first electrode of the data writing transistor in the sub-pixel in the 2n-th column, wherein the reset voltage source signal line is coupled to the first additional reset voltage source signal line and the second additional reset voltage source signal line, wherein the second voltage source signal line extends in the column direction and is located in the sub-pixel in the (2n−1)-th column, and is coupled to the second electrode of the capacitor and the first electrode of the first light-emitting control transistor in the sub-pixel in the (2n−1)-th column, and wherein the third voltage source signal line extends in the column direction and is located in the sub-pixel in the 2n-th column, and is coupled to the second electrode of the capacitor and the first electrode of the first light-emitting control transistor in the sub-pixel in the 2n-th column.

19. A display panel, comprising the array substrate according to claim 1.

20. A display device, comprising the display panel according to claim 19.

* * * * *